US012556871B2

(12) United States Patent
Zhou et al.

(10) Patent No.: US 12,556,871 B2
(45) Date of Patent: Feb. 17, 2026

(54) BONE CONDUCTION SOUND TRANSMISSION DEVICES

(71) Applicant: SHENZHEN SHOKZ CO., LTD., Guangdong (CN)

(72) Inventors: Wenbing Zhou, Shenzhen (CN); Yongshuai Yuan, Shenzhen (CN); Wenjun Deng, Shenzhen (CN)

(73) Assignee: SHENZHEN SHOKZ CO., LTD., Shenzhen (CN)

(*) Notice: Subject to any disclaimer, the term of this patent is extended or adjusted under 35 U.S.C. 154(b) by 212 days.

(21) Appl. No.: 18/185,351

(22) Filed: Mar. 16, 2023

(65) Prior Publication Data

US 2023/0217163 A1 Jul. 6, 2023

Related U.S. Application Data

(63) Continuation of application No. PCT/CN2021/082492, filed on Mar. 23, 2021.

(30) Foreign Application Priority Data

Dec. 31, 2020 (WO) ................ PCT/CN2020/142533

(51) Int. Cl.
*H04R 1/46* (2006.01)
*H04R 17/02* (2006.01)
(Continued)

(52) U.S. Cl.
CPC ............ *H04R 25/606* (2013.01); *H04R 1/46* (2013.01); *H04R 17/025* (2013.01); *H04R 17/10* (2013.01);
(Continued)

(58) Field of Classification Search
CPC .... H04R 2460/13; H04R 25/606; H04R 1/46; H04R 17/02; H04R 17/025; H04R 17/10
(Continued)

(56) References Cited

U.S. PATENT DOCUMENTS 4,150,262 A 4/1979 Ono
6,378,369 B1 4/2002 Takata et al.
(Continued)

FOREIGN PATENT DOCUMENTS

CN 103024647 A 4/2013
CN 103096225 A 5/2013
(Continued)

OTHER PUBLICATIONS

Translation of Sun et al. International Publication No. 2021036653, Mar. 4, 2021 (Year: 2021).*
(Continued)

*Primary Examiner* — Katherine A Faley
(74) *Attorney, Agent, or Firm* — METIS IP LLC

(57) ABSTRACT

The present disclosure is of a bone conduction sound transmission device. The bone conduction sound transmission device includes of a laminated structure and a base structure. The laminated structure is formed by a vibration unit and an acoustic transducer unit. The base structure is configured to load the laminated structure. At least one side of the laminated structure is physically connected to the base structure. The base structure vibrates based on an external vibration signal, and the vibration unit deforms in response to the vibration of the base structure; and the acoustic transducer unit generates an electrical signal based on the deformation of the vibration unit.

16 Claims, 24 Drawing Sheets

(51) Int. Cl.

| | |
|---|---|
| ***H04R 17/10*** | (2006.01) |
| ***H04R 25/00*** | (2006.01) |
| ***H10N 30/30*** | (2023.01) |
| ***H10N 30/50*** | (2023.01) |

(52) U.S. Cl.
CPC ........... *H10N 30/308* (2023.02); *H10N 30/50* (2023.02); *H10N 30/501* (2023.02); *H04R 2460/13* (2013.01)

(58) Field of Classification Search
USPC .......................................................... 381/151
See application file for complete search history.

(56) References Cited

U.S. PATENT DOCUMENTS

| | | | | |
|---|---|---|---|---|
| 10,078,097 | B2 | 9/2018 | Dubbeldeman et al. | |
| 10,999,684 | B1 * | 5/2021 | Wan | H04R 17/02 |
| 12,114,129 | B2 * | 10/2024 | Zhou | H04R 7/10 |
| 2007/0041595 | A1 | 2/2007 | Carazo et al. | |
| 2008/0122320 | A1 * | 5/2008 | Fazzio | G01H 11/08 310/366 |
| 2008/0173092 | A1 * | 7/2008 | Hattori | G01P 15/0922 73/514.34 |
| 2012/0266686 | A1 | 10/2012 | Huffman | |
| 2016/0088400 | A1 * | 3/2016 | Yoo | H04R 31/00 216/13 |
| 2016/0211439 | A1 | 7/2016 | Najafi et al. | |
| 2017/0118563 | A1 | 4/2017 | Maas | |
| 2018/0234779 | A1 | 8/2018 | Hsieh et al. | |
| 2018/0279061 | A1 | 9/2018 | Walravens et al. | |
| 2019/0335271 | A1 | 10/2019 | Post et al. | |
| 2020/0196065 | A1 | 6/2020 | Pedersen et al. | |
| 2021/0127184 | A1 * | 4/2021 | Fukuda | H04R 9/043 |

FOREIGN PATENT DOCUMENTS

| | | | | |
|---|---|---|---|---|
| CN | 203181217 U | 9/2013 | | |
| CN | 206402446 U | 8/2017 | | |
| CN | 107808926 A | 3/2018 | | |
| CN | 110602616 A | 12/2019 | | |
| CN | 111050256 A | 4/2020 | | |
| CN | 210958707 U | 7/2020 | | |
| CN | 210958796 U | 7/2020 | | |
| CN | 111556419 A | 8/2020 | | |
| CN | 211378247 U | 8/2020 | | |
| EP | 4050910 A1 | 8/2022 | | |
| JP | H08195995 A | 7/1996 | | |
| JP | 2006100954 A | 4/2006 | | |
| KR | 20060037158 A | 5/2006 | | |
| WO | 9407342 A1 | 3/1994 | | |
| WO | WO-2021036653 A1 * | 3/2021 | | H04R 1/2892 |

OTHER PUBLICATIONS

Translation of Ushio et al. Japanese Publication No. 2006100954, Apr. 13, 2006 (Year: 2006).*
First Examination Report in Indian Application No. 202317020284 mailed on Oct. 29, 2024, 6 pages.
International Search Report in PCT/CN2021/082492 mailed on Sep. 3, 2021, 6 pages.
International Search Report in PCT/CN2020/142533 mailed on Sep. 6, 2021, 6 pages.
The Extended European Search Report in European Application No. 21912597.8 mailed on Mar. 12, 2024, 11 pages.
The Notice of Reasons for Refusal in Japanese Application No. 2023-530705 mailed on May 27, 2024, 11 pages.
The Second Office Action in Chinese Application No. 202110309635.X mailed on May 28, 2025, 24 pages.
Decision to Grant a Patent in Japanese Application No. 2023-530705 mailed on Jul. 1, 2025, 6 pages.

* cited by examiner

BONE CONDUCTION SOUND TRANSMISSION DEVICES

CROSS-REFERENCE TO RELATED APPLICATION

This application is a continuation of International Application PCT/CN2021/082492, filed on Mar. 23, 2021, which claims priority of International Application PCT/CN2020/142533, filed on Dec. 31, 2020, the contents of which are entirely incorporated herein by reference.

TECHNICAL FIELD

The present disclosure relates to the technical field of a sound transmission device, and in particular, to a bone conduction sound transmission device.

BACKGROUND

A microphone receives an external vibration signal, uses an acoustic transducer unit to convert the vibration signal into an electrical signal, and outputs the electrical signal after the electrical signal is processed by a back-end circuit. An air conduction microphone receives an air conduction acoustic signal, and the acoustic signal is transmitted through the air, i.e., the air conduction microphone receives an air vibration signal. A bone conduction sound transmission device receives a bone conduction acoustic signal and the acoustic signal is transmitted through a human bone, i.e., the bone conduction sound transmission device receives a bone vibration signal. Compared with the air conduction microphone, the bone conduction sound transmission device has an advantage in a noise immunity. In a noisy environment, bone conduction sound transmission devices are less disturbed by environmental noises and may capture human voices well.

Existing bone conduction sound transmission devices are too complex and normally require a high-level manufacturing process. An insufficient connection strength among some of their components may create an insufficient level of reliability, which affects output signal. Therefore, it is necessary to provide a bone conduction sound transmission device with a simple structure and greater stability.

SUMMARY

One aspect of the present disclosure provides a bone conduction sound transmission device. The bone conduction sound transmission device may comprise of a laminated structure and a base structure. The laminated structure may be formed by a vibration unit and an acoustic transducer unit. The base structure may be configured to load the laminated structure. At least one side of the laminated structure may be physically connected to the base structure. The base structure may vibrate based on an external vibration signal, and the vibration unit may deform in response to the vibration of the base structure; and the acoustic transducer unit may generate an electrical signal based on the deformation of the vibration unit.

In some embodiments, the base structure may include a hollow frame structure, one end of the laminated structure may be connected to the base structure, and other end of the laminated structure may be suspended in a hollow part of the hollow frame structure.

In some embodiments, the vibration unit may include at least one elastic layer, and the acoustic transducer unit may include at least a first electrode layer, a piezoelectric layer, and a second electrode layer arranged in sequence from top to bottom. The at least one elastic layer may be located on an upper surface of the first electrode layer or a lower surface of the second electrode layer.

In some embodiments, the acoustic transducer unit may further include a seed layer located on the lower surface of the second electrode layer.

In some embodiments, a cover area of the first electrode layer, the piezoelectric layer, or the second electrode layer may be less than or equal to than an area of the laminated structure. The first electrode layer, the piezoelectric layer, or the second electrode layer may be close to a connection of the laminated structure and the base structure.

In some embodiments, the vibration unit may include at least one elastic layer, the acoustic transducer unit may include at least the electrode layer and the piezoelectric layer; and the at least one elastic layer may be located on the surface of the electrode layer.

In some embodiments, the electrode layer may include a first electrode and a second electrode. The first electrode may be bent into a first comb-shaped structure and the second electrode may be bent into a second comb-shaped structure. The first comb-shaped structure may be matched with the second comb-shaped structure to form the electrode layer, and the electrode layer may be located on an upper surface or a lower surface of the piezoelectric layer.

In some embodiments, the first comb-shaped structure and the second comb-shaped structure may extend along a length direction of the laminated structure.

In some embodiments, the vibration unit may include a suspension membrane structure, and the acoustic transducer unit may include the first electrode layer, the piezoelectric layer, and the second electrode layer arranged in sequence from top to bottom. The suspension membrane structure may be connected to the base structure through a peripheral side of the suspension membrane structure, and the acoustic transducer unit may be located on an upper surface or a lower surface of the suspension membrane structure.

In some embodiments, the suspension membrane structure may include a plurality of holes, and the plurality of holes may be distributed along a circumference of the acoustic transducer unit.

In some embodiments, radial distances from an edge of the acoustic transducer unit to centers of the plurality of holes may be within a range of 100 μm-400 μm.

In some embodiments, the acoustic transducer unit may be an annular structure, and a thickness of the suspension membrane structure located in an inner region of the annular structure may be greater than a thickness of the suspension membrane structure located in an outer region of the annular structure.

In some embodiments, the acoustic transducer unit may be an annular structure, and a density of the suspension membrane structure located in the inner region of the annular structure may be greater than the density of the suspension membrane structure located in the outer region of the annular structure.

In some embodiments, the vibration unit may further include a mass element located on the upper surface or the lower surface of the suspension membrane structure.

In some embodiments, the acoustic transducer unit and the mass element may be respectively located on different sides of the suspension membrane structure.

In some embodiments, the acoustic transducer unit and the mass element may be located on the same side of the suspension membrane structure. The acoustic transducer unit may be an annular structure, and the annular structure may be distributed along the circumference of the mass element.

In some embodiments, the vibration unit may include at least one support arm and the mass element, and the mass element may be connected to the base structure through the at least one support arm.

In some embodiments, the at least one support arm may include at least one elastic layer, and the acoustic transducer unit may be located on an upper surface, a lower surface, or inside of the at least one support arm.

In some embodiments, acoustic transducer unit may include the first electrode layer, the piezoelectric layer, and the second electrode layer arranged in sequence from top to bottom. The first electrode layer or the second electrode layer may be connected to the upper surface or the lower surface of the at least one support arm.

In some embodiments, the mass element may be located on an upper surface or a lower surface of the first electrode layer or an upper surface or a lower surface of the second electrode layer.

In some embodiments, an area of the first electrode layer, the first piezoelectric layer, or the second electrode layer may be less than or equal to an area of the support arm, and a part or all of the first electrode layer, the first piezoelectric layer, or the second electrode layer may cover the upper surface or the lower surface of the at least one support arm.

In some embodiments, the area of the first electrode layer may be lea than or equal to the area of the piezoelectric layer, and an entire area of the first electrode layer may be located on the surface of the piezoelectric layer.

In some embodiments, the first electrode layer, the piezoelectric layer, and the second electrode layer of the acoustic transducer unit may be close to the mass element or a connection between the support arm and the base structure.

In some embodiments, the at least one support arm may include at least one elastic layer, and the at least one elastic layer may be located on the upper surface or the lower surface of the first electrode layer or the second electrode layer.

In some embodiments, it also includes a limiting structure, the limiting structure may be located in the hollow part of the base structure. The limiting structure may be connected to the base structure, and the limiting structure may be located above or below the mass element.

In some embodiments, the above bone conduction sound transmission device may further include at least one damping layer, and the at least one damping layer may cover the upper surface, the lower surface, or the inside of the laminated structure.

In some embodiments, a resonant frequency of the bone conduction sound transmission device may be within a range of 1 kHz-5 kHz.

In some embodiments, the resonant frequency of the bone conduction sound transmission device may be within a range of 2.5 kHz-4.5 kHz.

In some embodiments, the resonant frequency of the bone conduction sound transmission device may be within a range of 2.5 kHz-3.5 kHz.

In some embodiments, the resonant frequency of the bone conduction sound transmission device may be positively correlated with a stiffness of the vibration unit.

In some embodiments, the resonant frequency of the bone conduction sound transmission device may be negatively correlated with a mass of the laminated structure.

In some embodiments, the vibration unit may include at least one support arm and a mass element, and the mass element may be connected to the base structure through the at least one support arm.

In some embodiments, the acoustic transducer unit may be located on an upper surface, a lower surface, or an inside of the at least one support arm.

In some embodiments, the acoustic transducer unit may include a first electrode layer, a first piezoelectric layer, and a second electrode layer arranged in sequence from top to bottom, and the first electrode layer or the second electrode layer may be connected to the upper surface or the lower surface of the at least one support arm.

In some embodiments, the mass element may be located on an upper surface or a lower surface of the first electrode layer or an upper surface or a lower surface of the second electrode layer.

In some embodiments, an area of the first electrode layer, the first piezoelectric layer, or the second electrode layer may be less than or equal to an area of the support arm, and a part or all of the first electrode layer, the first piezoelectric layer, or the second electrode layer may cover the upper surface or the lower surface of the at least one support arm.

In some embodiments, the area of the first electrode layer may be less than or equal to the area of the first piezoelectric layer, and an entire region of the first electrode layer may be located on a surface of the first piezoelectric layer.

In some embodiments, the first electrode layer, the first piezoelectric layer, and the second electrode layer of the acoustic transducer unit may be located at one end of a connection between the support arm and the mass element or one end of a connection between the support arm and the base structure.

In some embodiments, the acoustic transducer unit may include at least one elastic layer, and the at least one elastic layer may be located on the upper surface or lower surface of the first electrode layer or the upper surface or lower surface of the second electrode layer.

In some embodiments, the acoustic transducer unit may further include a first seed layer arranged between the elastic layer and the first electrode layer or between the elastic layer and the second electrode layer.

In some embodiments, the acoustic transducer unit may further include at least one wire bound electrode layer, the wire bound electrode layer may be arranged on the base structure and used to introduce an electrical signal from the base structure.

In some embodiments, the elastic layer may be arranged between the support arm and the first electrode layer, and the first seed layer may be arranged between the elastic layer and the first electrode layer; or the elastic layer may be arranged between the support arm and the second electrode layer, and the first seed layer may be arranged between the elastic layer and the second electrode layer.

In some embodiments, a neutral layer may be formed on the bone conduction sound transmission device, and a deformation stress of the neutral layer may be zero when the support arm is deformed, and the neutral layer does not overlap with the first piezoelectric layer in a thickness direction.

In some embodiments, a thickness of the first electrode layer may be within a range of 80 nm-250 nm, or a thickness of the second electrode layer may be within a range of 80 nm-250 nm.

In some embodiments, a thickness of the first piezoelectric layer may be within a range of 0.8 μm-2 μm.

In some embodiments, a thickness of the elastic layer may be within a range of 0.5 μm-10 μm.

In some embodiments, a thickness of the first seed layer may be within a range of 10 nm-120 nm.

In some embodiments, the thickness of the elastic layer may be 1 time-6 times of the thickness of the first piezoelectric layer.

In some embodiments, a thickness of the mass element may be within a range of 1 μm-400 μm.

In some embodiments, the mass element may include a base layer, a third electrode layer, a second piezoelectric layer, and a fourth electrode layer arranged in sequence from bottom to top.

In some embodiments, the mass element may further include a second seed layer arranged between the base layer and the third electrode layer.

In some embodiments, a thickness of the base layer may be within a range of 20 μm-400 μm.

In some embodiments, a ratio of an electrical signal intensity to a noise intensity of the bone conduction sound transmission device may be 50%-100% of a maximum ratio of the electrical signal intensity to the noise intensity.

In some embodiments, the acoustic transducer unit may include the first electrode layer, the first piezoelectric layer, and the second electrode layer, and the ratio of the electrical signal intensity to the noise intensity of the bone conduction sound transmission device may be negatively correlated with the thickness of the first piezoelectric layer.

In some embodiments, the acoustic transducer unit may include the first electrode layer, the first piezoelectric layer, and the second electrode layer, and the ratio of the electrical signal intensity to the noise intensity of the bone conduction sound transmission device may be negatively correlated with an area of an overlapping region of the first electrode layer, the first piezoelectric layer, and the second electrode layer.

In some embodiments, the acoustic transducer unit may include the first electrode layer, the first piezoelectric layer, and the second electrode layer, a ratio of an area of an overlapping region of the first electrode layer, the first piezoelectric layer, and the second electrode layer to an area of a cross section of the support arm perpendicular to the thickness direction may be within a range of 5%-40%.

In some embodiments, an electrode insulation trench may be arranged on the first electrode layer or the second electrode layer, and the electrode insulation trench may be used to divide the first electrode layer or the second electrode layer into two or more electrode regions.

In some embodiments, a width of the electrode insulation trench may be less than or equal to 20 μm.

In some embodiments, an electrode lead may be arranged on the first electrode layer or the second electrode layer, and the electrode lead may be used to connect the electrode region with the base.

In some embodiments, a width of the electrode lead may be less than or equal to 20 μm.

In some embodiments, the overlapping region of the first electrode layer, the first piezoelectric layer and the second electrode layer may extend toward the mass element to form an extension region, and the extension region may be located on an upper surface or a lower surface of the mass element.

In some embodiments, a width of the extension region on the plane perpendicular to a thickness direction may be 1.2 times-2 times of the width of a connection part of the support arm and the mass element on a plane perpendicular to the thickness direction.

In some embodiments, a number of the support arms is two or more, and the two or more support arms may be arranged around the mass element.

In some embodiments, a shape of a cross section of the at least one support arm perpendicular to the thickness direction may be a polygon.

In some embodiments, an edge length of the polygon may be within a range of 100 μm-600 μm.

In some embodiments, the shape of the cross section of the at least one support arm perpendicular to the thickness direction may be a rectangle or a trapezoid.

In some embodiments, a shape of the cross section of the mass element perpendicular to the thickness direction may be polygon, and a number of the support arms corresponds to the number of edges of the polygon.

In some embodiments, when the shape of the cross section of the support arm perpendicular to the thickness direction is a rectangle, a length of the support arm may be within a range of 100 μm-500 μm, and a width of the support arm may be within a range of 150 μm-400 μm.

In some embodiments, when the shape of the cross section of the support arm perpendicular to the thickness direction is a trapezoid, a height of the trapezoid may be within a range of 150 μm-600 μm, a length of a long edge of the trapezoid may be within a range of 300 μm-600 μm, and a length of a short edge of the trapezoid may be within a range of 100 μm-400 μm.

In some embodiments, the support arm may include a first bar-shaped part and a second bar-shaped part. One end of the first bar-shaped part may be connected to the mass element, and the other end of the first bar-shaped part may be connected to one end of the second bar-shaped part. The other end of the second bar-shaped part may be connected to the base.

In some embodiments, a length of the first bar-shaped part may be within a range of 20 μm-200 μm, and a width of the first bar-shaped part may be within a range of 50 μm-400 μm.

In some embodiments, a length of the second bar-shaped part may be within a range of 500 μm-1300 μm, and a width of the second bar-shaped part may be within a range of 50 μm-400 μm.

In some embodiments, when a connection between the first bar-shaped part and the mass element is located at an end of the side of the mass element, the width of the first bar-shaped part may be within a range of 50 μm-300 μm, and the length of the first bar-shaped part may be within a range of 20 μm-200 μm.

In some embodiments, when the connection between the first bar-shaped part and the mass element is located at the end of the side of the mass element, the width of the second bar-shaped part may be within a range of 50 μm-300 μm, and the length of the second bar-shaped part may be within a range of 800 μm-1300 μm.

In some embodiments, when the connection between the first bar-shaped part and the mass element is located at a midpoint of the side of the mass element, the width of the first bar-shaped part may be within a range of 100 μm-400 μm, and the length of the first bar-shaped part may be within a range of 20 μm-200 μm.

In some embodiments, when the connection between the first bar-shaped part and the mass element is located at the midpoint of the side of the mass element, the width of the second bar-shaped part may be within a range of 100 μm-400 μm, and the length of the second bar-shaped part may be within a range of 500 μm-1000 μm.

In some embodiments, the cross section of the mass element perpendicular to the thickness direction may be a rectangle, and the first bar-shaped part may be perpendicular to the second bar-shaped part.

In some embodiments, the support arm may include the first bar-shaped part, the second bar-shaped part, and a third bar-shaped part. One end of the first bar-shaped part may be connected to the mass element, and the other end of the first bar-shaped part may be connected to one end of the second bar. The other end of the second bar-shaped part may be connected to one end of the third bar-shaped part. The other end of the third bar-shaped part may be connected to the base.

In some embodiments, the length of the first bar-shaped part may be within a range of 20 μm to 200 μm, and the width of the first bar-shaped part may be within a range of 50 μm-300 μm.

In some embodiments, the length of the second bar-shaped part may be within a range of 500 μm-1200 μm, and the width of the second bar-shaped part may be within a range of 50 μm-300 μm.

In some embodiments, a length of the third bar-shaped part may be within a range of 800 μm-1300 μm, and a width of the third bar-shaped part may be within a range of 50 μm-300 μm.

In some embodiments, the base structure may include a frame structure with a hollow inner cavity, and both the support arm and the mass element may be arranged in the hollow inner cavity of the frame structure.

In some embodiments, the shape of the mass element corresponds to a shape of the hollow inner cavity.

In some embodiments, a sum of the thicknesses of the support arm and the acoustic transducer unit may be less than the thickness of the mass element.

In some embodiments, the sum of the thicknesses of the support arm and the acoustic transducer unit may be greater than or equal to the thickness of the mass element.

In some embodiments, the bone conduction sound transmission device may further include a limiting structure, and the limiting structure may be located in the inner cavity of the base structure. The limiting structure may be connected to the base structure, and the limiting structure may be located above or below the mass element.

BRIEF DESCRIPTION OF THE DRAWINGS

The present disclosure is further illustrated in terms of exemplary embodiments. These exemplary embodiments are described in detail with reference to the drawings. These embodiments are not restrictive, in which the same numbering indicates the same structure, wherein.

DETAILED DESCRIPTION

Figure 1:
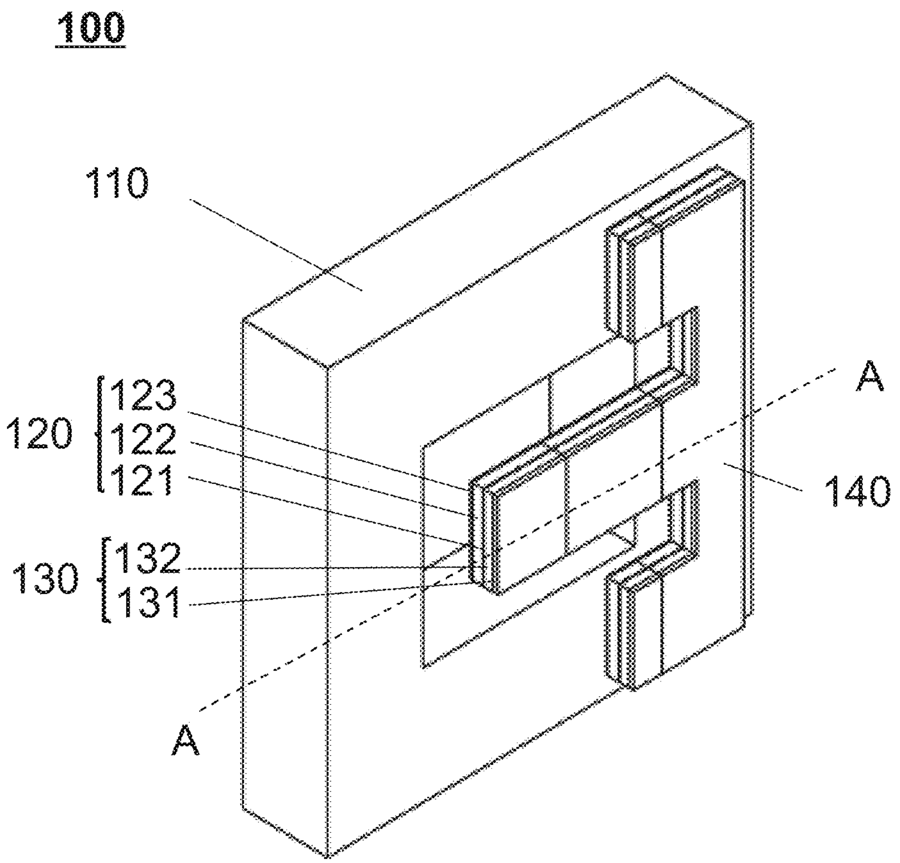
FIG. 1 is a schematic structural diagram illustrating a bone conduction sound transmission device according to some embodiments of the present disclosure.

To illustrate the technical solutions of the embodiments of the present disclosure more clearly, the following briefly introduces the accompanying drawings that are used in the description of the embodiments. Obviously, drawings described below are only some examples or embodiments of the present disclosure. Those having ordinary skills in the art, without further creative efforts, may apply the present disclosure to other similar scenarios according to these drawings. Unless obviously obtained from the context or the context illustrates otherwise, the same numeral in the drawings refers to the same structure or operation. It should be understood that the drawings are for purposes of illustration and description only, and are not intended to limit the scope of the disclosure. It should be understood that the drawings are not drawn to scale.

It should be understood that, for the convenience of describing the present disclosure, the terms "center", "upper surface", "lower surface", "upper", "lower", "top", "bottom", "inner", "outer", "axial", "radial", "peripheral", "external" and other indicative positional relationships are based on the positional relationship according to the drawings, and do not indicate that the devices, assemblies or units must have a specific positional relationship, which should not be regarded as a limitation of the present disclosure.

It will be understood that the term "system," "engine," "unit," "module," and/or "block" used herein are one way to distinguish different assemblies, elements, parts, sections, or assembly of different levels. However, these words may be replaced by other expressions if other words can achieve the same purpose.

As used in the disclosure and the appended claims, the singular forms "a," "an," and "the" include plural unless the content clearly dictates otherwise. It will be further understood that the terms "comprise," "comprises," and/or "comprising," "include," "includes," and/or "including," when used in the present disclosure, specify the presence of stated operations and elements, but do not preclude the presence or addition of one or more other operations and elements thereof.

The present disclosure uses flowcharts to illustrate the operations performed by the system according to the embodiments of the disclosure. It should be understood that the preceding or following operations are not necessarily performed in the exact order. Instead, various operations may be processed in reverse order or simultaneously. At the same time, other operations may be added to these procedures, or a certain operation or operations may be removed from these processes.

The bone conduction sound transmission device provided by some embodiments of the present disclosure may include a base structure and a laminated structure. In some embodiments, the base structure may be a regular or irregular three-dimensional (3D) structure with a hollow part inside the base structure, for example, the base structure may be a hollow frame structure, including but not limited to regular shapes such as a rectangular frame, a circular frame, and a regular polygonal frame, as well as any irregular shape. The laminated structure may be located in the hollow part of the base structure or at least partially suspended above the hollow part of the base structure. In some embodiments, at least a part of the laminated structure may be physically connected to the base structure. The "connection" here may be understood as after the laminated structure and the base structure are respectively prepared, the laminated structure and the base structure may be fixedly connected by means of welding, riveting, clamping, bolting, etc., or the laminated structure may be deposited on the base structure through a physical deposition (e.g., a physical vapor deposition) or a chemical deposition (e.g., a chemical vapor deposition) during the preparation process. In some embodiments, at least part of the laminated structure may be fixed to an upper or a lower surface of the base structure, and at least part of the laminated structure may further be fixed to a side wall of the base structure. For example, the laminated structure may be a cantilever beam, which may be a plate-shaped structure, one end of the cantilever beam may be connected to the upper surface, the lower surface of the base structure, or the side wall where the hollow part in the base structure is located, and the other end of the cantilever beam may not be connected to or contacted with the base structure, so that the other end of the cantilever beam may be suspended in the hollow part of the base structure. For another example, the laminated structure may include a diaphragm layer (also referred to as a suspension membrane structure). The suspension membrane structure may be fixedly connected to the base structure, and the laminated structure may be arranged on an upper surface or a lower surface of the suspension membrane structure. For another example, the laminated structure may include a mass element and one or more support arms, the mass element may be fixedly connected to the base structure through the one or more support arms, one end of the support arm may be connected to the base structure, and the other end of the support arm may be connected to the mass element, so that the mass element and a part of the support arm may be suspended in the hollow part of the base structure. It should be understood that the "located in the hollow part of the base structure" or the "suspended in the hollow part of the base structure" mentioned in this disclosure may mean "suspended inside, below or above the hollow part of the base structure". In some embodiments, the laminated structure may include a vibration unit and an acoustic transducer unit. Specifically, the base structure vibrates based on an external vibration signal, and the vibration unit deforms in response to the vibration of the base structure. The acoustic transducer unit generates an electrical signal based on the deformation of the vibration unit. It should be understood that the description of the vibration unit and the acoustic transducer unit here is only for the purpose of conveniently introducing a working principle of the laminated structure, and does not limit an actual composition and structure of the laminated structure. In fact, the vibration unit may not be necessary, and its function may be completely implemented by the acoustic transducer unit. For example, after certain changes are made to the structure of the acoustic transducer unit, the acoustic transducer unit may directly respond to the vibration of the base structure to generate the electrical signal.

The vibration unit refers to a part of the laminated structure that is prone to deformation under an action of an external force or an inertial force. The vibration unit may be configured to transmit the deformation caused by the external force or the inertial force to the acoustic transducer unit. In some embodiments, the vibration unit and the acoustic transducer unit may overlap to form the laminated structure. The acoustic transducer unit may be located on an upper or a lower layer of the vibration unit. For example, when the laminated structure is a cantilever beam structure, the vibration unit may include at least one elastic layer, and the acoustic transducer unit may include a first electrode layer, a piezoelectric layer, and a second electrode layer arranged in sequence from top to bottom. The elastic layer may be located on the surface of the first electrode layer or the second electrode layer. The elastic layer may be deformed during the vibration process. The piezoelectric layer may generate the electrical signal based on the deformation of the elastic layer, and the first electrode layer and the second electrode layer may collect the electrical signal. For another example, the vibration unit may also be a suspension membrane structure. By changing a density of a specific region of the suspension membrane structure, punching a hole in the suspension membrane structure, or setting a counterweight (also referred to as a mass element) on the suspension membrane structure, etc., the suspension membrane structure close to the acoustic transducer unit may be more likely to deform under an action of an external force, thereby driving the acoustic transducer unit to generate the electrical signal. For another example, the vibration unit may include the at least one support arm and the mass element, the mass element may be suspended in the hollow part of the base structure through the support arm. When the base structure vibrates, the support arm and the mass element of the vibration unit may move relative to the base structure, and the deformation of the support arm may act on the acoustic transducer unit to generate the electrical signal.

The acoustic transducer unit refers to a part in the laminated structure that converts the deformation of the vibration unit into an electrical signal. In some embodiments, the acoustic transducer unit may include at least two electrode layers (e.g., a first electrode layer and a second electrode layer) and a piezoelectric layer. The piezoelectric layer may be located between the first electrode layer and the second electrode layer. The piezoelectric layer refers to a structure that generates a voltage on two ends of the piezoelectric layer when an external force is applied. In some embodiments, the piezoelectric layer may be a piezoelectric polymer film obtained by a semiconductor deposition process (e.g., a magnetron sputtering, a metal organic chemical vapor deposition (MOCVD)). In an embodiment of the present disclosure, the piezoelectric layer may generate a voltage under the deformation stress of the vibration unit, and the first electrode layer and the second electrode layer may collect the voltage (electrical signal). In some embodiments of the present disclosure, a material of the piezoelectric layer may include a piezoelectric film material. The piezoelectric film material may be a film material (e.g., aluminum nitride (AlN) film material, a lead zirconate titanate (PZT) film material) made through the deposition process (e.g., a magnetron sputtering deposition process, a chemical vapor deposition process, etc.). In some embodiments, the material of the piezoelectric layer may include a piezoelectric crystal material and a piezoelectric ceramic material. The piezoelectric crystal refers to a piezoelectric monocrystal. In some embodiments, the piezoelectric crystal materials may include a crystal, a sphalerite, a boracite, a tourmaline, a zincite, a GaAs, a barium titanate, and its derivative structure crystals, $KH_2PO_4$, $NaKC_4H_4O_6 \cdot 4H_2O$ (Rochelle salt), etc., or any combination thereof. The piezoelectric ceramic material may refer to a piezoelectric polycrystal formed by a random collection of fine grains obtained by solid-phase reaction and a sintering of different material powders. In some embodiments, the piezoelectric ceramic material may include a barium titanate (BT), a lead zirconate titanate (PZT), a lead barium lithium niobate (PBLN), a modified lead titanate, an aluminum nitride (AlN), an oxide Zinc (ZnO), or any combination thereof. In some embodiments, the piezoelectric layer material may also be a piezoelectric polymer material, such as a polyvinylidene fluoride (PVDF).

In some embodiments, the base structure and the laminated structure may be located in a housing of the bone conduction sound transmission device, and the base structure may be fixedly connected to an inner wall of the housing, and the laminated structure is held by the base structure. When the housing of the bone conduction sound transmission device is vibrated under an external force (e.g., the vibration of a face when a human body speaks drives the housing to vibrate), the vibration of the housing drives the vibration of the base structure. Further, when the vibration unit is deformed, the piezoelectric layer of the acoustic transducer unit may be subjected to a deformation stress of the vibration unit to generate a potential difference (a voltage). At least two electrode layers (e.g., the first electrode layer and the second electrode layer) respectively located on the upper surface and the lower surface of the piezoelectric layer in the acoustic transducer unit may collect the potential difference to convert the external vibration signal into an electrical signal. For illustrative purposes only, the bone conduction sound transmission device described in the embodiments of the present disclosure may be applied to an earphone (e.g., a bone conduction earphone or an air conduction earphone), glasses, a virtual reality device, a helmet, etc., and the bone conduction sound transmission device may be placed on a head (for example, the face), a neck, close to the ears, and a top of the head, etc. of the human body. The bone conduction sound transmission device may collect the vibration signal of the bone when a person speaks, and convert the vibration signal into an electrical signal to realize a sound collection. It should be noted that the base structure is not limited to a structure that is independent of the housing of the bone conduction sound transmission device. In some embodiments, the base structure may also be a part of the housing of the bone conduction sound transmission device.

After receiving the external vibration signal, the bone conduction sound transmission device may use the laminated structure (including the acoustic transducer unit and the vibration unit) to convert the vibration signal into the electrical signal, and output the electrical signal after being processed by a back-end circuit. Resonance may further be referred to as a "resonant vibration". Under the action of the external vibration signal on the bone conduction sound transmission device, when a frequency of the external force is the same as or very close to a natural oscillation frequency of a system, a phenomenon that an amplitude increases sharply may be referred to as resonance, and the frequency may be referred to as "resonant frequency". The bone conduction sound transmission device may have a natural frequency, and when the frequency of the external vibration signal is close to the natural frequency, the laminated structure may generate a larger amplitude, thereby outputting a larger electrical signal. Therefore, a response of the bone conduction sound transmission device to external vibration may appear to generate a resonance peak close to the natural frequency. As such, the resonant frequency of the bone conduction sound transmission device may be basically equal to the natural frequency. In some embodiments, the natural frequency of the bone conduction sound transmission device may refer to the natural frequency of the laminated structure. In some embodiments, a natural frequency of the laminated structure may be within a range of 2.5 kHz-4.5 kHz. In some embodiments, as the bone conduction signal of the human body decays rapidly after 1 kHz, it is hoped to adjust the resonant frequency of the bone conduction sound transmission device (or the natural frequency of the laminated structure) to a voice frequency band range of 1 kHz-5 kHz. In some embodiments, the resonant frequency of the bone conduction sound transmission device may be within a range of 2 kHz-5 kHz. In some embodiments, the resonant frequency of the bone conduction sound transmission device may be within a range of 2.5 kHz-4.9 kHz. In some embodiments, the resonant frequency of the bone conduction sound transmission device may be adjusted to the voice frequency band range of 1 kHz-4.5 kHz. In some embodiments, the resonant frequency of the bone conduction sound transmission device may be adjusted to the voice frequency band range of 2.5 kHz-4.5 kHz. In some embodiments, the resonant frequency of the bone conduction sound transmission device may be adjusted to the voice frequency band range of 2.5 kHz-3.5 kHz. According to the above adjustment on the resonant frequency range, a resonance peak of the bone conduction sound transmission device may be located in the range of the voice frequency band of 1 kHz-5 kHz, thereby improving the sensitivity of the bone conduction sound transmission device in response to the vibration of voice frequency band (e.g., a range of the frequency band before the resonance peak, i.e., 20 Hz-5 kHz).

In some embodiments, the resonant frequency of the bone conduction sound transmission device may be within a range of 3.5 kHz-4.7 kHz. In some embodiments, the resonant frequency of the bone conduction sound transmission device may be within a range of 4 kHz-4.5 kHz.

As the bone conduction sound transmission device may be equivalent to a mass-spring-damping system model, the bone conduction sound transmission device may be equivalent to a mass-spring-damping system doing forced vibration under the action of an exciting force during operation, and its vibration law may conform to the law of mass-spring-damping system. Therefore, the resonant frequency of the bone conduction sound transmission device may be related to an equivalent stiffness and an equivalent mass of internal components (e.g., the vibration unit or laminated structure) of the bone conduction sound transmission device. The resonant frequency of the bone conduction sound transmission device may be positively correlated with the equivalent stiffness of the internal components of the bone conduction sound transmission device, and negatively correlated with the equivalent mass of the internal components of the bone conduction sound transmission device. The equivalent stiffness is the stiffness of the bone conduction sound transmission device after it is equivalent to the mass-spring-damping system model, and the equivalent mass is the mass of the bone conduction sound transmission device after it is equivalent to the mass-spring-damping system model. Thus, adjusting the resonant frequency (or the natural frequency) of the bone conduction sound transmission device is to adjust the equivalent stiffness and equivalent mass of the vibration unit or the laminated structure.

For the bone conduction sound transmission device, the bone conduction sound transmission device at work may be equivalent to the forced vibration of the mass-spring-damping system model under an excitation external force, and vibration law of the bone conduction sound transmission device conforms to the law of the mass-spring-damping system model. Under the action of the excitation external force, the influencing parameters of the resonant frequency $f_0$ may include but not limited to the system equivalent stiffness k, the system equivalent mass m, and the system equivalent relative damping coefficient (damping ratio) $\zeta$. In some embodiments, the system equivalent stiffness k may be positively correlated with the system resonance frequency $f_0$ of the bone conduction sound transmission device, the system equivalent mass m may be negatively correlated with the system resonance frequency $f_0$ of the bone conduction sound transmission device, and the system equivalent relative damping coefficient (damping ratio) $\zeta$ may be negatively correlated with the system resonant frequency $f_0$ of the bone conduction sound transmission device. In some embodiments, $$\frac{k}{m}\cdot(1-\zeta^2)$$

may be positively correlated with the resonant frequency $f_0$ on system of the bone conduction sound transmission device. In some embodiments, the frequency response may satisfy the following formula (1):

$$f_0=\frac{1}{2\pi}\sqrt{\frac{k}{m}\cdot(1-\zeta^2)}. \tag{1}$$

Where $f_0$ is the resonant frequency on the system of the bone conduction sound transmission device, k is the system equivalent stiffness, m is the system equivalent mass, and $\zeta$ is the system equivalent relative damping coefficient (damping ratio).

For most bone conduction sound transmission devices, especially piezoelectric bone conduction sound transmission devices, the system equivalent relative damping coefficient ζ may be usually small, and the resonant frequency $f_0$ of the system may be mainly affected by the equivalent stiffness and the equivalent mass. Taking the bone conduction sound transmission device shown in FIG. 8 as an example, a support arm 830 may provide spring and damping function for the vibration system, and the mass element 840 may provide mass function for the vibration system. Therefore, the support arm 830 may mainly affect the system equivalent stiffness k and also affect the system equivalent mass m at the same time, and the mass element 840 may mainly affect the system equivalent mass m and also affect the system equivalent stiffness k at the same time. For a bone conduction sound transmission device with a relatively complex structure, it is difficult to solve resonant frequency $f_0$ of the bone conduction sound transmission device theoretically. The frequency response of the bone conduction sound transmission device may be solved by building a model of the corresponding structure and parameters using a finite element simulation tool. In some embodiments, the electrode layer (including the first electrode layer and the second electrode layer), the piezoelectric layer, the elastic layer, and the mass element described below may be made by selecting different materials, and the resonant frequency $f_0$ of the bone conduction sound transmission device may be adjusted. In some embodiments, the resonant frequency $f_0$ of the bone conduction sound transmission device may be adjusted by designing the structure of the bone conduction sound transmission device, such as the structure of the support arm and the mass element, the structure of the cantilever beam, the structure of the perforated suspension membrane, and the structure of the suspension membrane and the mass element. In some embodiments, the resonant frequency $f_0$ of the bone conduction sound transmission device may be adjusted by designing the dimensions of different components, such as the length, width, and thickness of the support arm, mass element, cantilever beam, suspension membrane, etc.

In some embodiments, the equivalent stiffness and the equivalent mass may be adjusted by changing structure parameters of the vibration unit and the acoustic transducer unit, so that the natural frequency of the laminated structure may be reduced to the voice frequency band range. For example, the equivalent stiffness of the vibration unit may be adjusted by setting holes on the vibration unit. For another example, the equivalent mass of the laminated unit may be adjusted by setting the mass element in the vibration unit. For another example, the equivalent stiffness of the laminated unit may be adjusted by setting the support arm in the vibration unit. For more contents on the adjustment of the structure parameters of the vibration unit and the acoustic transducer unit, please refer to the descriptions below, which are not repeated here.

Figure 2:
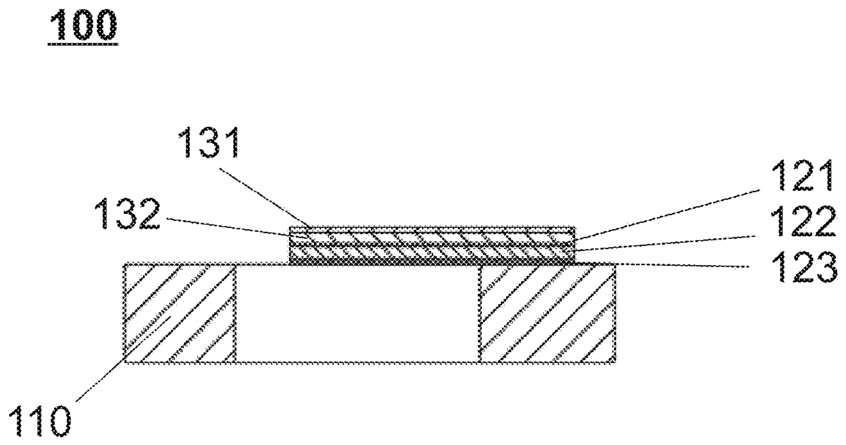
FIG. 2 is a sectional view of the bone conduction sound transmission device in FIG. 1 along an A-A axis according to some embodiments of the present disclosure.

FIG. 1 is a schematic structural diagram illustrating a bone conduction sound transmission device according to some embodiments of the present disclosure. FIG. 2 is a sectional view of the bone conduction sound transmission device in FIG. 1 along an A-A axis according to some embodiments of the present disclosure.

As shown in FIGS. 1 and 2, a bone conduction sound transmission device 100 may include a base structure 110 and a laminated structure. At least part of the laminated structure may be connected to the base structure 110. The base structure 110 may be a hollow frame structure, and part of the laminated structure (e.g., an end of the laminated structure away from a connection between the base structure 110 and the laminated structure) may be located in a hollow part of the hollow frame structure. It should be noted that the hollow frame structure is not limited to a cuboid shown in FIG. 1. In some embodiments, the frame structure may be a regular or an irregular structure such as a trustum of a pyramid or a cylinder. In some embodiments, the laminated structure may be fixedly connected to the base structure 110 in a form of a cantilever beam. Further, the laminated structure may include a fixed end and a free end. The fixed end of the laminated structure may be fixedly connected to the frame structure, and the free end of the laminated structure may be not connected or contacted with the frame structure, so that the free end of the laminated structure may be suspended in the hollow part of the hollow frame structure. In some embodiments, the fixed end of the laminated structure may be connected to an upper surface or a lower surface of the base structure 110 or a sidewall where the hollow part of the base structure 110 is located. In some embodiments, the sidewall where the hollow part of the base structure 110 is located may further be provided with a mounting groove adapted to the fixed end of the laminated structure, so that the fixed end of the laminated structure is matched with the base structure 110. To improve stability between the laminated structure and the base structure 110, in some embodiments, the laminated structure may include a connection base 140. As an example only, as shown in FIG. 1, the connection base 140 may be fixedly connected to the fixed end of the laminated structure. In some embodiments, a fixed end of the connection base 140 may be located on the upper surface or the lower surface of the base structure 110. In some embodiments, the fixed end of the connection base 140 may further be located at the sidewall where the hollow part of the base structure 110 is located. For example, the sidewall where the hollow part of the base structure 110 is located is provided with a mounting groove adapted to the fixed end, so that the fixed end of the laminated structure is matched with the base structure 110 through the mounting groove. The "connection" here may be understood as the fixed connection of the laminated structure and the base structure 110 by means of welding, riveting, bonding, bolting, clamping, etc. after the laminated structure and the base structure 110 are respectively prepared, or depositing the laminated structure on the base structure 110 through a physical deposition (e.g., a physical vapor deposition) or a chemical deposition (e.g., a chemical vapor deposition) during the preparing process. In some embodiments, the connection base 140 may be a separate structure from the laminated structure or integrally formed with the laminated structure.

In some embodiments, the laminated structure may include an acoustic transducer unit 120 and a vibration unit 130. The vibration unit 130 refers to a part in the laminated structure that may produce an elastic deformation. The acoustic transducer unit 120 refers to a part in the laminated structure that converts the deformation of the vibration unit 130 into an electrical signal. In some embodiments, the vibration unit 130 may be located on the upper surface or the lower surface of the acoustic transducer unit 120. In some embodiments, the vibration unit 130 may include at least one elastic layer. For illustrative purposes only, the vibration unit 130 shown in FIG. 1 may include a first elastic layer 131 and a second elastic layer 132 arranged in sequence from top to bottom. The first elastic layer 131 and the second elastic layer 132 may be plate-shaped structures made of semiconductor material. In some embodiments, the semiconductor material may include silicon dioxide, silicon nitride, gallium nitride, zinc oxide, silicon carbide, etc. In some embodiments, the materials of the first elastic layer 131 and the second elastic layer 132 may be the same or different. In some embodiments, the acoustic transducer unit 120 may include at least a first electrode layer 121, a piezoelectric layer 122, and a second electrode layer 123 arranged in sequence from top to bottom. The elastic layers (e.g., the first elastic layer 131 and the second elastic layer 132) may be located on the upper surface of the first electrode layer 121 or the lower surface of the second electrode layer 123. The piezoelectric layer 122 may generate a voltage (a potential difference) under a deformation stress of the vibration unit 130 (e.g., the first elastic layer 131 and the second elastic layer 132) based on a piezoelectric effect, and the first electrode layer 121 and the second electrode layer 123 may export the voltage (the electrical signal). In some embodiments, the material of the piezoelectric layer may include piezoelectric film material, and the piezoelectric film material may be film material (such as AlN film material, PZT film material) made by a deposition process (such as a magnetron sputtering deposition process, a chemical vapor deposition process, etc.). In some embodiments, the material of the piezoelectric layer 122 may include piezoelectric crystal material and piezoelectric ceramic material. The piezoelectric crystal material refers to piezoelectric monocrystal. In some embodiments, the piezoelectric crystal materials may include crystal, sphalerite, boracite, tourmaline, zincite, GaAs, barium titanate, and its derivative structure crystals, $KH_2PO_4$, $NaKC_4H_4O_6 \cdot 4H_2O$ (Rochellel salt), etc., or any combination thereof. The piezoelectric ceramic materials may refer to piezoelectric polycrystals formed by a random collection of fine grains obtained by solid-phase reaction and sintering of different material powders. In some embodiments, the piezoelectric ceramic materials may include barium titanate (BT), PZT, lead barium lithium niobate (PBLN), modified lead titanate, aluminum nitride (AlN), zinc oxide (ZnO), etc., or any combination thereof. In some embodiments, the material of the piezoelectric layer 122 may also be a piezoelectric polymer material, such as polyvinylidene fluoride (PVDF). In some embodiments, the first electrode layer 121 and the second electrode layer 123 may be conductive material structures. Exemplarily, the conductive materials may include metals, alloy materials, metal oxide materials, graphene, etc., or any combination thereof. In some embodiments, the metal and alloy materials may include nickel, iron, lead, platinum, titanium, copper, molybdenum, zinc, or any combination thereof. In some embodiments, the alloy materials may include copper-zinc alloy, copper-tin alloy, copper-nickel-silicon alloy, copper-chromium alloy, copper-silver alloy, etc., or any combination thereof. In some embodiments, the metal oxide materials may include $RuO_2$, $MnO_2$, $PbO_2$, NiO, etc., or any combination thereof.

When a relative movement occurs between the laminated structure and the base structure 110, deformation degrees of the vibration unit 130 (e.g., the first elastic layer 131 or the second elastic layer 132) in the laminated structure at different positions are different, that is, the different positions of the vibration unit 130 may have different deformation stresses on the piezoelectric layer 122 of the acoustic transducer unit 120. In some embodiments, in order to improve a sensitivity of the bone conduction sound transmission device 100, the acoustic transducer unit 120 may be arranged only at the position with a greater deformation degree of the vibration unit 130, thereby improving a signal noise ratio (SNR) of the bone conduction sound transmission device. Correspondingly, an area of the first electrode layer 121, the piezoelectric layer 122, and/or the second electrode layer 123 of the acoustic transducer unit 120 may be less than or equal to an area of the vibration unit 130. In some embodiments, in order to further improve the SNR of the bone conduction sound transmission device 100, the area covered by the acoustic transducer unit 120 on the vibration unit 130 may be less than or equal to ½ of the area of the vibration unit 130. Preferably, the area covered by the acoustic transducer unit 120 on the vibration unit 130 may be less than or equal to ⅓ of the area of the vibration unit 130. Further preferably, the area covered by the acoustic transducer unit 120 on the vibration unit 130 may be less than or equal to ¼ of the area of the vibration unit 130. Further, in some embodiments, a position of the acoustic transducer unit 120 may be close to the connection between the laminated structure and the base structure 110. The vibration unit 130 (e.g., the elastic layer) may produce a large deformation degree when an external force is applied near the connection between the laminated structure and the base structure 110, and the acoustic transducer unit 120 may also be subjected to a large deformation degree near the connection between the laminated structure and the base structure 110. The acoustic transducer unit 120 may be arranged in a region with a large deformation stress to improve the SNR of the bone conduction sound transmission device 100 on the basis of improving a sensitivity of the bone conduction sound transmission device 100. It should be noted that the acoustic transducer unit 120 close to the connection between the laminated structure and the base structure 110 is relative to the free end of the laminated structure. That is to say, a distance between the acoustic transducer unit 120 and the connection between the laminated structure and the base structure 110 may be smaller than a distance between the acoustic transducer unit 120 and the free end. In some embodiments, the sensitivity and the SNR of the bone conduction sound transmission device 100 may be improved merely by adjusting the area and the position of the piezoelectric layer 122 in the acoustic transducer unit 120. For example, the first electrode layer 121 and the second electrode layer 123 may fully or partially cover the surface of the vibration unit 130, and the area of the piezoelectric layer 122 may be less than or equal to the area of the first electrode layer 121 or the second electrode layer 123. In some embodiments, the area covered by the piezoelectric layer 122 on the first electrode layer 121 or the second electrode layer 123 may be less than or equal to ½ of the area of the first electrode layer 121 or the second electrode layer 123. Preferably, the area covered by the piezoelectric layer 122 on the first electrode layer 121 or the second electrode layer 123 may be less than or equal to ⅓ of the area of the first electrode layer 121 or the second electrode layer 123. Further preferably, the area covered by the piezoelectric layer 122 on the first electrode layer 121 or the second electrode layer 123 may be less than or equal to ¼ of the area of the first electrode layer 121 or the second electrode layer 123. In some embodiments, in order to prevent a short circuit caused by the connection between the first electrode layer 121 and the second electrode layer 123, the area of the first electrode layer 121 may be less than the area of the piezoelectric layer 122 or the second electrode layer 123. For example, the areas of the piezoelectric layer 122, the second electrode layer 123 and the vibration unit 130 may be the same, and the area of the first electrode layer 121 may be less than the area of the vibration unit 130 (e.g., the elastic layer), the piezoelectric layer 122, or the second electrode layer 123. In this case, an entire region of the first electrode layer 121 may be located on the surface of the piezoelectric layer 122, and an edge of the first electrode layer 121 may have a certain distance from an edge of the piezoelectric layer 122, so that the first electrode layer 121 avoids a region with a poor material quality at the edge of the piezoelectric layer 122, thereby further improving the SNR of the bone conduction sound transmission device 100.

In some embodiments, in order to increase an output electrical signal and improve the SNR of the bone conduction sound transmission device 100, the piezoelectric layer 122 may be located on one side of a neutral layer of the laminated structure. The neutral layer refers to a plane layer whose deformation stress is approximately zero when the deformation occurs in the laminated structure. In some embodiments, the SNR of the bone conduction sound transmission device 100 may further be improved by adjusting (e.g., increasing) a stress and a stress variation gradient of the piezoelectric layer 122 per unit thickness. In some embodiments, the SNR and the sensitivity of the bone conduction sound transmission device may further be improved by adjusting shapes, thicknesses, materials, sizes (e.g., lengths, widths, and thicknesses) of the acoustic transducer unit 120 (e.g., the first electrode layer 121, the piezoelectric layer 122, the second electrode layer 123) and the vibration unit 130 (e.g., the first elastic layer 131, the second elastic layer 132).

In some embodiments, in order to control a warping deformation of the laminated structure, it is necessary to balance the stress of each layer in the laminated structure, so that the upper and lower parts of the neutral layer of the cantilever beam may be subjected to the same type of stress (e.g., a tensile stress, a compressive stress), and the size of the stress may be equal. For example, when the piezoelectric layer 122 is an AIN material layer, the piezoelectric layer 122 may be arranged on one side of the neutral layer of the cantilever beam. In general, the stress of the AlN material layer may be the tensile stress, and the comprehensive stress of the elastic layer on the other side of the neutral layer may also be the tensile stress.

In some embodiments, the acoustic transducer unit 120 may further include a seed layer (not shown in the figure) for providing good growth surface structures for other layers, and the seed layer is located on the lower surface of the second electrode layer 123. In some embodiments, the material of the seed layer may be the same as that of the piezoelectric layer 122. For example, when the material of the piezoelectric layer 122 is the AlN, the material of the seed layer may also be the AlN. It should be noted that when the acoustic transducer unit 120 is located on the lower surface of the second electrode layer 123, the seed layer may be located on the upper surface of the first electrode layer 121. Further, when the acoustic transducer unit 120 includes the seed layer, the vibration unit 130 (e.g., the first elastic layer 131, the second elastic layer 132) may be located on surface of the seed layer away from the piezoelectric layer 122. In other embodiments, the material of the seed layer may also be different from that of the piezoelectric layer 122.

It should be noted that the shape of the laminated structure may not be limited to the rectangle shown in FIG. 1, and may also be regular or irregular shapes such as a triangle, a trapezoid, a circle, a semicircle, a ¼ circle, an ellipse, and a semi-ellipse, etc., which is not limited here. In addition, a number of laminated structures may not be limited to one as shown in FIG. 1, which may be 2, 3, 4 or more. Different laminated structures may be suspended side by side in the hollow part of the base structure 110, or may be suspended in the hollow part of the base structure 110 in sequence along the arrangement direction of each layer of the laminated structure.

Figure 3:
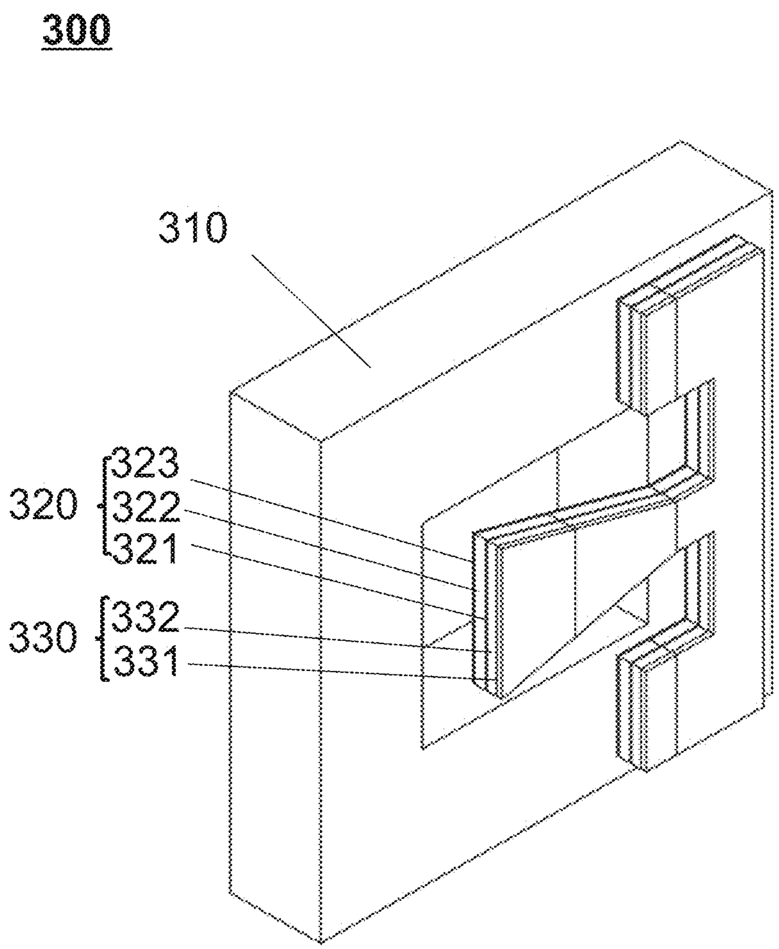
FIG. 3 is a schematic structural diagram illustrating another bone conduction sound transmission device according to some embodiments of the present disclosure.

FIG. 3 is a schematic structural diagram illustrating another bone conduction sound transmission device according to some embodiments of the present disclosure. A bone conduction sound transmission device 300 in FIG. 3 may be substantially the same as the bone conduction sound transmission device 100 in FIG. 1, and the main difference is that a shape of a laminated structure of the bone conduction sound transmission device 300 in FIG. 3 is different. As shown in FIG. 3, the bone conduction sound transmission device 300 may include a base structure 310 and a laminated structure, and the shape of the laminated structure may be a trapezoid. Further, a width of the laminated structure in the bone conduction sound transmission device 300 may gradually decrease from a free end to a fixed end. In other embodiments, the width of the laminated structure in the bone conduction sound transmission device 300 may gradually increase from the free end to the fixed end. It should be noted that the structure of the base structure 310 here may be similar to that of the base structure 110, and the structure of a vibration unit 330 may be similar to that of the vibration unit 130. For detailed contents about a first electrode layer 321, a piezoelectric layer 322, and a second electrode layer 323 of an acoustic transducer unit 320, and a first elastic layer 331 and a second elastic layer 332 in the vibration unit 330, please refer to the contents of each layer of the acoustic transducer unit 120 and the vibration unit 130 in FIG. 1. In addition, other components (e.g., a seed layer) in the acoustic transducer unit 120 and the vibration unit 130 may also be applicable to the bone conduction sound transmission device 300 shown in FIG. 3, which are not repeated here.

Figure 4:
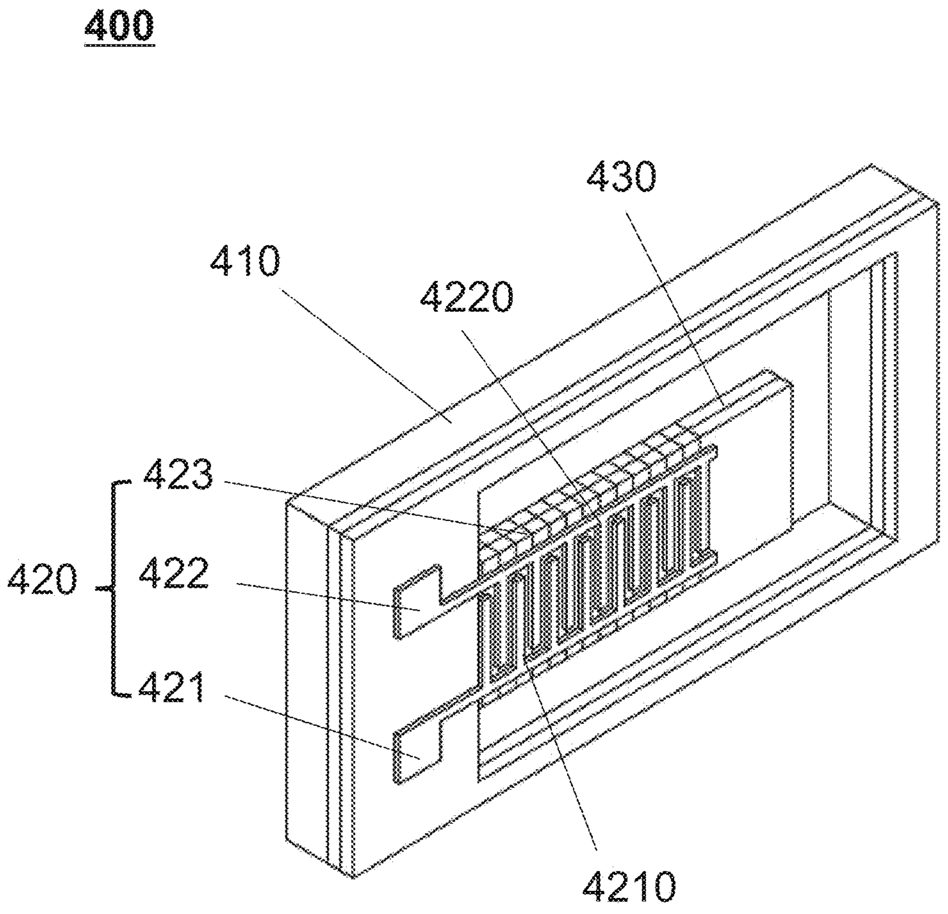
FIG. 4 is a schematic structural diagram illustrating the bone conduction sound transmission device according to some embodiments of the present disclosure.

FIG. 4 is a schematic structural diagram illustrating the bone conduction sound transmission device according to some embodiments of the present disclosure. As shown in FIG. 4, a bone conduction sound transmission device 400 may include a base structure 410 and a laminated structure, and at least part of the laminated structure may be connected to the base structure 410. In some embodiments, the base structure 410 may be a hollow frame structure, and a part of the laminated structure (e.g., an end of the laminated structure away from the connection between the base structure 410 and the laminated structure) may be located on a hollow part of the frame structure. It should be noted that the frame structure is not limited to a cuboid shown in FIG. 4, and in some embodiments, the frame structure may be a regular or irregular structure such as a prism or a cylinder. In some embodiments, the laminated structure may be fixedly connected to the base structure 410 in a form of a cantilever beam. Further, the laminated structure may include a fixed end and a free end. The fixed end of the laminated structure may be fixedly connected to the frame structure, and the free end of the laminated structure may be not connected to or contacted with the frame structure, so that the free end of the laminated structure may be suspended in the hollow part of the frame structure. In some embodiments, the fixed end of the laminated structure may be connected to an upper surface or a lower surface of the base structure 410, or a sidewall where the hollow part of the base structure 410 is located. In some embodiments, the side wall where the hollow part of the base structure 410 is located may further be provided with a mounting groove adapted to the fixed end of the laminated structure, so that the fixed end of the laminated structure is matched with the base structure 410. The "connection" here may be understood as fixedly connecting the laminated structure and the base structure 410 by means of welding, riveting, clipping, bolts, etc. after preparing the laminated structure and the base structure 410 respectively, or depositing the laminated structure on the base structure 410 by a physical deposition (e.g., a physical vapor deposition) or a chemical deposition (e.g., a chemical vapor deposition) during the preparing process. In some embodiments, one or more laminated structures may be arranged on the base structure 410, for example, the number of the laminated structures may be 1, 2, 3, 7, etc. Further, the plurality of laminated structures may be uniformly arranged equidistantly along the circumferential direction of the base structure 410, or may be unevenly arranged.

In some embodiments, the laminated structure may include an acoustic transducer unit 420 and a vibration unit 430. The vibration unit 430 may be located on an upper surface or a lower surface of the acoustic transducer unit 420. In some embodiments, the vibration unit 430 may include at least one elastic layer. The elastic layer may be a plate-shaped structure made of a semiconductor material. In some embodiments, the semiconductor material may include silicon dioxide, silicon nitride, gallium nitride, zinc oxide, silicon carbide, etc. In some embodiments, the acoustic transducer unit 420 may include an electrode layer and a piezoelectric layer 423, and the electrode layer includes a first electrode 421 and a second electrode 422. In the embodiment of the present disclosure, the piezoelectric layer 423 may generate a voltage (a potential difference) under a deformation stress of the vibration unit 430 based on a piezoelectric effect, and the first electrode 421 and the second electrode 422 may export the voltage (an electrical signal). In some embodiments, the first electrode 421 and the second electrode 422 may be arranged on the same surface (e.g., the upper surface or the lower surface) of the piezoelectric layer 423 at intervals, and the electrode layer and the vibration unit 430 may be located on different surfaces of the piezoelectric layer 423. For example, when the vibration unit 430 is located on the lower surface of the piezoelectric layer 423, the electrode layer (the first electrode 421 and the second electrode 422) may be located on the upper surface of the piezoelectric layer 423. For another example, when the vibration unit 430 is located on the upper surface of the piezoelectric layer 423, the electrode layer (the first electrode 421 and the second electrode 422) may be located on the lower surface of the piezoelectric layer 423. In some embodiments, the electrode layer and the vibration unit 430 may also be located on the same side of the piezoelectric layer 423. For example, an electrode layer may be located between the piezoelectric layer 423 and the vibration unit 430. In some embodiments, the first electrode 421 may be bent into a first comb-shaped structure 4210, and the first comb-shaped structure 4210 may include a plurality of comb-shaped structures. There is a first spacing between the adjacent comb structures of the first comb-shaped structure 4210, and the first spacing may be the same or different. The second electrode 422 may be bent into a second comb-shaped structure 4220 and the second comb-shaped structure 4220 may include a plurality of comb-shaped structures. There is a second spacing between the adjacent comb structures of the second comb-shaped structure 4220, and the second spacing may be the same or different. The first comb-shaped structure 4210 may be matched with the second comb-shaped structure 4220 to form the electrode layer. Further, the comb-shaped structure of the first comb-shaped structure 4210 may extend into the second spacing between the second comb-shaped structure 4220, and the comb-shaped structure of the second comb-shaped structure 4220 may extend into the first spacing of the first comb-shaped structure 4210, so as to match with each other to form the electrode layer. The first comb-shaped structure 4210 and the second comb-shaped structure 4220 may match with each other, so that the first electrodes 421 and the second electrode 422 may be arranged compactly but may not intersected. In some embodiments, the first comb-shaped structure 4210 and the second comb-shaped structure 4220 may extend along a length direction of the cantilever beam (e.g., the direction from the fixed end to the free end). In some embodiments, the piezoelectric layer 423 may be preferably made of the piezoelectric ceramic material. When the piezoelectric layer 423 is made of the piezoelectric ceramic material, a polarization direction of the piezoelectric layer 423 may be consistent with the length direction of the cantilever beam. A characteristic of a piezoelectric constant $d_{33}$ of the piezoelectric ceramic may be used to greatly enhance an output signal, thereby improving the sensitivity. The piezoelectric constant $d_{33}$ refers to a proportional constant for converting a mechanical energy into an electrical energy by the piezoelectric layer 323. It should be noted that the piezoelectric layer 423 shown in FIG. 4 may further be made of other materials. When the polarization direction of the piezoelectric layer 423 made of other materials is consistent with a thickness direction of the cantilever beam, the acoustic transducer unit 420 may be replaced by the acoustic transducer unit 120 shown in FIG. 1.

When a relative movement occurs between the laminated structure and the base structure 410, deformation degrees of the vibration unit 430 in the laminated structure at different positions are different, i.e., the different positions of the vibration unit 430 may have different deformation stresses on the piezoelectric layer 423 of the acoustic transducer unit 420. In some embodiments, the acoustic transducer unit 420 may only be arranged at the position with a large deformation degree of the vibration unit 430, thereby improving SNR of the bone conduction sound transmission device 400. Correspondingly, an area of the electrode layer and/or the piezoelectric layer 423 of the acoustic transducer unit 420 may be less than or equal to an area of the vibration unit 430. In some embodiments, in order to further improve the SNR of the bone conduction sound transmission device 400, an area covered by the acoustic transducer unit 420 on the vibration unit 430 may be less than the area of the vibration unit 430. Preferably, the area covered by the acoustic transducer unit 420 on the vibration unit 430 may be less than or equal to ½ of the area of the vibration unit 430. Preferably, the area covered by the acoustic transducer unit 420 on the vibration unit 430 may be less than or equal to ⅓ of the area of the vibration unit 430. Further preferably, the area covered by the acoustic transducer unit 420 on the vibration unit 430 may be less than or equal to ¼ of the area of the vibration unit 430. Further, in some embodiments, the acoustic transducer unit 420 may be close to the connection between the laminated structure and the base structure 410. As the vibration unit 430 (e.g., the elastic layer) may produce a large deformation degree near the connection between the laminated structure and the base structure 410, and the acoustic transducer unit 420 is also subjected to a large deformation stress near the connection between the laminated structure and the base structure 410, the acoustic transducer unit 420 may be arranged in the region with relatively large deformation stress to improve the SNR of the bone conduction sound transmission device 400 on the basis of improving the sensitivity of the bone conduction sound transmission device 400. It should be noted that the acoustic transducer unit 420 close to the connection between the laminated structure 410 and the base structure may be relative to the free end of the laminated structure, i.e., the distance from the acoustic transducer unit 420 to the connection between the laminated structure and the base structure 410 may be less than the distance from the acoustic transducer unit 420 to the free end. In some embodiments, the sensitivity and the SNR of the bone conduction sound transmission device 400 may be improved merely by adjusting the area and position of the piezoelectric layer 423 in the acoustic transducer unit 420. For example, the electrode layer completely or partially covers the surface of the vibration unit 430, and the area of the piezoelectric layer 423 may be less than or equal to the area of the electrode layer. Preferably, the area covered by the piezoelectric layer 423 on the vibration unit 430 may be less than or equal to ½ of the area of the electrode layer. Preferably, the area covered by the piezoelectric layer 423 on the vibration unit 430 may be less than or equal to ⅓ of the area of the electrode layer. Further preferably, the area covered by the piezoelectric layer 423 on the vibration unit 430 may be less than or equal to ¼ of the area of the electrode layer. In some embodiments, the area of the piezoelectric layer 423 may be the same as the area of the vibration unit 430, the entire region of the electrode layer may be located at the piezoelectric layer 423, and an edge of the electrode layer may have a certain distance from an edge of the piezoelectric layer 423, so that the first electrode 421 and the second electrode 422 in the electrode layer may avoid a region of poor material quality at the edge of the piezoelectric layer 423, thereby further improving the SNR of the bone conduction sound transmission device 400.

In some embodiments, the shapes, thicknesses, materials, sizes (e.g., lengths, widths, and thicknesses) of the acoustic transducer unit 420 (e.g., the first electrode layer 421, the piezoelectric layer 422, the second electrode layer 423) and the vibration unit 430 (e.g., the first elastic layer 431, the second elastic layer 432) may be adjusted to increase the electrical signal and improve the SNR and the sensitivity of the bone conduction sound transmission device 400.

In some embodiments, in order to increase the electrical signal and improve the SNR of the bone conduction sound transmission device 400, a length and a width of a single comb-shaped structure, the spacing between the comb-shaped structures of the first comb-shaped structure 4210 and the second comb-shaped structure 4220 (e.g., the first spacing and the second spacing), and the length of the entire acoustic transducer unit 420 may be adjusted.

Figure 5:
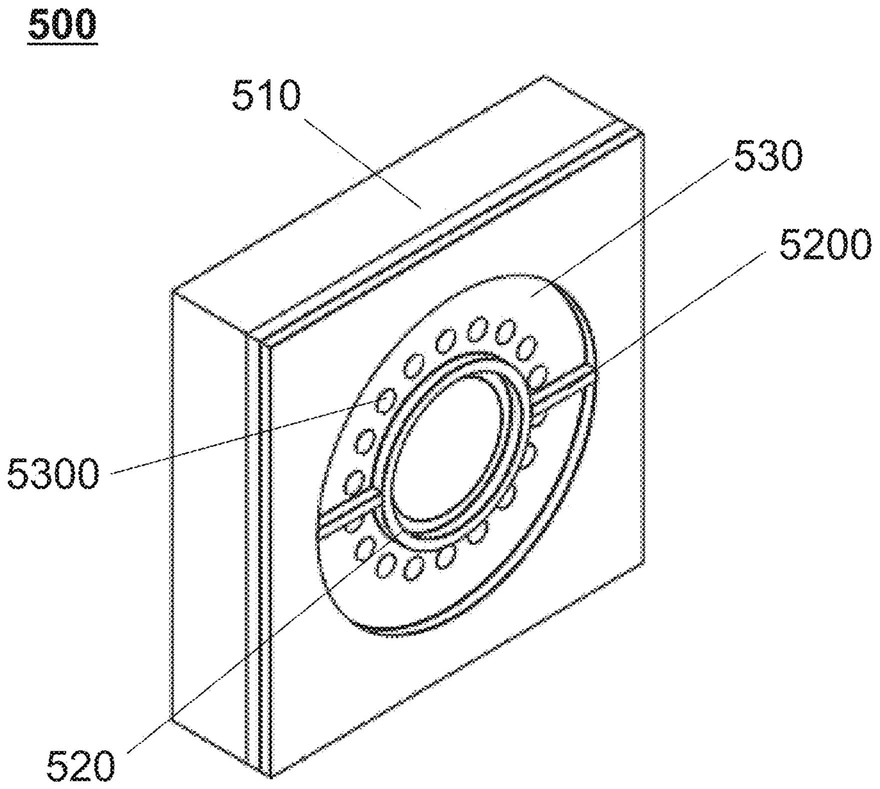
FIG. 5 is a schematic structural diagram illustrating a bone conduction sound transmission device according to some embodiments of the present disclosure.
Figure 6:
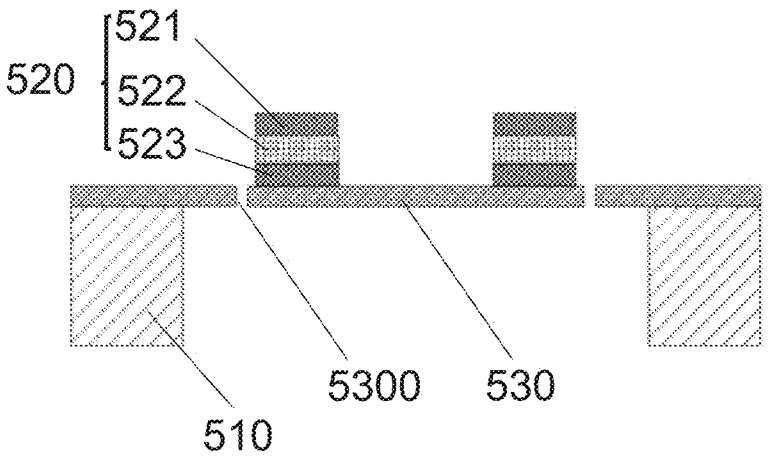
FIG. 6 is a sectional view of a partial structure of the bone conduction sound transmission device in FIG. 5 according to some embodiments of the present disclosure.

FIG. 5 is a schematic structural diagram illustrating a bone conduction sound transmission device according to some embodiments of the present disclosure. FIG. 6 is a sectional view of a partial structure of the bone conduction sound transmission device in FIG. 5 according to some embodiments of the present disclosure. As shown in FIGS. 5 and 6, a bone conduction sound transmission device 500 may include a base structure 510 and a laminated structure, and at least part of the laminated structure may be connected to the base structure 510. In some embodiments, the base structure 510 may be a hollow frame structure, and part of the laminate structure may be located in the hollow part of the frame structure. It should be noted that the frame structure is not limited to the cuboid shown in FIG. 5, and in some embodiments, the frame structure may be a regular or irregular structure such as a prism or a cylinder.

In some embodiments, the laminated structure may include an acoustic transducer unit 520 and a vibration unit. In some embodiments, the vibration unit may be arranged on an upper surface or a lower surface of the acoustic transducer unit 520. As shown in FIG. 5, the vibration unit may include a suspension membrane structure 530, the suspension membrane structure 530 may be fixed on the base structure 510 by connecting a peripheral side of the suspension membrane structure 530 to the base structure 510, and a central region of the suspension membrane structure 530 may be suspended in the hollow part of the base structure 510. In some embodiments, the suspension membrane structure 530 may be located on the upper surface or the lower surface of the base structure 510. In some embodiments, the peripheral side of the suspension membrane structure 530 may further be connected to an inner wall of the hollow part of the base structure 510. The "connection" here may be understood as fixing the suspension membrane structure 530 to the upper surface or the lower surface of the base structure 510, or a side wall of the hollow part of the base structure 510 by a mechanical fixing (e.g., a strong bonding, a riveting, a clamping, an inlaying, etc.) after preparing the suspension membrane structure 530 and the base structure 510 respectively, or depositing the suspension membrane structure 530 on the base structure 510 through a physical deposition (e.g., a physical vapor deposition) or a chemical deposition (e.g., a chemical vapor deposition) during the preparation process. In some embodiments, the suspension membrane structure 530 may include at least one elastic layer. The elastic layer may be a film-shaped structure made of semiconductor material. In some embodiments, the semiconductor material may include silicon dioxide, silicon nitride, gallium nitride, zinc oxide, silicon carbide, etc. In some embodiments, a shape of the suspension membrane structure 530 may be a polygon such as a circle, an ellipse, a triangle, a quadrangle, a pentagon, a hexagon, or any other shape.

In some embodiments, the acoustic transducer unit 520 may be located on the upper surface or the lower surface of the suspension membrane structure 530. In some embodiments, the suspension membrane structure 530 may include a plurality of holes 5300 distributed around a center of the acoustic transducer unit 520 along the circumferential direction of the acoustic transducer unit 520. It may be understood that by arranging the plurality of holes 5300 on the suspension membrane structure 530, stiffnesses of the suspension membrane structure 530 at different positions may be adjusted, so that the stiffness of the suspension membrane structure 530 in the region close to the plurality of holes 5300 may be reduced, and the stiffness of the suspension membrane structure 530 in the region away from the plurality of holes 5300 may be relatively great. When relative motion occurs between the suspension membrane structure 530 and the base structure 510, a deformation degree of the suspension membrane structure 530 in the region close to the plurality of holes 5300 may be relatively large, and the deformation degree of the suspension membrane structure 530 in the region away from the plurality of holes 5300 may be relatively small. At this time, the acoustic transducer unit 520 may be placed in the region close to the plurality of holes 5300 on the suspension membrane structure 530, which may be more conducive to a collection of a vibration signal by the acoustic transducer unit 520, thereby effectively improving sensitivity of the bone conduction sound transmission device 500. At the same time, the structure of each component in the bone conduction sound transmission device 500 may be relatively simple, which is convenient for production or assembly. In some embodiments, the hole 5300 on the suspension membrane structure 530 may be in any shape such as a circular hole, an oval hole, a square hole, or other polygonal holes. In some embodiments, a resonant frequency and a stress distribution of the bone conduction sound transmission device 500 may further be adjusted (so that the resonant frequency is within the range of 2 kHz-5 kHz) by changing sizes, numbers, distances, and positions of the plurality of holes 5300, so as to improve the sensitivity of the bone conduction sound transmission device 500. It should be noted that the resonant frequency is not limited to the above range of 2 kHz-5 kHz, but may further be within a range of 3 kHz-4.5 kHz or a range of 4 kHz-4.5 kHz. The resonant frequency may be adjusted adaptively according to different application scenarios, which is not limited here.

Referring to FIGS. 5 and 6, in some embodiments, the acoustic transducer unit 520 may include a first electrode layer 521, a piezoelectric layer 522, and a second electrode layer 523 arranged in sequence from top to bottom. The positions of the first electrode layer 521 and the second electrode layer 523 may be interchanged. The piezoelectric layer 522 may generate a voltage (a potential difference) under deformation stress of the vibration unit (e.g., the suspension membrane structure 530) based on a piezoelectric effect, and the first electrode layer 521 and the second electrode layer 523 may export the voltage (an electrical signal). In some embodiments, material of the piezoelectric layer 522 may include a piezoelectric crystal material and a piezoelectric ceramic material. The piezoelectric crystal refers to a piezoelectric monocrystal. In some embodiments, the piezoelectric crystal material may include crystal, sphalerite, boracite, tourmaline, zincite, GaAs, barium titanate and its derivative structure crystals, $KH_2PO_4$, $NaKC_4H_4O_6 \cdot 4H_2O$ (Rochelle salt), sugar, etc., or any combination thereof. The piezoelectric ceramic material refers to a piezoelectric polycrystal formed by a random collection of fine grains obtained by solid-phase reaction and sintering of different material powders. In some embodiments, the piezoelectric ceramic material may include barium titanate (BT), lead zirconate titanate (PZT), lead barium lithium niobate (PBLN), modified lead titanate, aluminum nitride (AlN), oxide zinc (ZnO), etc., or any combination thereof. In some embodiments, the piezoelectric layer 522 may further be made of a piezoelectric polymer material such as polyvinylidene fluoride (PVDF). In some embodiments, the first electrode layer 521 and the second electrode layer 523 may be made of conductive material. Exemplarily, the conductive material may include metal, alloy material, metal oxide material, graphene, etc., or any combination thereof. In some embodiments, the metal and alloy material may include nickel, iron, lead, platinum, titanium, copper, molybdenum, zinc, etc., or any combination thereof. In some embodiments, the alloy material may include copper-zinc alloy, copper-tin alloy, copper-nickel-silicon alloy, copper-chromium alloy, copper-silver alloy, etc., or any combination thereof. In some embodiments, the metal oxide material may include $RuO_2$, $MnO_2$, $PbO_2$, NiO, etc., or any combination thereof.

As shown in FIG. 5, in some embodiments, the plurality of holes 5300 may be enclosed in a circular region. To improve a sound pressure output effect of the acoustic transducer unit 520, the acoustic transducer unit 520 may be arranged on the suspension membrane structure 530 close to the plurality of holes. Further, the acoustic transducer unit 520 may be an annular structure distributed along an inner side of the circular region enclosed by the plurality of holes 5300. In some embodiments, the acoustic transducer units 520 in the annular structure may further be distributed along an outer side of the circular area enclosed by the plurality of holes 5300. In some embodiments, the piezoelectric layer 522 of the acoustic transducer unit 520 may be a piezoelectric ring, and the first electrode layer 521 and the second electrode layer 523 located on the upper surface or lower surface of the piezoelectric ring may be electrode rings. In some embodiments, the acoustic transducer unit 520 may be further provided with a lead structure 5200, which is used to transmit the electrical signal collected by the electrode ring (e.g., the first electrode layer 521 and the second electrode layer 523) to subsequent circuit. In some embodiments, to improve the output electrical signal of the bone conduction sound transmission device 500, a radial distance from an edge of the acoustic transducer unit 520 (e.g., the annular structure) to a center of each hole 5300 may be within a range of 100 μm-400 μm. Preferably, the radial distance from the edge of the acoustic transducer unit 520 (e.g., the annular structure) to the center of each hole 5300 may be within a range of 150 μm-300 μm. Further preferably, the radial distance from the edge of the acoustic transducer unit 520 (e.g., the annular structure) to the center of each hole 5300 may be within a range of 150 μm-250 μm.

In some embodiments, the output electrical signal of the bone conduction sound transmission device 500 may further be improved by adjusting a shape, a size (e.g., a length, a width, a thickness) and material of the lead structure 5200.

In alternative embodiments, the deformation stress of the suspension membrane structure 530 at different positions may further be changed by adjusting the thicknesses or densities of different regions of the suspension membrane structure 530. For illustrative purposes only, in some embodiments, the acoustic transducer unit 520 is set as the annular structure, and the thickness of the suspension membrane structure 530 located in the inside region of the annular structure is larger than the thickness of the suspension membrane structure 530 located in the outside region of the annular structure. In some embodiments, the density of the suspension membrane structure 530 located in the inside region of the annular structure is larger than the density of the suspension membrane structure 530 located in the outside region of the annular structure. By changing the densities or the thicknesses of the suspension membrane structure 530 at different positions, the mass of the suspended membrane located in the inside region of the annular structure is larger than the mass of the suspended membrane located in the outside region of the annular structure. When the relative motion occurs between the suspension membrane structure 530 and the base structure 510, the suspension membrane structure 530 close to the annular structure of the acoustic transducer unit 520 may be deformed to a greater degree and may generate a greater deformation stress, thereby improving the output electrical signal of the bone conduction sound transmission device 500.

It should be noted that a shape of the region enclosed by the plurality of holes 5300 is not limited to the circle shown in FIG. 5. The shape of the region enclosed by the plurality of holes 5300 may further be a semicircle, a ¼ circle, an ellipse, a semi-ellipse, a triangle, a rectangle, and other regular or irregular shapes. The shape of the acoustic transducer unit 520 may be adaptively adjusted according to the shape of the region enclosed by the plurality of holes 5300. For example, when the shape of the region enclosed by the plurality of holes 5300 is a rectangle, the acoustic transducer unit 520 may be a rectangle, and the rectangular acoustic transducer units 520 may be distributed along the inside or the outside of the rectangle enclosed by the plurality of holes 5300. For another example, when the shape of the region enclosed by the plurality of holes 5300 is a semicircle, the shape of the acoustic transducer unit 520 may be a semicircular shape, and the semicircular acoustic transducer unit 520 may be distributed along the inside or outside of the semicircular shape enclosed by the plurality of holes 5300. In some embodiments, there may be no hole on the suspension membrane structure 530 in FIG. 5.

Figure 7:
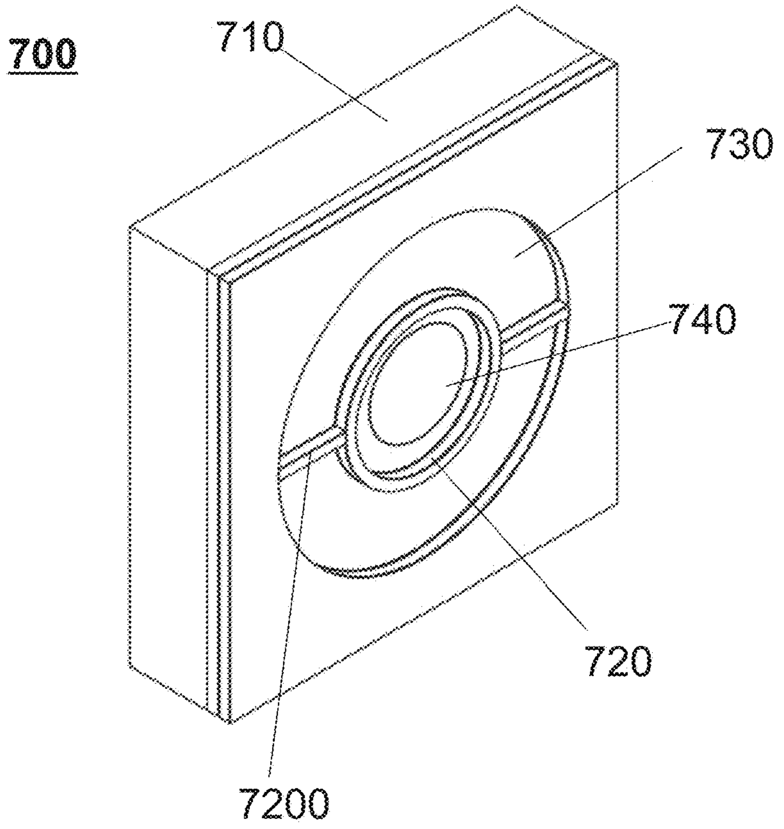
FIG. 7 is a schematic structural diagram illustrating the bone conduction sound transmission device according to some embodiments of the present disclosure.

FIG. 7 is a schematic structural diagram illustrating the bone conduction sound transmission device according to some embodiments of the present disclosure. The structure of a bone conduction sound transmission device 700 shown in FIG. 7 is substantially the same as that of the bone conduction sound transmission device 500 shown in FIG. 5. The difference is that a vibration unit of the bone conduction sound transmission device 700 in FIG. 7 includes a suspension membrane structure 730 and a mass element 740.

As shown in FIG. 7, the bone conduction sound transmission device 700 may include a base structure 710 and a laminated structure, and at least part of the laminated structure may be connected to the base structure 710. In some embodiments, the base structure 710 may be a hollow frame structure, and a part of the laminate structure may be located in a hollow part of the hollow frame structure. It should be noted that the hollow frame structure is not limited to the cuboid shown in FIG. 7, and in some embodiments, the hollow frame structure may be a regular or irregular structure such as a prism or a cylinder.

In some embodiments, the laminated structure may include an acoustic transducer unit 720 and a vibration unit. In some embodiments, the vibration unit may be arranged on the upper surface or the lower surface of the acoustic transducer unit 720. As shown in FIG. 7, the vibration unit may include a suspension membrane structure 730 and a mass element 740, and the mass element 740 may be located on the upper surface or the lower surface of the suspension membrane structure 730. In some embodiments, the suspension membrane structure 730 may be located on the upper surface or the lower surface of the base structure 710. In some embodiments, a peripheral side of the suspension membrane structure 730 may further be connected to an inner wall of a hollow part of the base structure 710. The "connection" here may be understood as fixing the suspension membrane structure 730 to the upper surface or the lower surface of the base structure 710, or a side wall of the hollow part of the base structure 710 by a mechanical fixing (e.g., a strong bonding, a riveting, a clamping, an inlaying, etc.) after preparing the suspension membrane structure 730 and the base structure 710 respectively, or depositing the suspension membrane structure 730 on the base structure 710 through physical deposition (e.g., a physical vapor deposition) or chemical deposition (e.g., a chemical vapor deposition) during the preparation process. When the relative motion occurs between the vibration unit and the base structure 710, weights of the mass element 740 and the suspension membrane structure 730 are different, and a deformation degree of the region of the suspension membrane structure 730 where the mass element 740 is located or the region of the suspension membrane structure 730 close to the mass element 740 is greater than that of the region of the suspension membrane structure 730 away from the mass element 740. To increase an output sound pressure of the bone conduction sound transmission device 700, the acoustic transducer units 720 may be distributed along a circumference of the mass element 740. In some embodiments, a shape of the acoustic transducer unit 720 may be the same as or different from a shape of the mass element 740. Preferably, the shape of the acoustic transducer unit 720 may be the same as the shape of the mass element 740, so that each position of the acoustic transducer unit 720 may be close to the mass element 740, thereby further improving an output electrical signal of the bone conduction sound transmission device 700. For example, the mass element 740 may be a cylindrical structure, the acoustic transducer unit 720 may be an annular structure, and an inner diameter of the annular acoustic transducer unit 720 may be larger than a radius of the mass element 740, so that the acoustic transducer unit 720 may be arranged along the circumference of the mass element 740. In some embodiments, the acoustic transducer unit 720 may include a first electrode layer, a second electrode layer, and a piezoelectric layer between the first electrode layer and the second electrode layer, and the first electrode layer, the piezoelectric layer, and the second electrode layer may be combined into a structure adapted to the shape of the mass element 740. For example, the mass element 740 is a cylindrical structure, and the acoustic transducer unit 720 is an annular structure. At this time, the first electrode layer, the piezoelectric layer, and the second electrode layer are all annular structures, which are arranged and combined into the annular structure in sequence from top to bottom.

In some embodiments, the acoustic transducer unit 720 and the mass element 740 may be located on different sides of the suspension membrane structure 730, or the same side of the suspension membrane structure 730. For example, both the acoustic transducer unit 720 and the mass element 740 are located on the upper surface or the lower surface of the suspension membrane structure 730, and the acoustic transducer units 720 are distributed along the circumference of the mass element 740. For another example, the acoustic transducer unit 720 is located on the upper surface of the suspension membrane structure 730, and the mass element 740 is located on the lower surface of the suspension membrane structure 730. At this time, a projection of the mass element 740 on the suspension membrane structure 730 is within the region of the acoustic transducer unit 720.

In some embodiments, the output electrical signal of the bone conduction sound transmission device 700 may be improved by changing the size, the shape, and the position of the mass element 740 and the piezoelectric layer. In some embodiments, a sound pressure output effect of the bone conduction sound transmission device 700 may further be improved by changing the shape, the material, and the size of the suspension membrane structure 730. Here, the structures and parameters, etc. of the first electrode layer, the second electrode layer, and the piezoelectric layer of the acoustic transducer unit 720 are similar to those of the first electrode layer 521, the second electrode layer 523, and the piezoelectric layer 522 of the acoustic transducer unit 520 in FIG. 5. The structure and the parameters, etc. of the suspension membrane structure 730 are similar to those of the suspension membrane structure 530, and the structure of the lead structure 7200 is similar to that of the lead structure 5200, which are not repeated here.

Figure 8:
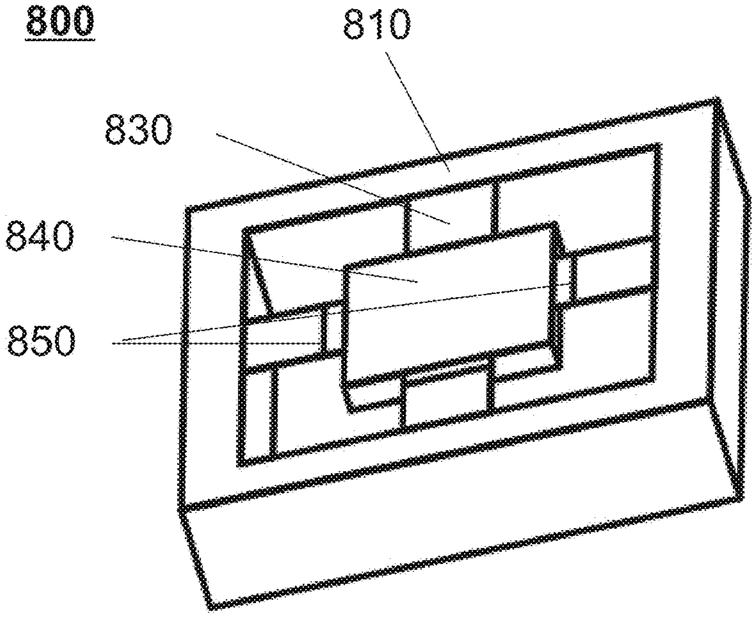
FIG. 8 is a schematic structural diagram illustrating the bone conduction sound transmission device according to some embodiments of the present disclosure.
Figure 9:
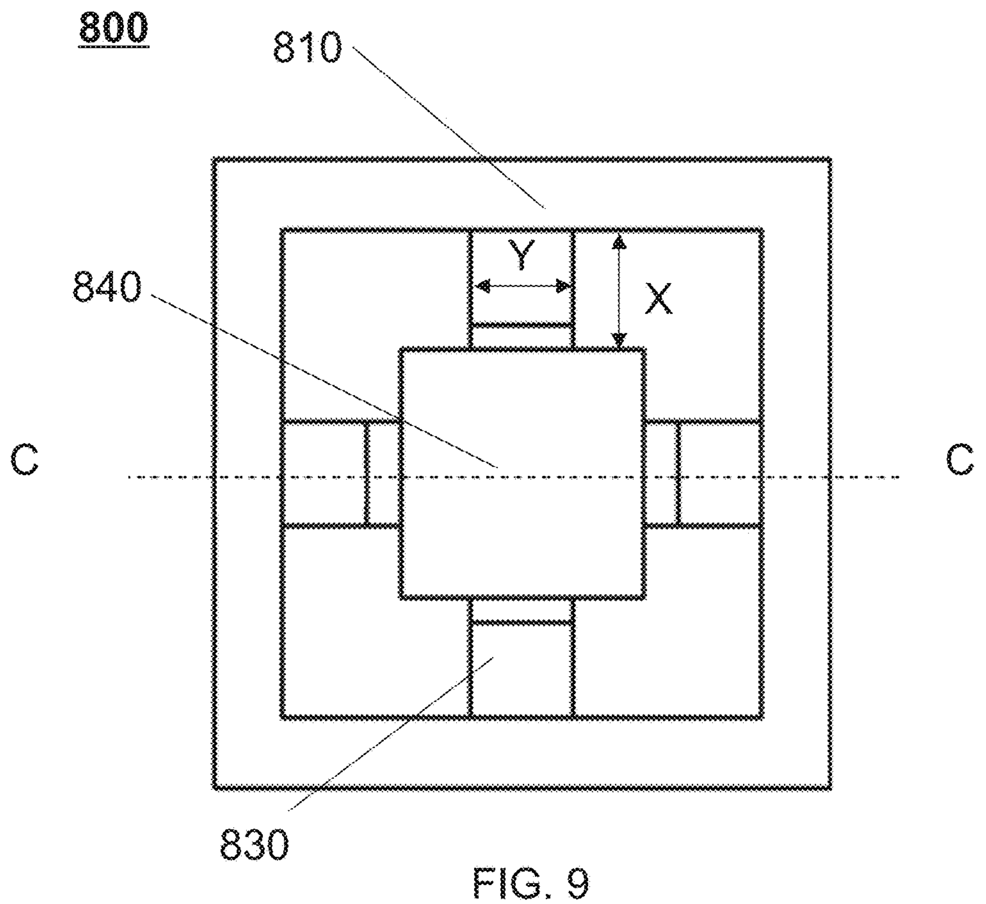
FIG. 9 is a front view of the bone conduction sound transmission device in FIG. 8 according to some embodiments of the present disclosure.
Figure 10:
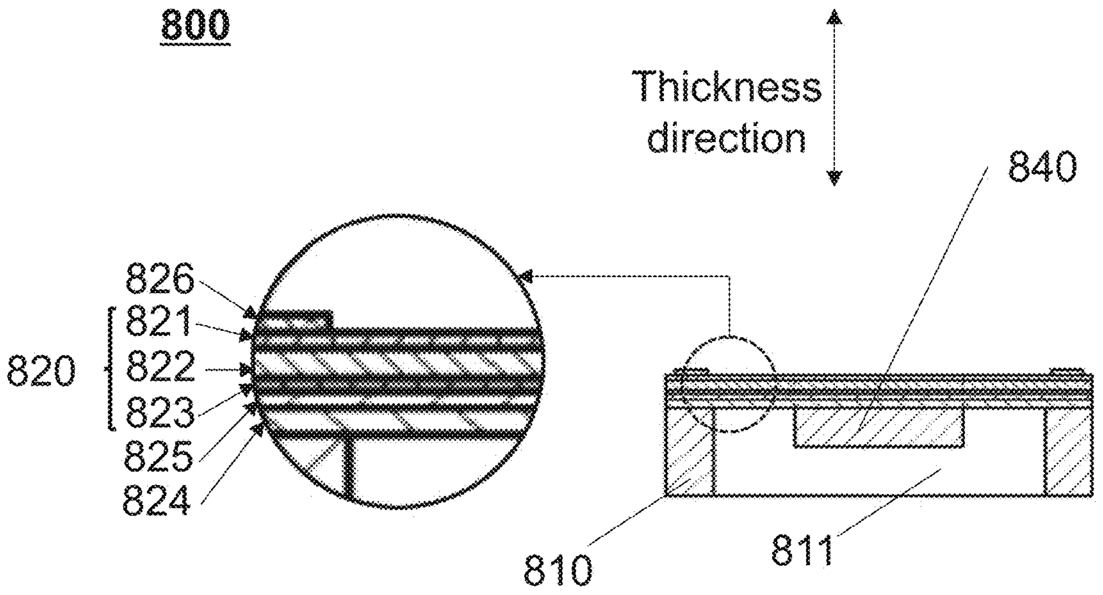
FIG. 10 is a sectional view of the bone conduction sound transmission device in FIG. 9 along a C-C axis according to some embodiments of the present disclosure.

FIG. 8 is a schematic structural diagram illustrating the bone conduction sound transmission device according to some embodiments of the present disclosure. FIG. 9 is a front view of the bone conduction sound transmission device in FIG. 8 according to some embodiments of the present disclosure. FIG. 10 is a sectional view of the bone conduction sound transmission device in FIG. 9 at a C-C axis according to some embodiments of the present disclosure. As shown in FIGS. 8-10, a vibration unit includes at least one support arm 830 and a mass element 840, and the mass element 840 is connected to a base structure 810 through the at least one support arm 830. A number of the support arms 830 may be one, two, four, six, etc. In some embodiments, the connection between the base structure 810 and the support arm 830 and the connection between the mass element 840 and the support arm 830 may be implemented by means of welding or bonding. In some embodiments, the base structure 810 and the support arm 830 may be processed on the same base material (e.g., a silicon substrate) through a micro-nano machining process. Alternatively, the base structure 810, the support arm 830, and the mass element 840 may be processed on one base material (e.g., the silicon substrate) through the micro-nano machining process. In some embodiments, an acoustic transducer unit 820 may be located on an upper surface, a lower surface, or an inside of the at least one support arm 830.

As shown in FIG. 8, the base structure 810 is a rectangular frame structure. In some embodiments, the inside of the base structure 810 may include a hollow part (e.g., a hollow inner cavity 811 as shown in FIG. 10), and the hollow part may be used to accommodate the acoustic transducer unit 820 and the vibration unit. In some embodiments, the base structure 810 may include a frame structure with a hollow inner cavity 811, the support arm 830 and the mass element 840 may be both arranged in the inner cavity 811, one end of the support arm 830 may be connected to the base structure 810, and the other end of the support arm 830 may be connected to the mass element 840. In some embodiments, a shape of a cross section of the hollow part (e.g., the hollow inner cavity 811) perpendicular to a thickness direction (the direction indicated by the arrow in FIG. 10) may be a circle, a quadrangle (e.g., a rectangle, a parallelogram), a pentagon, a hexagon, a heptagon, an octagon and other regular or irregular shapes. In some embodiments, the shape of the cross section of the hollow part perpendicular to the thickness direction may be a rectangular, and a length of any edge of may be within a range of 0.8 mm-2 mm. In some embodiments, the length of any edge may be within a range of 1 mm-1.5 mm. In some embodiments, the shape of the hollow inner cavity 811 of the base structure 810 may correspond to the shape of the mass element 840. For example, when the shape of the cross section of the inner cavity 811 perpendicular to the thickness direction is a rectangle, the shape of the cross section of the mass element 840 perpendicular to the thickness direction may also be a rectangle.

In some embodiments, a number of the support arms 830 is two or more, and the two or more support arms 830 are arranged around the mass element 840. For example, the number of the support arms 830 may be two, three, four, six, seven, etc. In some embodiments, the shape of the cross section of the mass element 840 perpendicular to the thickness direction is polygon, and the number of the support arms 830 corresponds to the number of edges of the polygon. For example, the number of the support arms 830 may be equal to the number of the edges of the polygon. For another example, the number of the support arms 830 may be several times (such as twice, three times, five times, etc.) of the number of edges of the polygon. As an example only, when the shape of the cross section of the mass element 840 perpendicular to the thickness direction is a quadrangle, the number of the support arms 830 may be four. The four support arms 830 may be respectively connected to the four edges of the quadrangle. Alternatively, when the shape of cross section of the mass element 840 perpendicular to the thickness direction is a quadrangle, the number of the support arms 830 may be eight, and every two support arms 830 may be connected to one of the four edges of the quadrangle. Through such arranging, the stress on the supporting arm 830 and the mass element 840 may be more evenly. In some embodiments, connections between each support arm 830 and the mass element 840 may be arranged in rotational symmetry related to a center of the mass element 840, so that the stresses on the support arm 830 and the mass element 840 are more evenly.

In some embodiments, the vibration unit may include four support arms 830 and the mass element 840, one end of each of the four support arms 830 may be connected to the upper surface or the lower surface of the base structure 810, or the side wall where the hollow part of the base structure 810 is located, and the other end of each of the four support arms 830 may be connected to the upper surface, the lower surface, or the peripheral side wall of the mass element 840. In some embodiments, the mass element 840 may protrude upward and/or downward relative to the support arm 830. For example, when the ends of the four support arms 830 are connected to the upper surface of the mass element 840, the mass element 840 may protrude downward relative to the support arms 830. For another example, when the ends of the four support arms 830 are connected to the lower surface of the mass element 840, the mass element 840 may protrude upward relative to the support arms 830. For another example, when the ends of the four support arms 830 are connected to the peripheral side wall of the mass element 840, the mass element 840 may protrude upward and downward relative to the support arms 830. In some embodiments, the upper surface of the mass element 840 and the upper surface of the support arm 830 may be basically on the same horizontal plane. In some embodiments, the lower surface of the mass element 840 and the lower surface of the support arm 830 are basically on the same horizontal plane. In some embodiments, the upper surface of the mass element 840 and the upper surface of the support arm 830 may be basically on the same horizontal plane, while the lower surface of the mass element 840 and the lower surface of the support arm 830 may be basically on the same horizontal plane. In some embodiments, the shape of the support arm 830 is a rectangle, that is, the shape of the cross section of the support arm 830 perpendicular to the thickness direction is a rectangle. One of the diagonals of the rectangle is connected to the mass element 840, and the other of the diagonals of the rectangle is connected to the base structure 810.

In some embodiments, as shown in FIG. 9, a length X of the support arm 830 may be within a range of 100 μm-500 μm. In some embodiments, the length X of the support arm 830 may be within a range of 150 μm-350 μm. In some embodiments, a width Y of the support arm 830 may be within a range of 150 μm-400 μm. In some embodiments, the width Y of the support arm 830 may be within a range of 250 μm-350 μm. By designing and adjusting a size of the support arm 830, a stiffness of the support arm 830 may be adjusted, thereby adjusting a resonant frequency of the bone conduction sound transmission device 800.

Furthermore, the bone conduction sound transmission device 800 may include the acoustic transducer unit 820. As shown in FIG. 10, the acoustic transducer unit 820 may include a first electrode layer 821, a first piezoelectric layer 822, and a second electrode layer 823 arranged in sequence from top to bottom, and the first electrode layer 821 or the second electrode layer 823 may be connected to the upper surface or the lower surface of the support arm 830 (e.g., the elastic layer 824). For example, the upper surface of the first electrode layer 821 may be connected to the lower surface of the support arm 830, or the lower surface of the second electrode layer 823 may be connected to the upper surface of the support arm 830. The first piezoelectric layer 822 may generate a voltage (a potential difference) under a deformation stress of the vibration unit (e.g., the support arm 830 and the mass element 840) based on a piezoelectric effect, and the first electrode layer 821 and the second electrode layer 823 may export the voltage (an electrical signal). To make the resonance frequency of the bone conduction sound transmission device 800 within a specific frequency range (e.g., a range of 2000 Hz-5000 Hz), materials and thicknesses of the acoustic transducer unit 820 (e.g., the first electrode layer 821, the second electrode layer 823, and the first piezoelectric layer 822) and the vibration unit (e.g., support arm 830) may be adjusted.

In some embodiments, the thickness of the first electrode layer 821 may be within a range of 80 nm-250 nm. In some embodiments, the thickness of the first electrode layer 821 may be within a range of 100 nm-150 nm. In some embodiments, the thickness of the second electrode layer 823 may be within a range of 80 nm-250 nm. In some embodiments, the thickness of the second electrode layer 823 may be within a range of 100 nm-200 nm. In some embodiments, the thickness of the first piezoelectric layer 822 may be within a range of 0.8 μm-2 μm. In some embodiments, the thickness of the first piezoelectric layer 822 may be within a range of 0.8 μm-1.5 μm. By designing and adjusting the thicknesses of the first electrode layer 821, the first piezoelectric layer 822, and the second electrode layer 823, the deformation stress that the first piezoelectric layer 822 is subjected to during the vibration of the bone conduction sound transmission device 800 may be adjusted, so that the first piezoelectric layer 822 may be subjected to a larger deformation stress, thereby making the acoustic transducer unit 820 generate a larger electrical signal.

In some embodiments, the material of the first electrode layer 821 and the second electrode layer 823 may be one or a combination of metal materials commonly used in semiconductors such as Mo, Cu, Al, Ti, Au, etc. In some embodiments, the material of the first piezoelectric layer 822 may be aluminum nitride (AlN), lead zirconate titanate piezoelectric ceramic (PZT), polyvinylidene fluoride (PVDF), zinc oxide (ZnO), etc. In some embodiments, the structure of the bone conduction sound transmission device 800 may be prepared on the base material (such as a silicon wafer) according to required functions of the bone conduction sound transmission device 800 by using a micro-nano processing technology. For example, the second electrode layer 823 may be prepared on the base material by an electron beam evaporation or a magnetron sputtering of physical vapor deposition (PVD). Then, the first piezoelectric layer 822 may be prepared on the second electrode layer 823 by the electron beam evaporation or the magnetron sputtering of PVD. Finally, the first electrode layer 821 may be prepared on the first piezoelectric layer 822 again by the electron beam evaporation or the magnetron sputtering of PVD. In some embodiments, an etching barrier layer may be prepared on the base material (e.g., before preparing the second electrode layer 823), and the etching barrier layer may facilitate a precise control of a size of the electrode layer (such as the first electrode layer or the second electrode layer). The etching barrier layer may further prevent a subsequent etching process from damaging the base material. Specifically, the etching barrier layer may be prepared on the base material by means of a chemical vapor deposition (CVD) or a thermal oxidation, etc. The thickness of the etching barrier layer may be within a range of 100 nm-2 μm. In some embodiments, the thickness of the etching barrier layer may be within a range of 300 nm-1 μm.

In some embodiments, the area of the first electrode layer 821, the first piezoelectric layer 822, and/or the second electrode layer 823 are less than or equal to the area of the support arm 830, and a part and/or all of the first electrode layer 821, the first piezoelectric layer 822, the second electrode layer 823 cover the upper surface or the lower surface of the at least one support arm 830. In some embodiments, when the first piezoelectric layer 822 is located between the first electrode layer 821 and the support arm 830 (e.g., when the first electrode layer 821 and the first piezoelectric layer 822 are arranged on the upper surface of the support arm from top to bottom, or when the first electrode layer 821 and the first piezoelectric layer 822 are arranged on the lower surface of the support arm from bottom to top), the area of the first electrode layer 821 is less than or equal to the area of the first piezoelectric layer 822, and the entire region of the first electrode layer 821 is located on the surface of the first piezoelectric layer 822. In other embodiments, the area of the first electrode layer 821 may be equal to the area of the first piezoelectric layer 822.

In some embodiments, the first electrode layer 821, the first piezoelectric layer 822, and the second electrode layer 823 of the acoustic transducer unit 820 are located at one end of the mass element 840 connecting the support arm 830. In some embodiments, the first electrode layer 821, the first piezoelectric layer 822, and the second electrode layer 823 of the acoustic transducer unit 820 are located at one end of the support arm 830 connecting the base structure 810. In some embodiments, the first electrode layer 821, the first piezoelectric layer 822, and the second electrode layer 823 of the acoustic transducer unit 820 are located at the end of the mass element 840 connecting the support arm 830, while the first electrode layer 821, the first piezoelectric layer 822, and the second electrode layer 823 of the acoustic transducer unit 820 are also located at one end of the support arm 830 connecting the base structure 810. The end of the mass element 840 connecting the support arm 830 and the end of the support arm 830 connecting the base structure 810 have a relatively large deformation stress during the vibration of the vibration unit, so the first electrode layer 821, the first piezoelectric layer 822, and the second electrode layer 823 of the acoustic transducer unit 820 are arranged in the end of the mass element 840 connecting the support arm 830 and the end of the support arm 830 connecting the base structure 810 to generate a relatively large electrical signal.

In some embodiments, the mass element 840 may be located on the upper surface or the lower surface of the first electrode layer 821 or the upper surface or the lower surface of the second electrode layer 823. For example, the mass element 840 may be located on the upper surface of the first electrode layer 821, or the mass element 840 may be located on the lower surface of the second electrode layer 823. In other embodiments, the upper surface of the mass element 840 may be flush or substantially flush with the upper surface of the first electrode layer 821. In some embodiments, the lower surface of the mass element 840 may be flush or substantially flush with the lower surface of the second electrode layer 823. In other embodiments, the upper surface of the mass element 840 may be flush or substantially flush with the upper surface of the first electrode layer 821, while the lower surface of the mass element 840 may be flush or substantially flush with the lower surface of the second electrode layer 823.

In some embodiments, as shown in FIG. 10, the acoustic transducer unit 820 may include at least one elastic layer 824. The at least one elastic layer 824 may be located on the upper surface and/or the lower surface of the first electrode layer 821 or the upper surface and/or the lower surface of the second electrode layer 823. For example, the at least one elastic layer 824 may be located on the upper surface of the first electrode layer 821, or the elastic layer 824 may be located on the lower surface of the second electrode layer 823. In some embodiments, when the support arm 830 has a plurality of elastic layers 824, the acoustic transducer unit 820 may further be located between the plurality of elastic layers 824. The elastic layer 824 may be deformed during the vibration, the first piezoelectric layer 822 may generate the electrical signal based on the deformation of the elastic layer 824, and the first electrode layer 821 and the second electrode layer 823 may collect the electrical signal. In some embodiments, a thickness of the elastic layer 824 may be within a range of 0.5 μm-10 μm. In some embodiments, a thickness of the elastic layer 824 may be within a range of 2 μm-6 μm. By designing and adjusting the thickness of the elastic layer 824, the deformation stress that the first piezoelectric layer 822 is subjected to in the process of vibration of the bone conduction sound transmission device 800 may be adjusted.

In some embodiments, the thickness of the elastic layer 824 may be 1 time-6 times of the thickness of the first piezoelectric layer 822. In some embodiments, the thickness of the elastic layer 824 may be 1 time-3 times of the thickness of the first piezoelectric layer 822. By setting the thickness of the elastic layer 824, the first piezoelectric layer 822 may be kept away from a neutral layer 831, and the deformation stress that the first piezoelectric layer 822 is subjected to may be increased.

In some embodiments, the elastic layer 824 may be a plate-shaped structure made of semiconductor material. In some embodiments, the semiconductor material may include silicon, silicon dioxide, silicon nitride, gallium nitride, zinc oxide, silicon carbide, etc. In some embodiments, when the acoustic transducer unit includes two or more elastic layers 824, the materials of different elastic layers 824 may be the same or different. In some embodiments, the elastic layer 824 may be a single-layer structure (e.g., a layer structure made of a single material). The material of the single-layer structure may include but not limited to silicon (Si), silicon dioxide ($SiO_2$), silicon nitride ($SiN_x$), or silicon carbide (SiC), etc. In some embodiments, the elastic layer 824 may further include a multi-layer structure (such as a multi-layer structure composed of multiple materials, the structure of each layer may be made of a single material). For example, the multi-layer structure may be made of a combined material of silicon and silicon dioxide, a combined material of silicon and silicon nitride, etc. In some embodiments, one or more layers of the elastic layers 824 may be prepared on the etching barrier layer or the base material by the CVD or the PVD.

In some embodiments, the acoustic transducer unit 820 may further include a wire bound electrode layer 826 (PAD layer), and the wire bound electrode layer 826 may be located on the first electrode layer 821 and the second electrode layer 823. Through an external wire (e.g., a gold wire, an aluminum wire, etc.), the first electrode layer 821 and the second electrode layer 823 may be connected to an external circuit, thereby leading piezoelectric signal between the first electrode layer 821 and the second electrode layer 823 to a back-end processing circuit. In some embodiments, the material of the wire bound electrode layer 826 may include copper foil, titanium, copper, etc. In some embodiments, the thickness of the wire bound electrode layer 826 may be within a range of 100 nm-200 nm. In some embodiments, the thickness of the wire bound electrode layer 826 may be within a range of 150 nm-200 nm. By designing and adjusting a thickness of the wire bound electrode layer 826, the deformation stress that the first piezoelectric layer 822 is subjected to during the vibration of the bone conduction sound transmission device 800 may be adjusted.

In some embodiments, the wire bound electrode layer 826 is arranged on the base structure 810. For example, the wire bound electrode layer 826 may be arranged on the upper surface or the lower surface of the base structure 810. The wire bound electrode layer 826 may be used to lead out the electrical signal from the base structure 810. In some embodiments, the electrical signal may be guided onto the base structure 810 from the first electrode layer 821 or the second electrode layer 823 by an electrode lead 860. The wire bound electrode layer 826 may be prepared by a metal LIFT-OFF process or a preparation process such as deposition before etching. The wire bound electrode layer 826 may be prepared after the first electrode layer 821, the first piezoelectric layer 822, and the second electrode layer 823 are all prepared.

In some embodiments, the acoustic transducer unit 820 may further include a first seed layer 825. In some embodiments, the first seed layer 825 may be located between the second electrode layer 823 and the support arm 830. In some embodiments, the first seed layer 825 may be located between the elastic layer 824 and the first electrode layer 821 or between the elastic layer 824 and the second electrode layer 823. In some embodiments, the material of the first seed layer 825 may be the same as that of the first piezoelectric layer 822. For example, when the material of the first piezoelectric layer 822 is AlN, the material of the first seed layer 825 may be also AlN. In some embodiments, the material of the first seed layer 825 may further be different from that of the first piezoelectric layer 822. It should be noted that the resonant frequency of the above bone conduction sound transmission device 800 is not limited to the range of 2000 Hz-5000 Hz, but may further be within a range of 4000 Hz-5000 Hz or 2300 Hz-3300 Hz, etc. The specific range of the resonant frequency may be adjusted according to an actual condition. In addition, when the mass element 840 protrudes upward relative to the support arm 830, the acoustic transducer unit 820 may be located on the lower surface of the support arm 830, and the first seed layer 825 may be located between the mass element 840 and the support arm 830. In some embodiments, the thickness of the first seed layer 825 may be within a range of 10 nm-120 nm. In some embodiments, the thickness of the first seed layer 825 may be within a range of 40 nm-80 nm. By designing and adjusting the thickness of the first seed layer 825, the deformation stress that the first piezoelectric layer 822 is subjected to during the vibration of the bone conduction sound transmission device 800 may be adjusted.

By arranging the first seed layer 825, a good growth surface structure may be provided for the other layers. For example, it may be difficult for the elastic layer 824 to be stably attached to the electrode layer (the first electrode layer 821 or the second electrode layer 823). Therefore, the first seed layer 825 may be attached to the electrode layer (the first electrode layer 821 or the second electrode layer 823), and then the elastic layer 824 may be attached to the first seed layer 825 to achieve stable connection between the layers. In some embodiments, the first seed layer 825 may be prepared on the upper surface of the elastic layer 824. The first seed layer 825 may be prepared by methods such as the CVD or the PVD.

In some embodiments, the elastic layer 824 may be arranged between the support arm 830 and the first electrode layer 821, and the first seed layer 825 may be arranged between the elastic layer 824 and the first electrode layer 821. Alternatively, the elastic layer 824 may be arranged between the support arm 830 and the second electrode layer 823, and the first seed layer 825 may be arranged between the elastic layer 824 and the second electrode layer 823. For example, when the acoustic transducer unit 820 is arranged on the upper surface of the support arm 830, the elastic layer 824, the first seed layer 825, the second electrode layer 823, the first piezoelectric layer 822, and the first electrode layer 821 may be arranged in sequence from bottom to top. Alternatively, when the acoustic transducer unit 820 is arranged on the lower surface of the support arm 830, the elastic layer 824, the first seed layer 825, the first electrode layer 821, the first piezoelectric layer 822, and the second electrode layer 823 may be arranged in sequence from top to bottom. Through such setting, a larger electrical signal may be generated, and the connection between the layers of the acoustic transducer unit 820 is stable.

Figure 11:
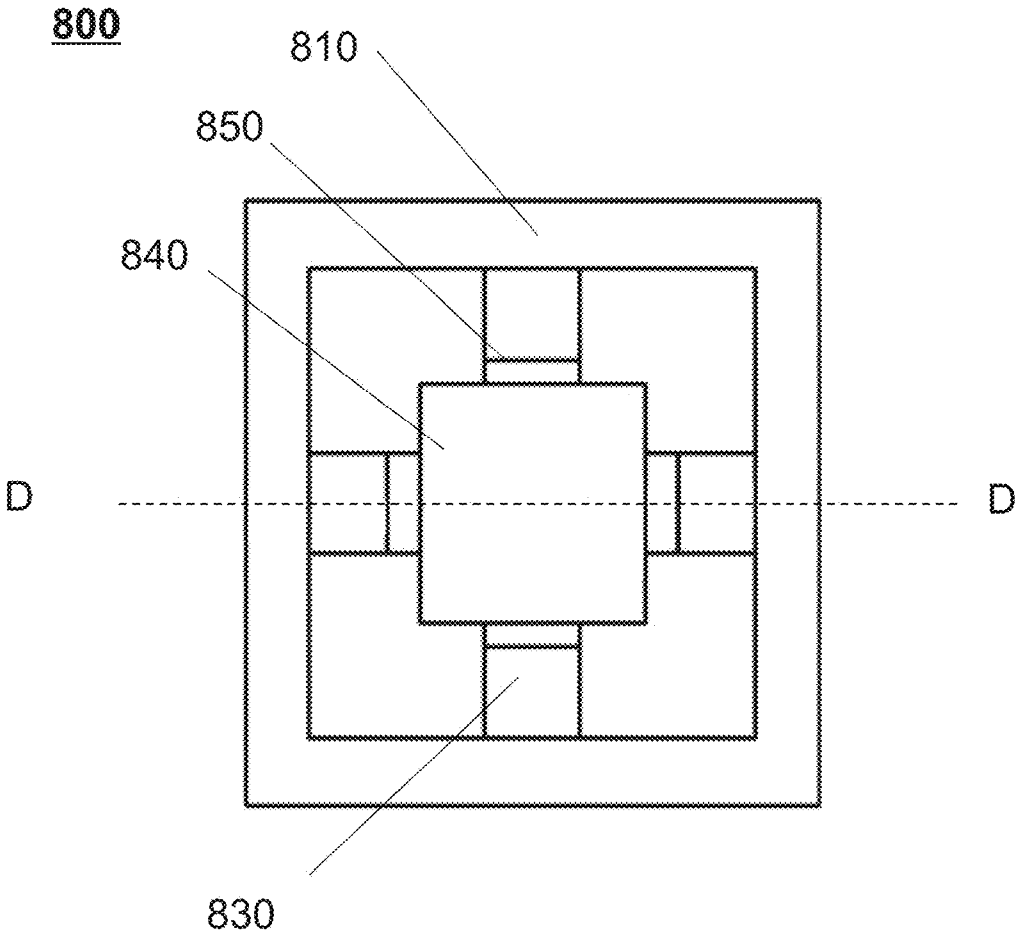
FIG. 11 is a front view of the bone conduction sound transmission device in FIG. 8 at a vibration state according to some embodiments of the present disclosure.
Figure 12:
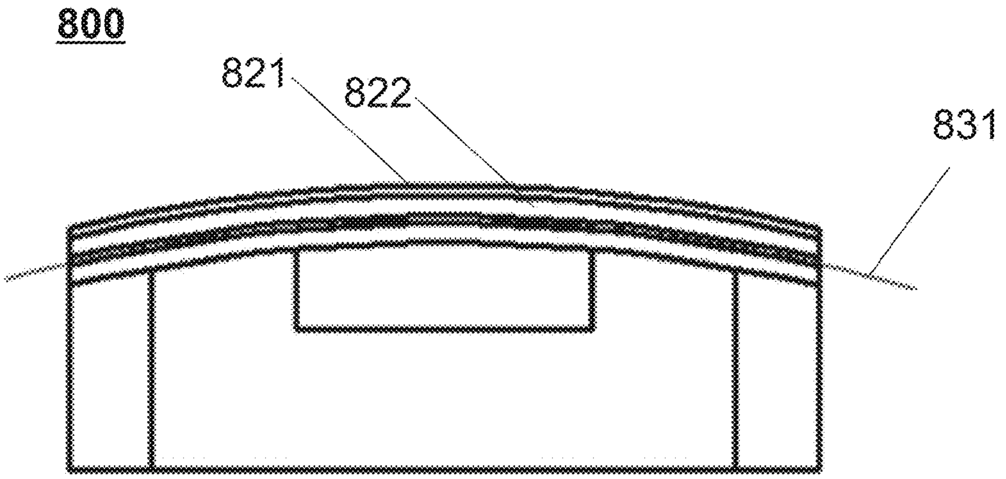
FIG. 12 is a sectional view at DD of the bone conduction sound transmission device according to FIG. 11.

FIG. 11 is a front view of the bone conduction sound transmission device in FIG. 8 at a vibration state according to some embodiments of the present disclosure. FIG. 12 is a sectional view of the bone conduction sound transmission device in FIG. 11 along a D-D axis according to some embodiments of the present disclosure. As shown in FIGS. 11 and 12, a vibration unit (e.g., the support arm 830) of the bone conduction sound transmission device 800 has the neutral layer 831 when it is strained, and a deformation stress of the neutral layer 831 is zero when the support arm 830 is deformed. That is to say, the neutral layer 831 is a position layer where the deformation stress of the support arm 830 is zero when the support arm 830 is deformed. The electrical signal output by a piezoelectric material (i.e., the first piezoelectric layer 822) may be related to the stress, and a thickness of each layer in a thickness direction may affect a stress distribution of each layer under the same vibration signal. As the neutral layer 831 is the position layer where the deformation stress is zero, during the deformation process of the support arm 830, the deformation stress of the position closer to the neutral layer 831 in the thickness direction is smaller.

Based on the foregoing contents, in the embodiments provided by the present disclosure, the first piezoelectric layer 822 and the neutral layer 831 may not overlap by designing the thicknesses and a connection sequence of the elastic layer 824 and other layer structures, thereby ensuring that the first piezoelectric layer 822 may be subjected to the deformation stress, so that the first piezoelectric layer 822 may interact with the first electrode layer 821 and/or the second electrode layer 823 to generate the electrical signals. Further, through the thickness design of each layer in the embodiment of the embodiments of the disclosure, the first piezoelectric layer 822 may be as far away from the neutral layer 831 as possible, so that the deformation of the first piezoelectric layer 822 may be as large as possible, thereby making the output electrical signal as large as possible, so as to make the sensitivity of the bone conduction sound transmission device as large as possible.

In some embodiments, the mass element 840 may be a single-layer structure or a multi-layer structure. In some embodiments, the mass element 840 may be a multi-layer structure, and the number of layers of the mass element 840 and the material and parameter corresponding to each layer structure may be the same as or different from those of the elastic layer 824 of the support arm 830 and the acoustic transducer unit 820. In some embodiments, the shape of the mass element 840 may be a circle, a semicircle, an ellipse, a triangle, a quadrangle, a pentagon, a hexagon, a heptagon, an octagon, or other regular or irregular shapes. In some embodiments, the thickness of the mass element 840 may be the same as or different from a total thickness of the support arm 830 and the acoustic transducer unit 820. Regarding material and size of the mass element 840 as a multi-layer structure, please refer to the acoustic transducer unit 820, which is not repeated here. In addition, the material and parameter of each layer structure of the acoustic transducer unit 820 may further be applied to the bone conduction sound transmission devices shown in FIGS. 1, 3, 4, 5, and 7.

In some embodiments, the mass element 840 may include a third electrode layer, a second piezoelectric layer, and a fourth electrode layer arranged sequentially from bottom to top. The material, function, and preparation method of the third electrode layer may be similar to those of the first electrode layer 821, the material, function, and the preparation method of the second piezoelectric layer may be similar to those of the first piezoelectric layer 822, and the material, the function, and the preparation method of the fourth electrode layer may be similar to those of the second electrode layer 823, which are not repeated here. In some embodiments, the mass element 840 may further include a base layer. The base layer may load the third electrode layer, the second piezoelectric layer, and the fourth electrode layer, which may increase a weight of the mass element 840 to improve an inertia of the mass element 840, thereby improving the sensitivity of the bone conduction sound transmission device 800. In some embodiments, the mass element 840 further includes a second seed layer arranged between the base layer and the third electrode layer. The material, the function, and the preparation method of the second seed layer are similar to those of the first seed layer 825, which are not repeated here. In some embodiments, a thickness of the base layer may be within a range of 20 μm-400 μm. In some embodiments, the thickness of the base layer may be within a range of 300 μm-400 μm. In some embodiments, the thickness of the base layer may be within a range of 200 μm-300 μm.

In some embodiments, the shape of the cross section of the mass element 840 perpendicular to the thickness direction is a quadrangle. In some embodiments, the shape of the cross section of the mass element 840 perpendicular to the thickness direction is a rectangle. In some embodiments, a length of at least one edge of the rectangle may be within a range of 600 μm-1200 μm. In some embodiments, the length of the at least one edge of the rectangle may be within a range of 750 μm-1050 μm.

In some embodiments, the mass element 840 and the acoustic transducer unit 820 on the support arm 830 may be prepared on different base materials (such as different silicon wafers), or may be prepared on the same base material. When the mass element 840 and the acoustic transducer unit 820 on the support arm 830 are prepared on different base materials, the mass element 840 may be prepared on the base material through photolithography, etching and other processes. Then, a wafer-level bonding may be performed on the silicon base material including the prepared mass element 840 and the base material including the prepared support arm 830 and the prepared base structure 810. In some embodiments, a bonding region may be a region of the mass element 840. In some embodiments, the bonding region may include the region of the mass element 840 and a partial region of the base structure 810. In some embodiments, the area of the bonding region on the base structure 810 may account for 10%-90% of the area of the cross section of the base structure 810 perpendicular to the thickness direction. In some embodiments, a wafer thinning process may be used to remove an excess material on the base material where the mass element 840 is located, and the excess material does not include the mass element 840. In some embodiments, the mass element 840 may be further prepared on the base material for preparing the support arm 830. Specifically, on the other side of the base material for the preparation of the support arm 830 (the side opposite to the side of preparation of the support arm 830), operations such as gluing, photolithography and development process may be performed, and then a deep silicon etching process may be performed to etch to a certain depth. After that, the deep silicon etching process may further be performed to etch out the mass element 840.

In some embodiments, the acoustic transducer unit 820 may include at least an effective acoustic transducer unit. The effective acoustic transducer unit refers to a partial structure of the acoustic transducer unit that ultimately contributes the electrical signal. In some embodiments, the effective acoustic transducer unit may include an overlapping region of the first electrode layer 821, the first piezoelectric layer 822, and the second electrode layer 823. For example, the first electrode layer 821, the first piezoelectric layer 822, and the second electrode layer 823 have the same shape and area, and partially cover the support arm 830 (or the elastic layer 824), then the first electrode layer 821, the first piezoelectric layer 822, and the second electrical layer 823 are effective acoustic transducer units. For another example, the first electrode layer 821 and the first piezoelectric layer 822 partially cover the support arm 830, and the second electrode layer 823 completely covers the support arm 830, then the first electrode layer 821, the first piezoelectric layer 822, and the part in the second electrode layer 823 corresponding to the first electrode layer 821 constitute the effective acoustic transducer unit. For another example, the first electrode layer 821 partially covers the support arm 830, both the first piezoelectric layer 822 and the second electrode layer 823 completely cover the support arm 830, then the first electrode layer 821, the part of the first piezoelectric layer 822 corresponding to the first electrode layer 821, and the part of the second electrode layer 823 corresponding to the first electrode layer 821 constitute an effective acoustic transducer unit. For another example, the first electrode layer 821, the first piezoelectric layer 822, and the second electrode layer 823 completely cover the support arm 830, but the first electrode layer 821 is divided into a plurality of independent electrodes by arranging insulated trenches (e.g., the electrode insulating channel 850), then the independent electrode part of the first electrode layer 821 that leads out electrical signal, the corresponding part of the first piezoelectric layer 822, and the second electrode layer 823 are effective transducer units. The independent electrode region in the first electrode layer 821 that does not lead out the electrical signal, and the region of the piezoelectric layer 822 and the second electrode layer 823 corresponding to the independent electrode in the first electrode layer 821 that does not lead out the electrical signal and the insulated trenches may not provide the electrical signal, and may mainly provide a mechanical effect. In order to improve the SNR of the bone conduction sound transmission device 800, the effective acoustic transducer unit may be arranged at a position of the support arm 830 close to the mass element 840 or close to the connection between the support arm 830 and the base structure 810. In some embodiments, the effective acoustic transducer unit may be arranged on the support arm 830 close to the mass element 840. In some embodiments, when the effective acoustic transducer unit is arranged on the support arm 830 close to the mass element 840 or close to the connection between the support arm 830 and the base structure 810, the ratio of a cover area of the effective acoustic transducer unit at the support arm 830 to the area of the support arm 830 (the area of the cross section of the support arm 830 perpendicular to the thickness direction) may be within a range of 5%-40%. In some embodiments, the ratio of a cover area of the effective acoustic transducer unit at the support arm 830 to the area of the support arm 830 (the area of the cross section of the support arm 830 perpendicular to the thickness direction) may be within a range of 25%-40%. Further, in some embodiments, the ratio between a cover area of the effective acoustic transducer unit at the support arm 830 to the area of the support arm 830 (the area of the cross section of the support arm 830 perpendicular to the thickness direction) may be within a range of 30%-35%.

The SNR refers to the ratio of the signal to the noise in an electronic device or an electronic system. In the bone conduction sound transmission device, the greater the SNR is, the greater the electrical signal intensity of the bone conduction sound transmission device is and the lower the noise is, and the better the effect of the bone conduction sound transmission device is. Therefore, the SNR is a very important parameter in the design process of the bone conduction sound transmission device. In some embodiments, the SNR and the sensitivity $v_s$ of the bone conduction sound transmission device are correlated with a background noise $v_{ntrms}$ of the bone conduction sound transmission device. In some embodiments, the SNR is positively correlated with the sensitivity $v_s$ of the bone conduction sound transmission device, and the SNR is negatively correlated with the background noise $v_{ntrms}$ of the bone conduction sound transmission device. In some embodiments, the SNR is positively correlated with $$Lg\left(\frac{v_s}{v_{ntrms}}\right).$$

In some embodiments, the SNR of the bone conduction sound transmission device may be calculated according to the following formula (2):

$$SNR = 20 \times Lg\left(\frac{v_s}{v_{ntrms}}\right). \tag{2}$$

Where $v_s$ denotes the sensitivity of the bone conduction sound transmission device, which is related to a piezoelectric constant and an internal stress of the piezoelectric layer (e.g., the first piezoelectric layer 822). The piezoelectric constant is related to the material of the piezoelectric layer, and the internal stress of the piezoelectric layer is related to a structure and an external load of the bone conduction sound transmission device. In some embodiments, after the model is established, the sensitivity $v_s$ of the different bone conduction sound transmission devices under corresponding external loads may be solved by a finite element numerical calculation method. $v_{ntrms}$ denotes the background noise of the bone conduction sound transmission device, which may be determined by parameters such as a background noise $v_{narms}$ of an amplifying circuit (ASIC) and the background noise $v_{nsrms}$ of the transducer (acoustic transducer unit). The background noise $v_{ntrms}$ of the bone conduction sound transmission device is positively correlated with the background noise $v_{narms}$ of the ASIC and the background noise $v_{nsrms}$ of the transducer. $v_{narms}$ denotes the background noise of the ASIC, which may be calculated during the design process of the amplifying circuit or obtained from the manufacturer. In some embodiments, the background noise $v_{ntrms}$ of the bone conduction sound transmission device may be correlated to parameters such as a Boltzmann's constant $\kappa_B$, a Fahrenheit temperature T, an electrostatic force constant k, a dielectric loss of the piezoelectric layer (e.g., the first piezoelectric layer 822) tan δ, a dielectric constant of the piezoelectric layer (e.g., the first piezoelectric layer 822) $\varepsilon_r$, the thickness d of the piezoelectric layer (e.g., the first piezoelectric layer 822), the area S of the effective acoustic transducer unit of the bone conduction sound transmission device, a low frequency cutoff frequency $f_0$ of the background noise of the bone conduction sound transmission device, and a high frequency cutoff frequency $f_1$ of the background noise of the bone conduction sound transmission device, etc.

In some embodiments, the background noise $v_{ntrms}$ of the bone conduction sound transmission device may be positively correlated to parameters such as the Boltzmann constant $\kappa_B$, the Fahrenheit temperature T, the electrostatic force constant k, the dielectric constant $\varepsilon_r$ of the piezoelectric layer (e.g., the first piezoelectric layer 822), the thickness d of the piezoelectric layer (e.g., the first piezoelectric layer 822), and the high frequency cutoff frequency $f_1$ of the background noise of the bone conduction sound transmission device. The background noise $v_{ntrms}$ of the bone conduction sound transmission device may be negatively correlated to the area S of the effective acoustic transducer unit of the bone conduction sound transmission device, the low frequency cutoff frequency $f_0$ of the background noise of the bone conduction sound transmission device, and the dielectric loss tan δ of the piezoelectric layer (e.g., the first piezoelectric layer 822). In some embodiments, the background noise $v_{ntrms}$ of the bone conduction sound transmission device may be calculated by the following formula (3):

$$v_{ntrms}=f(v_{nsrms},v_{narms})=f(\kappa_B,T,k,\tan\delta,\varepsilon_r,d,S,f_1,f_0,v_{narms},\text{ASIC gain}) \quad (3).$$

Where ASIC gain denotes a gain of the amplifying circuit, which may be calculated during the design process of the amplifying circuit or obtained from the manufacturer. $\kappa_B$ denotes the Boltzmann constant, T denotes the Fahrenheit temperature, k denotes the electrostatic force constant, tan δ denotes the dielectric loss of the piezoelectric layer (e.g., the first piezoelectric layer 822), $\varepsilon_r$ denotes the dielectric constant of the piezoelectric layer (e.g., the first piezoelectric layer 822), d denotes the thickness of the piezoelectric layer (e.g., the first piezoelectric layer 822), S denotes the area of the effective acoustic transducer unit of the bone conduction sound transmission device, $f_0$ denotes the low frequency cutoff frequency of the background noise of the bone conduction sound transmission device, and $f_1$ denotes the high frequency cutoff frequency of the background noise of the bone conduction sound transmission device.

A formula (4) may be determined for determining the SNR of the bone conduction sound transmission device by substituting the formula (3) into the formula (2):

$$SNR = 20\times Lg\left(\frac{v_s}{v_{ntrms}}\right) = 20\times Lg\left(\frac{v_s}{f(\kappa_B, T, k, \tan\delta, \varepsilon_r, d, S, f_1, f_0, v_{narms}, ASICgain)}\right). \quad (4)$$

For the meaning of each parameter in the formula (4), please refer to the explanations above. In the above formula (4), the dielectric loss tan δ of the piezoelectric material and the dielectric constant tan δ of the piezoelectric material are related to the material of the piezoelectric layer (e.g., the first piezoelectric layer 822). It may be seen from the above formula (4) that the SNR is related to factors including the area of the effective acoustic transducer unit, the thickness of the piezoelectric layer (e.g., the first piezoelectric layer 822), the material of the piezoelectric layer (e.g., the first piezoelectric layer 822), the sensitivity (which is affected by the material and the structure of the bone conduction sound transmission device), etc.

According to the formula for solving the SNR of the bone conduction sound transmission device proposed in the present disclosure, the materials of the electrode layer (the first electrode layer 821 and the second electrode layer 823), the piezoelectric layer (the first piezoelectric layer 822 and the second electrode layer 823), the elastic layer 824, and the mass element 840, etc. as well as the structure of the bone conduction sound transmission device are respectively designed, so that design schemes may meet the requirements of the range of the resonant frequency $f_0$, while the SNR of the bone conduction sound transmission device may be maximized. For example, the structure of the support arm and the mass element (or the structure of the cantilever beam, the structure of the perforated suspended film, the structure of the suspended film and the mass element, etc.) may be designed, and the sizes of the different components of the bone conduction sound transmission device (e.g., the lengths, the widths, the thicknesses of the support arm 830 and the mass element 840, etc., and the area of the effective acoustic transducer unit, etc.) may be designed. As an example only, in the structure of the support arm and the mass element, the stiffness of the support arm 830 and the mass of the mass element 840 may be adjusted by designing the materials and the sizes of each part of the acoustic transducer unit 820, the support arm 830, and the mass element 840, so that a stress concentration may occur at the support arm 830. The stress concentration at the support arm 830 may enhance an output electrical signal of the bone conduction sound transmission device, thereby maximizing an output sensitivity and the SNR of the bone conduction sound transmission device. In the above design process, to ensure a better reliability of the design of the bone conduction sound transmission device, the SNR may be adjusted by adjusting the materials, the structures and the sizes of different components, so that the SNR is less than the maximum SNR. For example, the SNR may be designed to be 80%-100% of the maximize SNR, the SNR may be designed to be 50%-100% of the maximize SNR, and the SNR may be designed to be 20%-100% of the maximize SNR.

The smaller the cover area of the effective acoustic transducer unit at the support arm 830 is, the greater the finally generated electrical signal intensity is. However, a reduction of the area of the effective acoustic transducer unit may reduce its capacitance, resulting in an increase of the finally output noise. By setting the ratio of the cover area of the effective acoustic transducer unit at the support arm 830 to the area of the support arm 830 (the area of the cross section of the support arm 830 perpendicular to the thickness direction) as the above ratio (e.g., 25%-40%), the electric signal generated by the effective acoustic transducer unit may have strong intensity with less noise, so that the sound transmission effect of the bone conduction sound transmission device 800 is better.

Figure 13:
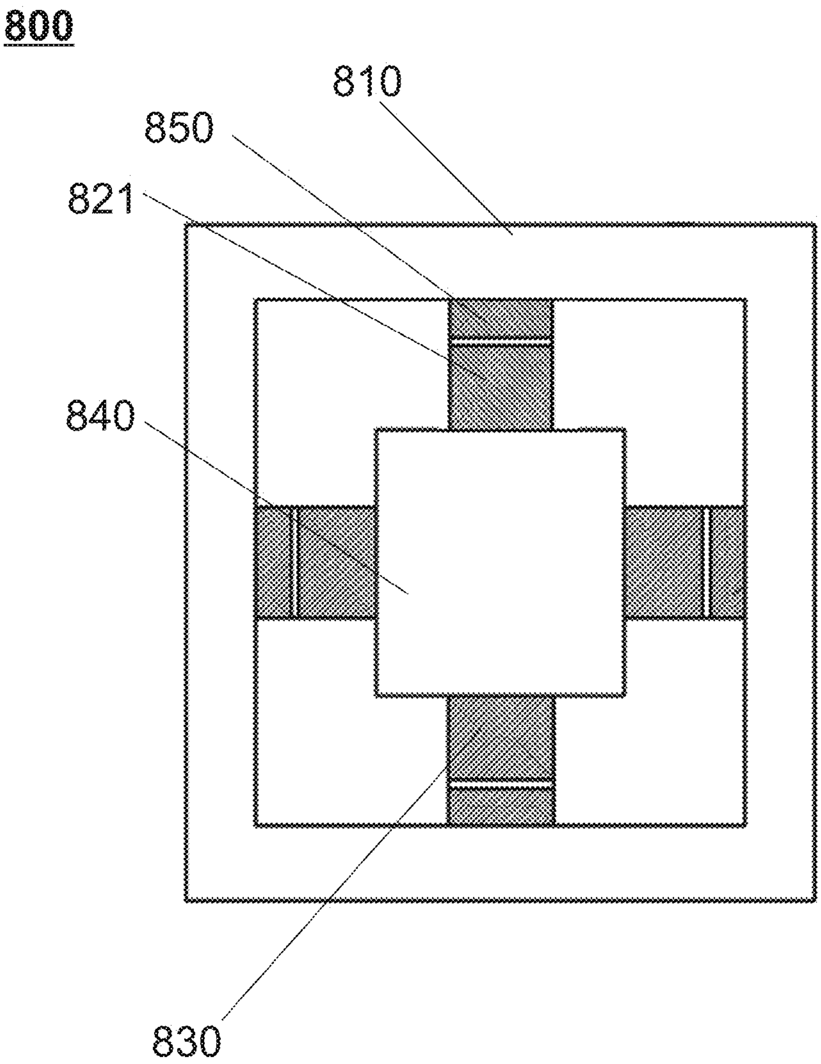
FIG. 13 is a schematic structural diagram illustrating the bone conduction sound transmission device in FIG. 8 according to some embodiments of the present disclosure.
Figure 14:
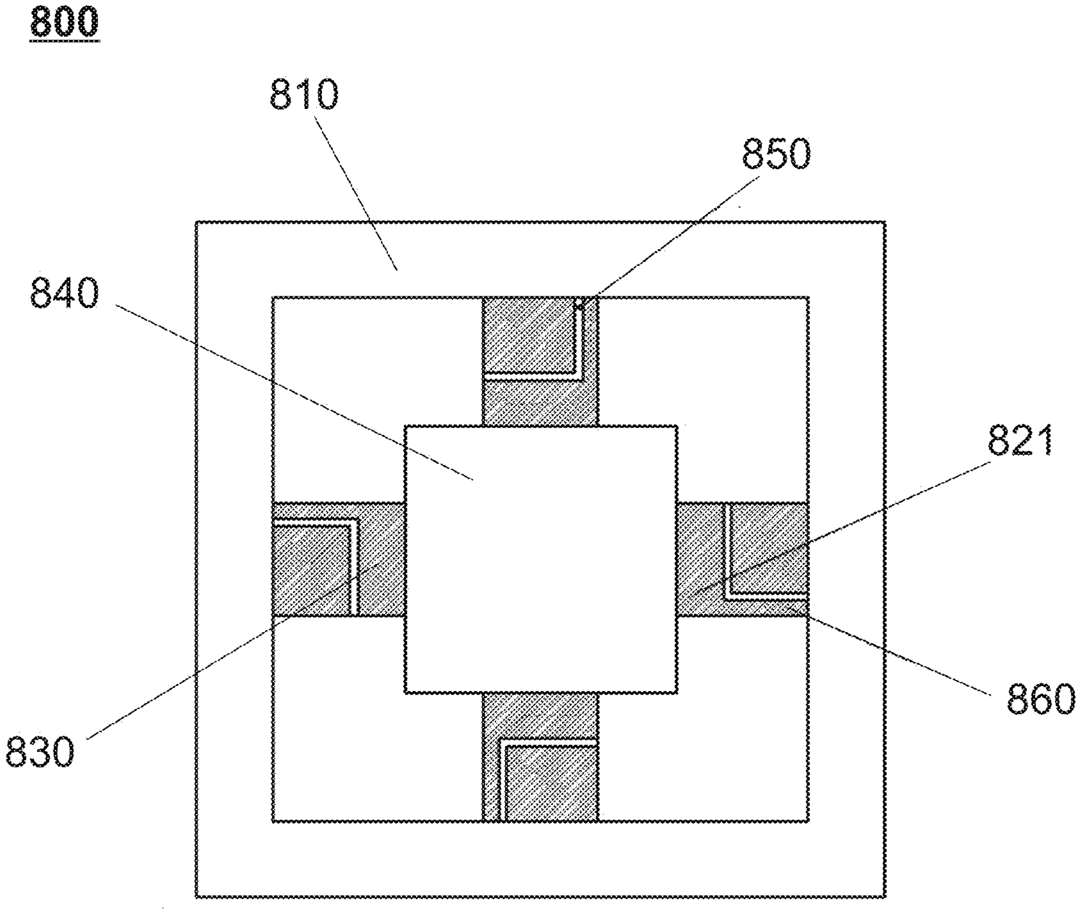
FIG. 14 is another schematic structural diagram illustrating the bone conduction sound transmission device in FIG. 8 according to some embodiments of the present disclosure.

The SNR of the bone conduction sound transmission device 800 is positively correlated with the output electrical signal intensity. When the relative motion occurs between the laminated structure and the base structure 810, the deformation stresses at the connection between the support arm 830 and the mass element 840 and the connection between the support arm 830 and the base structure 810 are larger than the deformation stress in the middle region of the support arm 830. Correspondingly, the intensity of the output voltage at the connection between the support arm 830 and the mass element 840 and the connection between the support arm 830 and the base structure 810 are relatively higher than the intensity of the output voltage in the middle region of the support arm 830. In some embodiments, as shown in FIGS. 13 and 14, when the acoustic transducer unit 820 completely or almost completely covers the upper surface or lower surface of the support arm 830, in order to improve the SNR of the bone conduction sound transmission device 800, an electrode insulation trench 850 may be arranged on the first electrode layer 821, and the electrode insulation trench 850 may divide the first electrode layer 821 into two parts (or multiple parts), so that a part of the first electrode layer 821 is close to the mass element 840, and the other part of the electrode layer 821 is close to the connection between the support arm 830 and the base structure 810. Among the two parts of the first electrode layer 821 and the corresponding first piezoelectric layer 822 and the second electrode layer 823 divided by the electrode insulation trench 850, the part from which the electric signal is led out is the effective acoustic transducer unit. In some embodiments, the electrode insulation trench 850 may be a straight line extending along the width direction of the support arm 830. In some embodiments, a width of the electrode insulation trench 850 may be less than 20 μm. In some embodiments, the width of the electrode insulation trench 850 may be within a range of 2 μm-20 μm. In some embodiments, the width of the electrode insulation trench 850 may be within a range of 4 μm-10 μm.

In some embodiments, the electrode insulation trench 850 is arranged on the first electrode layer 821 or the second electrode layer 823. For example, when the acoustic transducer unit 820 is arranged on the upper surface of the support arm 830, the electrode insulation trench 850 may be arranged on the first electrode layer 821; when the acoustic transducer unit 820 is arranged on the lower surface of the support arm 830, the electrode insulation trench 850 may be arranged on the second electrode layer 823. The electrode insulation trench 850 is configured to divide the first electrode layer 821 or the second electrode layer 823 into two or more electrode regions. The number of the divided electrode regions may be two, three, five, etc. The above width design of the electrode insulation trench 850 may ensure that the electrode insulation trench may be processed through the existing processing technology, and at the same time, the influence of the electrode insulation trench 850 on the SNR of the bone conduction sound transmission device may be minimized.

The stress of the support arm 830 from the end connected to the base structure 810 to the end connected to the mass element 840 changes from the tensile stress to the compressive stress, or from the compressive stress to the tensile stress. The electrode layer (e.g., the first electrode layer 821) is distributed on the surface of the piezoelectric layer (e.g., the first piezoelectric layer 822) for charge collection, and the piezoelectric layer (e.g., the first piezoelectric layer 822) is subjected to different stresses at different positions, which may output different charges. In order to maximize the output sensitivity of the bone conduction sound transmission device, the electrode layer (e.g., the first electrode layer 821) may be divided into multiple of electrodes independently covering the surface of the piezoelectric layer (e.g., the first piezoelectric layer) through the electrode insulation trench 850. During the signal collection, a suitable independent partial electrode layer may be selected for the signal output according to the position of each independent partial electrode layer. When designing the electrode insulation trench 850, the area of the support arm 830 covered by the part of the electrode layer that leads out the electrical signal may be as large as possible, so as to obtain a larger output sensitivity and a less background noise of the bone conduction sound transmission device, thereby increasing the SNR.

It should be noted that the electrode insulation trench 850 may not be limited to the straight line extending along the width direction of the support arm 830, but may also be a curve, a bent line, a wavy line, etc. In addition, the electrode insulation trench 850 may not extend along the width direction of the support arm 830, such as the electrode insulation trench 850 shown in FIG. 14, the electrode insulation trench 850 only needs to be able to divide the acoustic transducer unit 820 into multiple parts, which is not further limited here.

As shown in FIG. 14, when the partial structure of the acoustic transducer unit 820 (e.g., the acoustic transducer unit between the electrode insulation trench 850 and the mass element 840 in FIG. 13) is arranged at a position on the support arm 830 close to the mass element 840, the first electrode layer 821 and/or the second electrode layer 823 may further include the electrode lead 860. Taking the first electrode layer 821 as an example, the electrode insulation trench 850 divides the first electrode layer 821 into two parts, one part of the first electrode layer 821 is connected to the mass element 840 or is close to the mass element 840, and the other part of the first electrode layer 821 is close to the connection between the support arm 830 and the base structure 810. In order to output the voltage of the acoustic transducer unit 820 close to the mass element 840, the first electrode layer 821 close to the connection between the support arm 830 and the base structure 810 (the first electrode layer 821 shown in FIG. 14 located at the edge region of the support arm 830) may be divided into a partial region by the electrode insulation trench, and the partial region may be electrically connected to the part of the acoustic transducer unit 820 connected to the mass element 840 or close to the mass element 840 to the processing unit of the bone conduction sound transmission device 800. In some embodiments, a width $L_1$ of the electrode lead 860 may be less than or equal to 20 μm. In some embodiments, the width $L_1$ of the electrode lead 860 may be within a range of 4 μm-20 μm. In some embodiments, the width $L_1$ of the electrode lead 860 may be within a range of 4 μm-10 μm. In some embodiments, the electrode lead 860 may be located at any position in the width direction of the support arm 830, e.g., the electrode lead 860 may be located at the center of the support arm 830 or a position close to the edge of the support arm 830 along the width direction. In some embodiments, the electrode lead 860 may be located the position close to the edge of the support arm 830 in the width direction. A use of a conductive wire in the acoustic transducer unit 820 may be avoided by arranging the electrode lead 860, and at the same time, the structure is relatively simple, which is convenient for the subsequent production and assembly.

In some embodiments, an electrode lead 860 may be arranged on the first electrode layer 821, which is used to connect the electrode region to the base structure 810. In some embodiments, the electrode lead 860 lead the electrical signal generated by the acoustic transducer unit 820 to the base structure 810, and the wire bound electrode layer 826 may further lead out the electrical signal from the base structure 810. Through the design of the width of the electrode lead 860, the electrode region on the support arm 830 may be easily planned, and at the same time, the processing of the electrode lead 860 may be facilitated.

Figure 15:
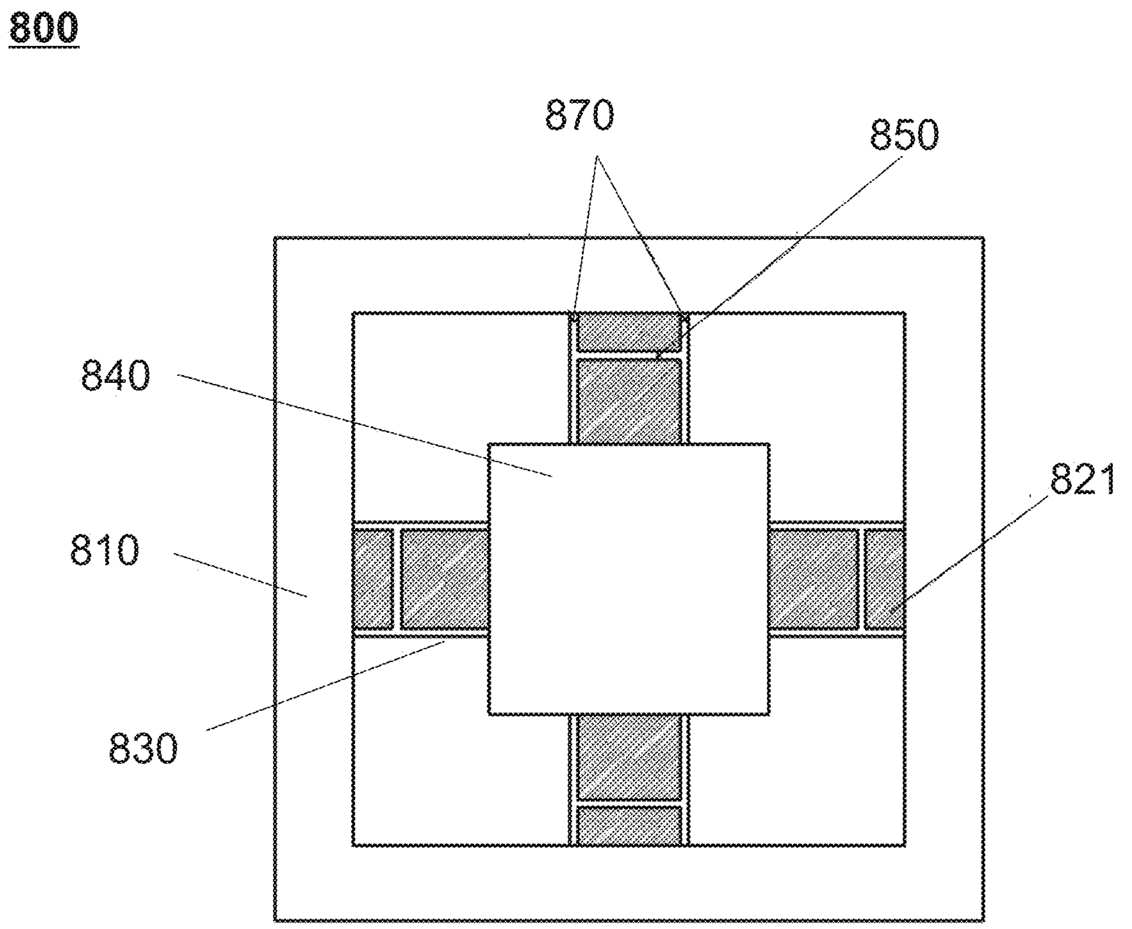
FIG. 15 is another schematic structural diagram illustrating the bone conduction sound transmission device in FIG. 8 according to some embodiments of the present disclosure.

Considering that the piezoelectric material of the first piezoelectric layer 822 may be roughened in the region close to the edge of the support arm 830 due to etching, the quality of the piezoelectric material may be deteriorated. In some embodiments, when the area of the first piezoelectric layer 822 is the same as that of the second electrode layer 823, in order to make that the first electrode layer 821 is located in a piezoelectric material region with better quality, the area of the first electrode layer 821 may be less than the area of the first piezoelectric layer 822, so that the edge region of the electrode layer 821 may avoid the edge region of the first piezoelectric layer 822, and an electrode retraction trench 870 (as shown in FIG. 15) may be formed between the first electrode layer 821 and the first piezoelectric layer 822. By arranging the electrode retraction trench 870, the edge region of the first piezoelectric layer 822 with the poor quality may avoid from the first electrode layer 821 and the second electrode layer 823, thereby improving the SNR of the output of the bone conduction sound transmission device 800. In some embodiments, a width of the electrode retraction trench 870 may be within a range of 2 μm-20 μm. In some embodiments, the width of the electrode retraction trench 870 may be within a range of 2 μm-10 μm.

In some embodiments, the electrode retraction trench 870 may be formed on the edge of the first piezoelectric layer 822. The first electrode layer 821 is located on within the electrode retraction trench 870 on the first piezoelectric layer 822. In some embodiments, the width of the electrode retraction trench 870 may be less than 20 μm. In some embodiments, the width of the electrode retraction trench 870 may be within a range of 2 μm-10 μm. By designing the width of the electrode retraction trench 870, the electrode region on the support arm 830 may be easily planned, and at the same time, the processing of the electrode retraction trench 870 may be facilitated.

In some embodiments, the bone conduction sound transmission device 800 may simultaneously include the structures of the electrode insulation trench 850, the electrode lead 860, and the electrode retraction trench 870 in one or more embodiments of the present disclosure. The electrode insulation trench 850, the electrode lead 860, and the electrode retraction trench 870 may be prepared by etching. For example, the etching may be performed sequentially on the first electrode layer 821, the first piezoelectric layer 822, and the second electrode layer 823. The etching of the first electrode layer 821, the first piezoelectric layer 822, and the second electrode layer 823 may be performed by dry etching or wet etching. When the elastic layer 824 is arranged, the elastic layer 824 may be further etched. In some embodiments, after the electrode insulation trench 850, the electrode lead 860, and the electrode retraction trench 870 are all etched, the wire bound electrode layer 826 may be arranged on the first electrode layer 821.

Figure 16:
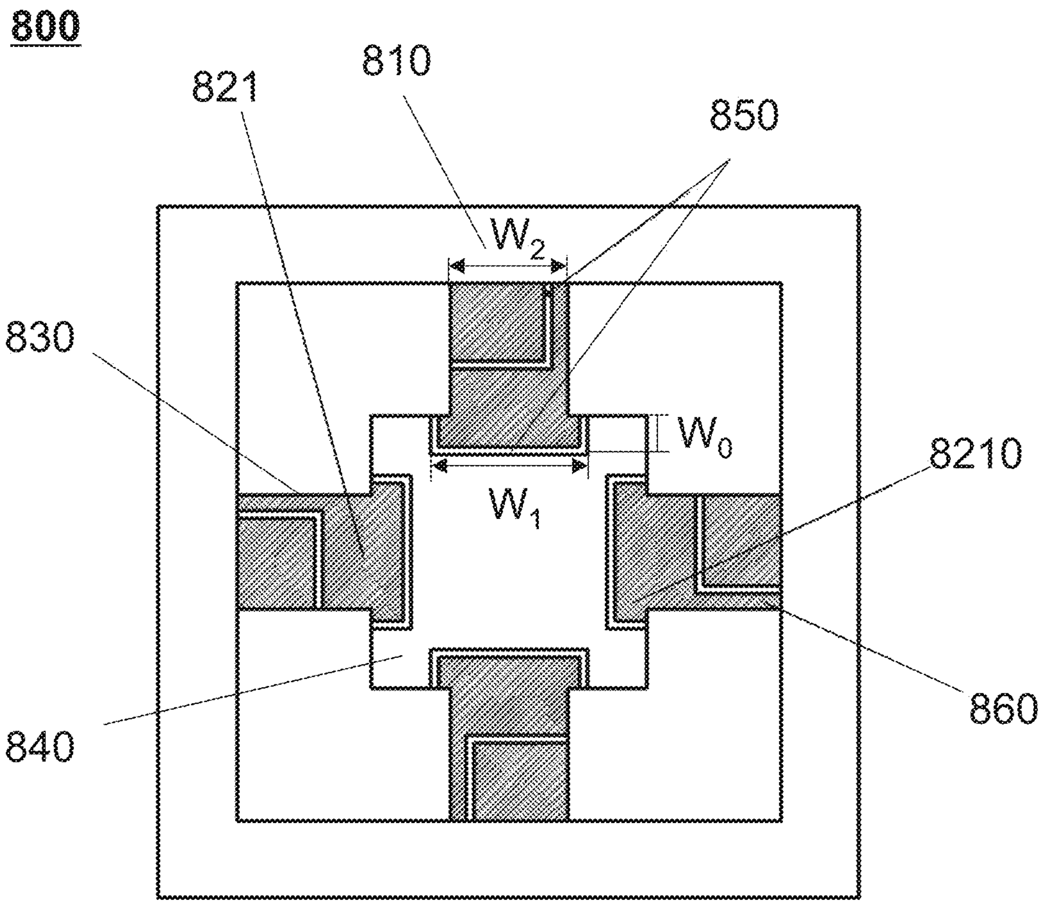
FIG. 16 is another schematic structural diagram illustrating the bone conduction sound transmission device in FIG. 8 according to some embodiments of the present disclosure.

As shown in FIG. 16, taking the mass element 840 protruding downward relative to the support arm 830 as an example, the acoustic transducer unit 820 may further include an extension region 8210 extending along the length direction of the support arm 830, and the extension region 8210 may be located on the upper surface the mass element 840. In some embodiments, the overlapping region of the first electrode layer 821, the first piezoelectric layer 822, and the second electrode layer 823 extends toward the mass element 840 to form the extension region 8210 on the mass element 840. The extension region 8210 may prevent the stress concentration at the connection between the support arm 830 and the mass element 840. The extension region 8210 may be located on the upper surface of the mass element 840 or the lower surface of the mass element 840. In some embodiments, the electrode insulation trench 850 may be arranged at the edge region of the extension region 8210 on the upper surface of the mass element 840 to prevent an excessive stress concentration of the support arm 830, thereby improving stability of the support arm 830. In some embodiments, the length of the extension region 8210 (the length on the plane perpendicular to the thickness direction, referring to the length $W_0$ in FIG. 16) is greater than the width of the support arm 830 (the width on the plane perpendicular to the thickness direction, referring to the width $W_1$ in FIG. 16). Here, the length of the extension region 8210 corresponds to the width of the support arm 830. In some embodiments, the length of the extension region 8210 (the length on the plane perpendicular to the thickness direction, referring to the width $W_0$ in FIG. 16) may be within a range of 4 μm-30 μm. In some embodiments, a length of the extension region 8210 may be within a range of 4 μm-15 μm. In some embodiments, the width of the extension region 8210 on the mass element 840 (the width on the plane perpendicular to the thickness direction, referring to the width $W_1$ in FIG. 16) is 1.2 times-2 times of the width of the connection between the support arm 830 and the edge of the mass element 840 (the width on the plane perpendicular to the thickness direction, referring to the width $W_2$ in FIG. 16). In some embodiments, the width of the extension region 8210 on the mass element 840 may be 1.2 times-1.5 times of the width of the connection between the support arm 830 and the edge of the mass element 840. In some embodiments, the width of the extension region 8210 on the mass element 840 may be equal to the width of the connection between the support arm 830 and the edge of the mass element 840.

Figure 17:
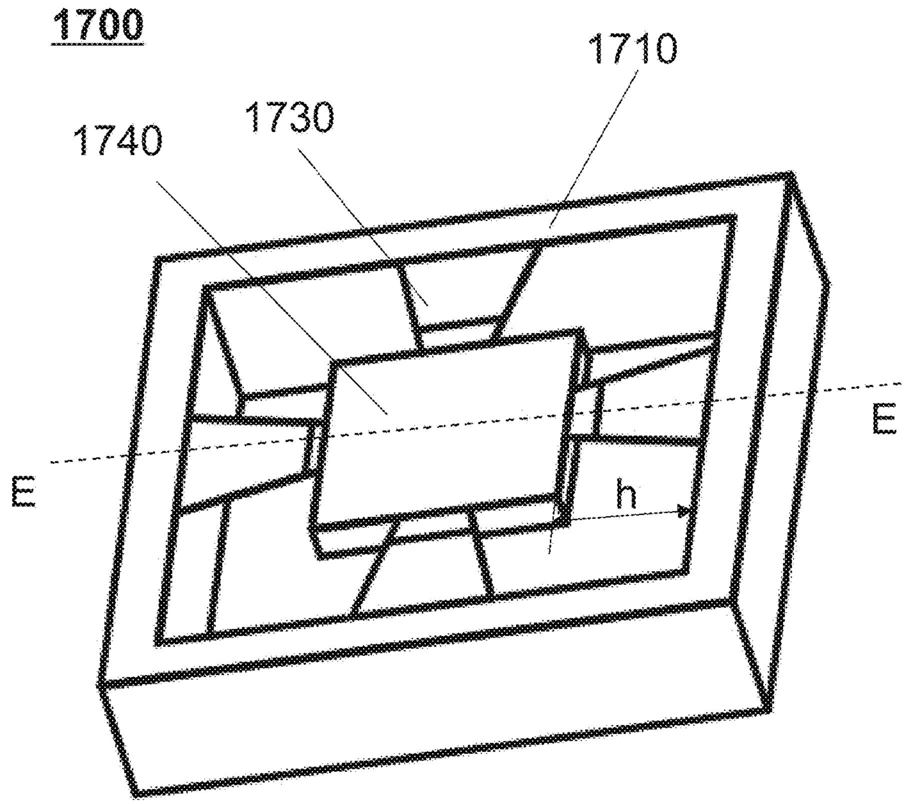
FIG. 17 is a schematic structural diagram illustrating the bone conduction sound transmission device according to some embodiments of the present disclosure.
Figure 18:
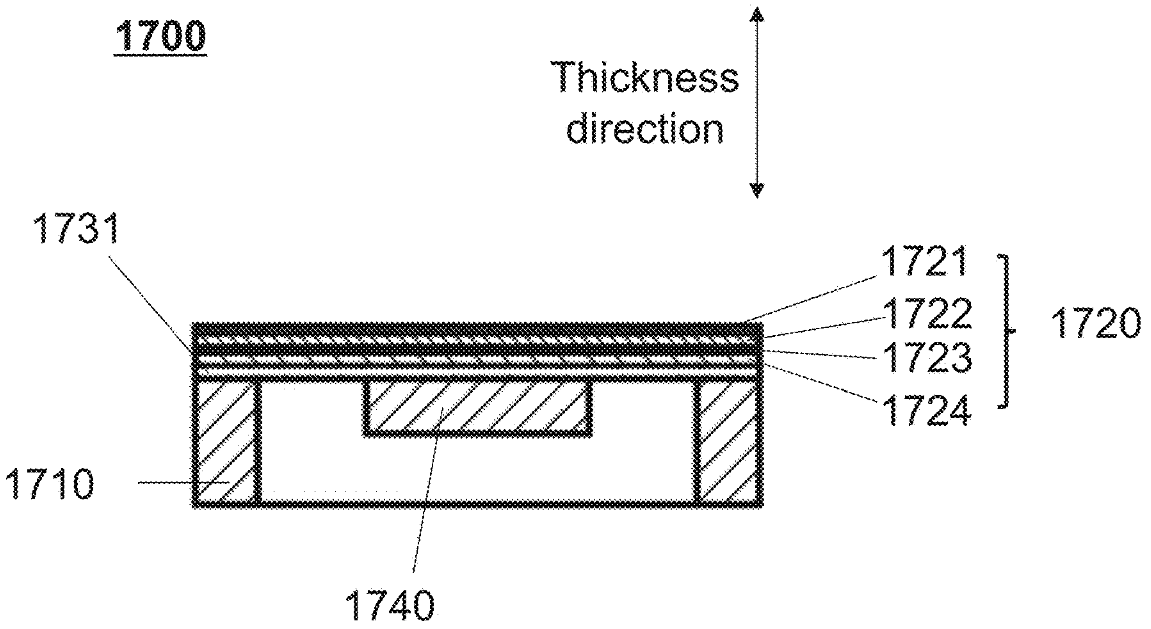
FIG. 18 is a sectional view of the bone conduction sound transmission device in FIG. 17 along an E-E axis according to some embodiments of the present disclosure.

FIG. 17 is a schematic structural diagram illustrating the bone conduction sound transmission device according to some embodiments of the present disclosure. FIG. 18 is a sectional view of the bone conduction sound transmission device in FIG. 17 along an E-E axis according to some embodiments of the present disclosure. An overall structure of a bone conduction sound transmission device 1700 shown in FIGS. 17 and 18 is substantially the same as that of the bone conduction sound transmission device 800 shown in FIG. 8, the difference is that the shape of the support arms is different. As shown in FIG. 17, a base structure 1710 is a rectangular frame structure. In some embodiments, an interior of the base structure 1710 may include a hollow part for suspending an acoustic transducer unit 1720 and a vibration unit. In some embodiments, a shape of the hollow part may be a circle, a quadrangle (e.g., a rectangle, a parallelogram), a pentagon, a hexagon, a heptagon, an octagon, or other regular or irregular shapes. In some embodiments, the vibration unit may include four support arms 1730 and a mass element 1740, one end of each of the four support arms 1730 may be connected to the upper surface or the lower surface of the base structure 1710, or the side wall of the base structure where the hollow part is located, and the other end of each of the four support arms 1730 may be connected to the upper surface, the lower surface, or the peripheral side wall of a mass element 1740. In some embodiments, the mass element 1740 may protrude upward and/or downward relative to support arm 1730. For example, when the ends of the four support arms 1730 are connected to the upper surface of the mass element 1740, the mass element 1740 may protrude downward relative to the support arms 1730. For another example, when the ends of the four support arms 1730 are connected to the lower surface of the mass element 1740, the mass element 1740 may protrude upward relative to the support arms 1730. For another example, when the ends of the four support arms 1730 are connected to the peripheral side wall of the mass element 1740, the mass element 1740 may protrude upward and downward relative to the support arms 1730. In some embodiments, the upper surface of the mass element 1740 is on the same horizontal plane as the upper surface of the support arm 1730, and/or the lower surface of the mass element 1740 is on the same horizontal plane as the lower surface of the support arm 1730. In some embodiments, the shape of the support arm 1730 is a trapezoid, i.e., the shape of a cross section of the support arm 1730 perpendicular to a thickness direction is trapezoidal. An end of the support arm 1730 with a small length (the short edge of the trapezoid) is connected to the mass element 1740, and an end of the support arm 1730 with a large length (the long edge of the trapezoid) is connected to the base structure 1710. In another embodiment, the end of the support arm 1730 with a large length (the long edge of the trapezoid) is connected to the mass element 1740, and the end of the support arm 1730 with a small length (the short edge of the trapezoid) is connected to the base structure 1710.

In some embodiments, a height of the trapezoid (the height h as shown in FIG. 17) may be within a range of 150 μm-600 μm. In some embodiments, the height of the trapezoid may be within a range of 200 μm-500 μm. In some embodiments, the length of the long edge of the trapezoid may be within a range of 300 μm-600 μm. In some embodiments, the length of the long edge of the trapezoid may be within a range of 350 μm-550 μm. In some embodiments, the length of the short edge of the trapezoid may be within a range of 100 μm-400 μm. In some embodiments, the length of the short edge of the trapezoid may be within a range of 150 μm-300 μm. In some embodiments, the length of the short edge of the trapezoid may be within a range of 150 μm-250 μm. By designing relevant size of the support arm 1730 (e.g., the length of the long edge, the length of the short edge, and the height, etc. of the trapezoid), a stiffness of the support arm 1730 may be adjusted, thereby adjusting a resonance frequency of the bone conduction sound transmission device 1700.

In some embodiments, the acoustic transducer unit 1720 may include a first electrode layer 1721, a first piezoelectric layer 1722, a second electrode layer 1723, an elastic layer 1731, a first seed layer 1724, and a wire bound electrode layer (not shown in the figure), etc. The material, thickness, arrangement sequence, and preparation method of each layer are similar to the embodiment shown in FIG. 8, which are not be repeated here.

In some embodiments, in order to improve the SNR of the bone conduction sound transmission device 1700, an effective acoustic transducer unit may be arranged on the position of the support arm 1730 close to the mass element 1740 or close to the connection between the support arm 1730 and the base structure 1710. In some embodiments, the effective acoustic transducer unit may be arranged on the position of the support arm 1730 close to the mass element 1740. In some embodiments, when the effective acoustic transducer unit is arranged on the position of the support arm 1730 close to the mass element 1740 or close to the connection between the support arm 1730 and the base structure 1710, a ratio of a cover area of the effective acoustic transducer unit at the support arm 1730 to the area of the support arm 1730 may be within a range of 5%-40%. In some embodiments, the ratio of the cover area of the effective acoustic transducer unit at the support arm 1730 to the area of the support arm (the area of a cross section of the support arm 1730 perpendicular to the thickness direction) may be within a range of 10%-35%. Further, in some embodiments, the ratio of the cover area of the effective acoustic transducer unit at the support arm 1730 to the area of the support arm 1730 (the area of the cross section of the support arm 1730 perpendicular to the thickness direction) may be within a range of 15%-20%.

Figure 19:
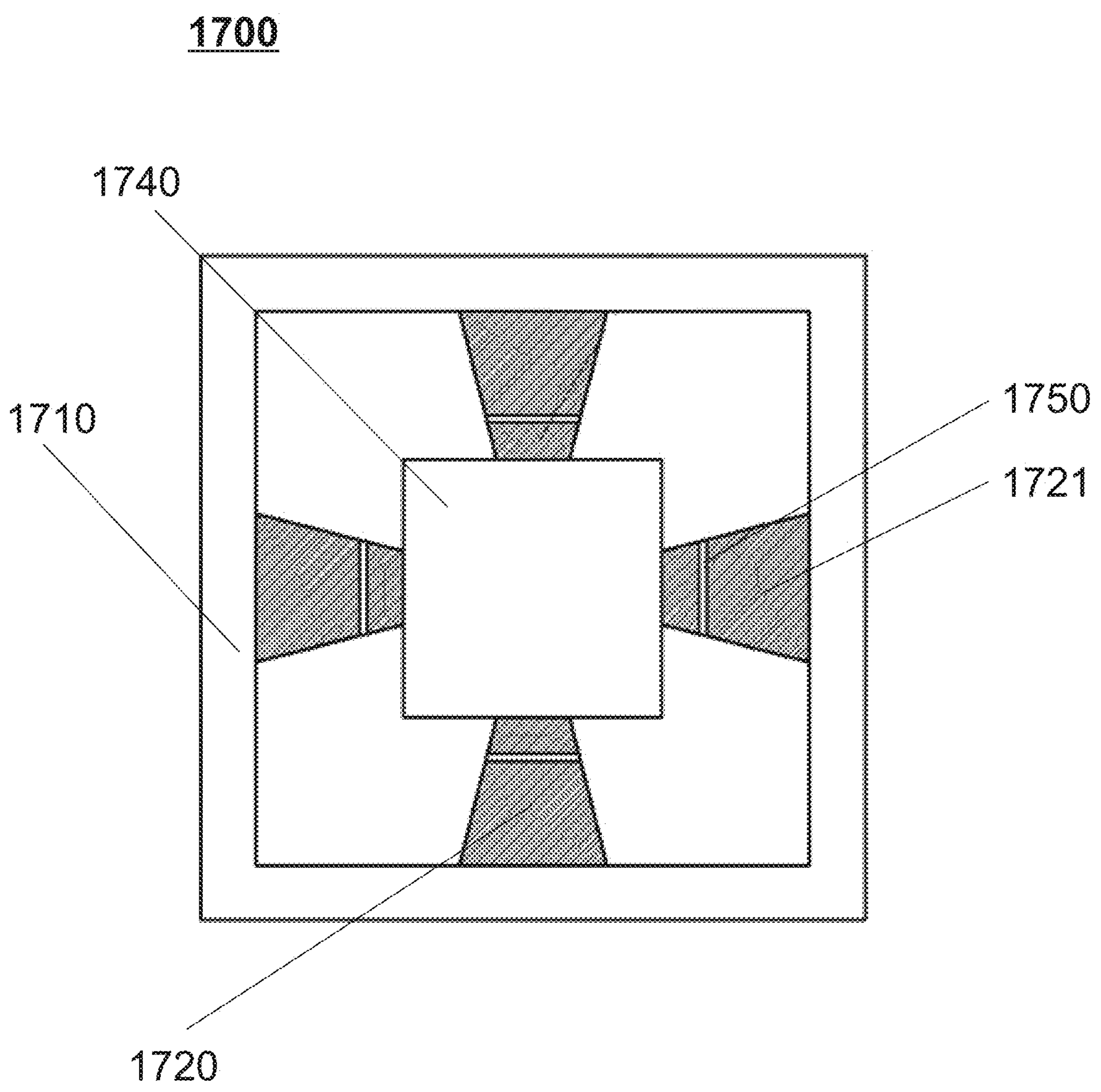
FIG. 19 is a schematic structural diagram illustrating the bone conduction sound transmission device in FIG. 17 according to some embodiments of the present disclosure.

The SNR of the bone conduction sound transmission device 1700 is positively correlated with the intensity of the output electrical signal. When a relative motion occurs between the laminated structure and the base structure 1710, the deformation stresses at the connection between the support arm 1730 and the mass element 1740 and the connection between the support arm 1730 and the base structure 1710 are larger than the deformation stress in the middle region of the support arm 1730. Further, the intensity of the output voltages at the connection between the support arm 1730 and the mass element 1740 and the connection between the support arm 1730 and the base structure 1710 are relatively larger than the intensity of the output voltage in the middle region of the support arm 1730. In some embodiments, as shown in FIG. 19, when the acoustic transducer unit 1720 completely or almost completely covers the upper surface or the lower surface of the support arm 1730, in order to improve the SNR of the bone conduction sound transmission device 1700, an electrode insulation trench 1750 may be arranged on the first electrode layer 1721, and the electrode insulation trench 1750 may divide the first electrode layer 1721 into two parts, so that a part of the first electrode layer 1721 is close to the mass element 1740, and the other part of the electrode layer 1721 is close to the connection between the support arm 1730 and the base structure 1710. In some embodiments, the electrode insulation trench 1750 may be a straight line extending along the width direction of the support arm 1730. In some embodiments, a width of the electrode insulation trench 1750 may be within a range of 2 μm-20 μm. In some embodiments, the width of the electrode insulation trench 1750 may be within a range of 4 μm-10 μm.

It should be noted that the electrode insulation trench 1750 may not be limited to the straight line extending along the width direction of the support arm 1730, but may also be a curve, a bent line, a wavy line, etc. In addition, the electrode insulation trench 1750 is not extended along the width direction of the support arm 1730, such as the electrode insulation trench 1750 shown in FIG. 19, and the electrode isolation trench 1750 only needs to divide the acoustic transducer unit 1720 into multiple parts, which is not further limited here.

Figure 20:
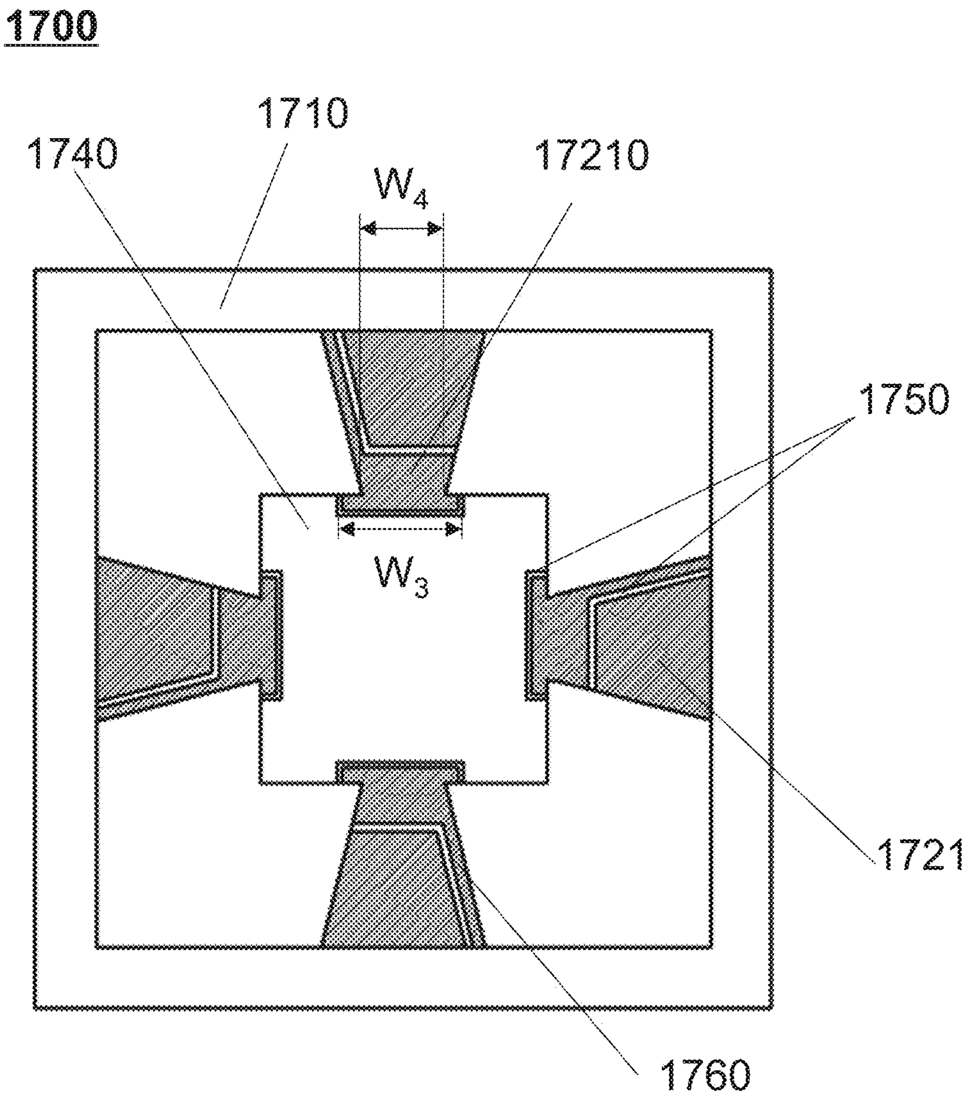
FIG. 20 is another schematic structural diagram illustrating the bone conduction sound transmission device in FIG. 17 according to some embodiments of the present disclosure.

As shown in FIG. 20, when the partial structure of the acoustic transducer unit 1720 (e.g., the acoustic transducer unit between the electrode insulation trench 1750 and the mass element 1740 in FIG. 19) is arranged at a position of the support arm 1730 close to the mass element 1740, the first electrode layer 1721 and/or the second electrode layer 1723 may further include an electrode lead 1760. Taking the first electrode layer 1721 as an example, the electrode insulation trench 1750 divides the first electrode layer 1721 into two parts, one part of the first electrode layer 1721 is connected to the mass element 1740 or close to the mass element 1740, and the other part of the first electrode layer 1721 is close to the connection between the support arm 1730 and the base structure 1710. In order to output the voltage of the acoustic transducer unit 1720 close to the mass element 1740, a partial region of the first electrode layer 1721 close to the connection between the support arm 1730 and the base structure 1710 (as shown in the figure, the first electrode layer 1721 is located at the edge region of the support arm 1730, which may be recorded as an electrical lead 1760) may be divided by the electrode insulation trench 1750, the electrode lead 1760 electrically connects the part of the acoustic transducer unit 1720 connecting the mass element 1740 or close to the mass element 1740 to a processing unit of the bone conduction sound transmission device 1700. In some embodiments, a width $L_2$ of the electrode lead 1760 may be within a range of 4 μm-20 μm. In some embodiments, the width $L_2$ of the electrode lead 1760 may be within a range of 4 μm-10 μm. In some embodiments, the electrode lead 1760 may be located at any position in the width direction of the support arm 1730, for example, the electrode lead 1760 may be located at a center or close to the edge of the support arm 1730 in the width direction. In some embodiments, the electrode lead 1760 may be located position close to the edge of the support arm 1730 in the width direction. A use of a conductive wire in the acoustic transducer unit 1720 may be avoided by arranging the electrode lead 1760, and at the same time, the structure is relatively simple, which is convenient for the subsequent production and assembly.

The piezoelectric material of the first piezoelectric layer 1722 may be roughened in the region close to the edge of the support arm 1730 due to etching, which deteriorates the quality of the piezoelectric material. In some embodiments, when the area of the first piezoelectric layer 1722 is the same as that of the second electrode layer 1723, the area of the first electrode layer 1721 may be less than the area of the first piezoelectric layer 1722 to make that the first electrode layer 1721 is located in a piezoelectric material region with better quality, so that the edge region of the electrode layer 1721 avoids the edge region of the first piezoelectric layer 1722, and an electrode retraction trench 1770 (the structure of the electrode retraction trench similar to that of the electrode retraction trench 870 in FIG. 15) is formed between the first electrode layer 1721 and the first piezoelectric layer 1722. By arranging the electrode retraction trench 1770, the edge region of the first piezoelectric layer 1722 with the poor quality may avoid from the first electrode layer 1721 and the second electrode layer 1723, thereby improving the SNR of the output of the bone conduction sound transmission device 1700. In some embodiments, a width of the electrode retraction trench may be within a range of 2 μm-20 μm. In some embodiments, the width of the electrode retraction trench may be within a range of 2 μm-10 μm.

As shown in FIG. 20, in some embodiments, taking the mass element 1740 protruding downward relative to the support arm 1730 as an example, the acoustic transducer unit 1720 may further include an extension region 17210 extending along the length direction of the support arm 1730, the extension region 17210 may be located on the upper surface of mass element 1740. In some embodiments, the overlapping region of the first electrode layer 1721, the first piezoelectric layer 1722, and the second electrode layer 1723 extends toward the mass element 1740 to form the extension region 17210. The extension region 17210 may be located on the upper surface or the lower surface of the mass element 1740. In some embodiments, an electrode insulation trench 1750 may be arranged at the edge position of the extension region 17210 on the upper surface of the mass element 1740 to prevent an excessive stress concentration of the support arm 1730, thereby improving stability of the support arm 1730. In some embodiments, the width of the extension region 17210 (the width on the plane perpendicular to the thickness direction, referring to the width $W_3$ in FIG. 20) is greater than the width of the support arm 1730 (width on the plane perpendicular to the thickness direction, referring to the width $W_4$ in FIG. 20). Here, the width of the extension region 17210 corresponds to the width of the support arm 1730. In some embodiments, the width of the extension region 17210 may be within a range of 4 μm-30 μm. In some embodiments, the width of the extension region 17210 may be within a range of 4 μm-15 μm. In some embodiments, the width of the extension region 17210 on the mass element 1740 may be 1.2 times-2 times of the width of the connection part between the support arm 1730 and the edge of the mass element 1740. In some embodiments, the width of the extension region 17210 on the mass element 1740 may be 1.2 times-1.5 times of the width of the connection part between the support arm 1730 and the edge of the mass element 1740. Regarding the materials, sizes, or other parameters of the acoustic transducer unit 1720, the first electrode layer 1721, the second electrode layer 1723, the first piezoelectric layer 1722, the vibration unit, and the mass element 1740 in the embodiment, please refer to the contents in FIGS. 8-16, which are not repeated here.

Figure 21:
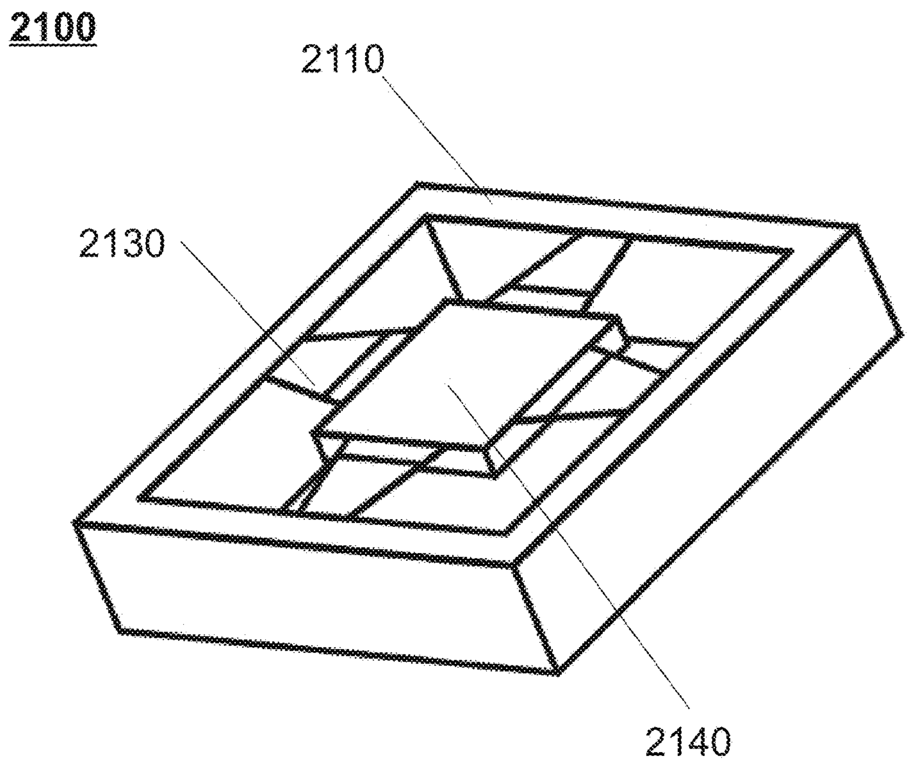
FIG. 21 is a schematic structural diagram illustrating the bone conduction sound transmission device according to some embodiments of the present disclosure.
Figure 22:
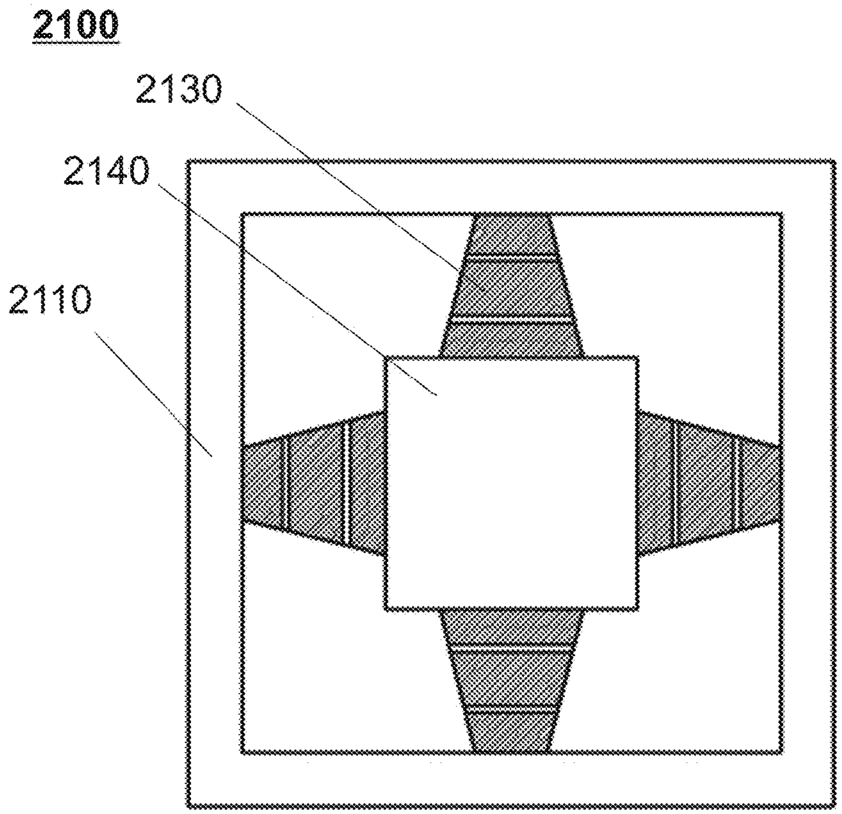
FIG. 22 is a schematic structural diagram illustrating the bone conduction sound transmission device in FIG. 21 according to some embodiments of the present disclosure.

FIG. 21 is a schematic structural diagram illustrating the bone conduction sound transmission device according to some embodiments of the present disclosure. FIG. 22 is a schematic structural diagram illustrating the bone conduction sound transmission device in FIG. 21 according to some embodiments of the present disclosure. The structure of the bone conduction sound transmission device 2100 shown in FIGS. 21-22 is substantially the same as that of the bone conduction sound transmission device 800 shown in FIG. 8, the difference is that the shape of the support arms is different. As shown in FIG. 21, a base structure 2110 is a rectangular frame structure. In some embodiments, an interior of the base structure 2110 may include a hollow part for suspending an acoustic transducer unit and a vibration unit. In some embodiments, the vibration unit may include four support arms 2130 and a mass element 2140, one end of each of the four support arms 2430 may be connected to the upper surface or the lower surface of the base structure 2410, or the side wall where the hollow part of the base structure 2410 is located, and the other end of each of the four support arms 2430 may be connected to the upper surface, the lower surface, or the peripheral side wall of the mass element 2440. In some embodiments, the mass element 2140 may protrude upward and/or downward relative to the support arm 2130. For example, when the ends of the four support arms 2130 are connected to the upper surface of the mass element 2140, the mass element 2140 may protrude downward relative to the support arms 2130. For another example, when the ends of the four support arms 2130 are connected to the lower surface of the mass element 2140, the mass element 2140 may protrude upward relative to the support arms 2130. For another example, when the ends of the four support arms 2130 are connected to the peripheral side walls of the mass element 2140, the mass element 2140 may protrude upward and downward relative to the support arms 2130. In some embodiments, the shape of the support arm 2130 is a trapezoid, that is, the shape of the cross section of the support arm 2130 perpendicular to the thickness direction is a trapezoidal. An end of the support arm 2130 with a long length (the long edge of the trapezoid) is connected to the mass element 2140, and an end of the support arm 2130 with a short length (the short edge of the trapezoid) is connected to the base structure 2110. In some embodiments, an end of the support arm 2130 with a short length (the short edge of the trapezoid) is connected to the mass element 2140, and an end of the support arm 2130 with a long length (the longer edge of the trapezoid) is connected to the base structure 2110. It should be noted that, the parameters of the acoustic transducer 820, the first electrode layer 821, the second electrode layer 823, the vibration unit, the mass element 840, the extension region 8210, the electrode insulation trench 850, the electrode lead 860, the electrode retraction trench 870, or other components (shown in FIGS. 8-10), such as the structures, the sizes, and the thicknesses may be applied to the bone conduction sound transmission device 2100, which is not further repeated here.

In some embodiments, when the shape of the cross section of the support arm perpendicular to the thickness direction is a polygon (e.g., rectangle or a trapezoid, etc.), the mass element may be arranged to protrude upward or downward relative to the support arm. The mass element arranged in this way may increase the deformation stress of the support arm when the support arm is deformed, so that the intensity of the electric signal output by the acoustic transducer unit is increased.

Figure 23:
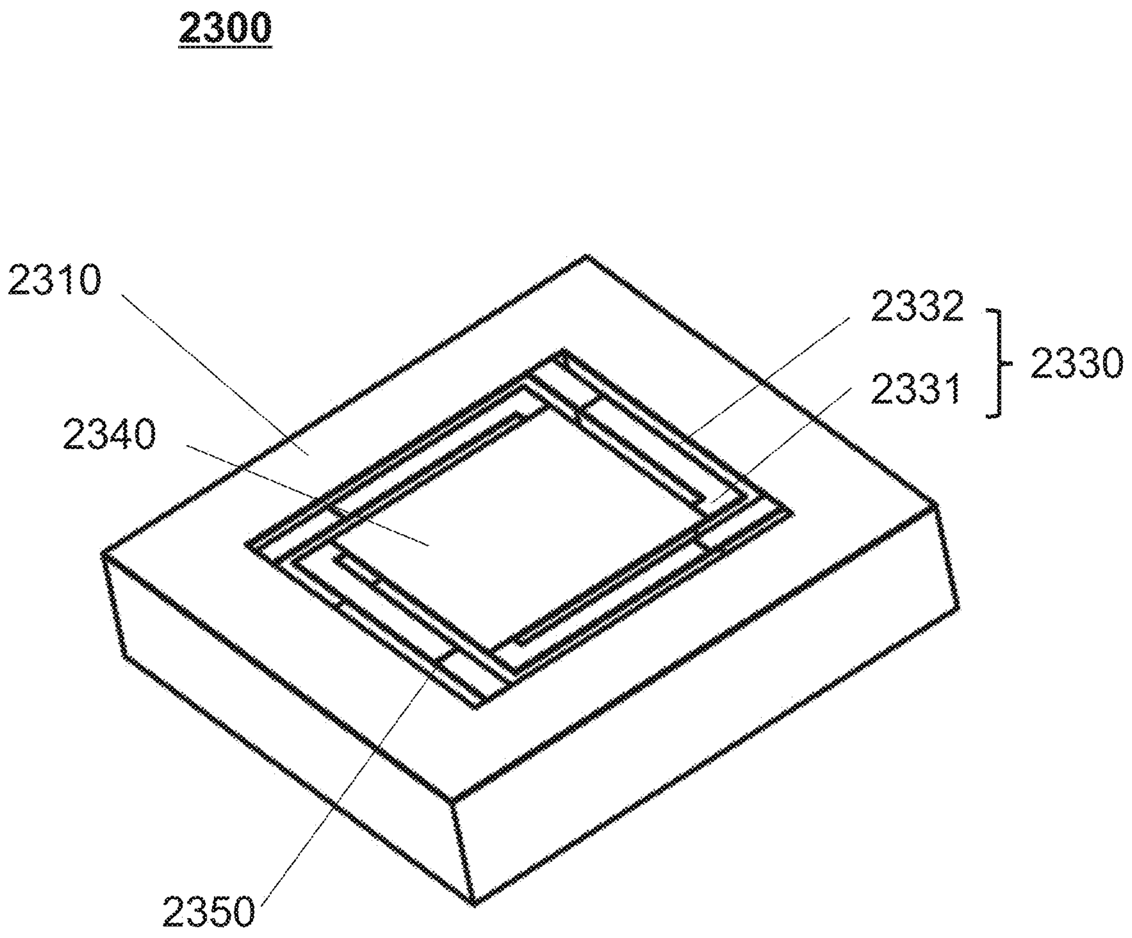
FIG. 23 is a schematic structural diagram illustrating a bone conduction sound transmission device according to some embodiments of the present disclosure.
Figure 24:
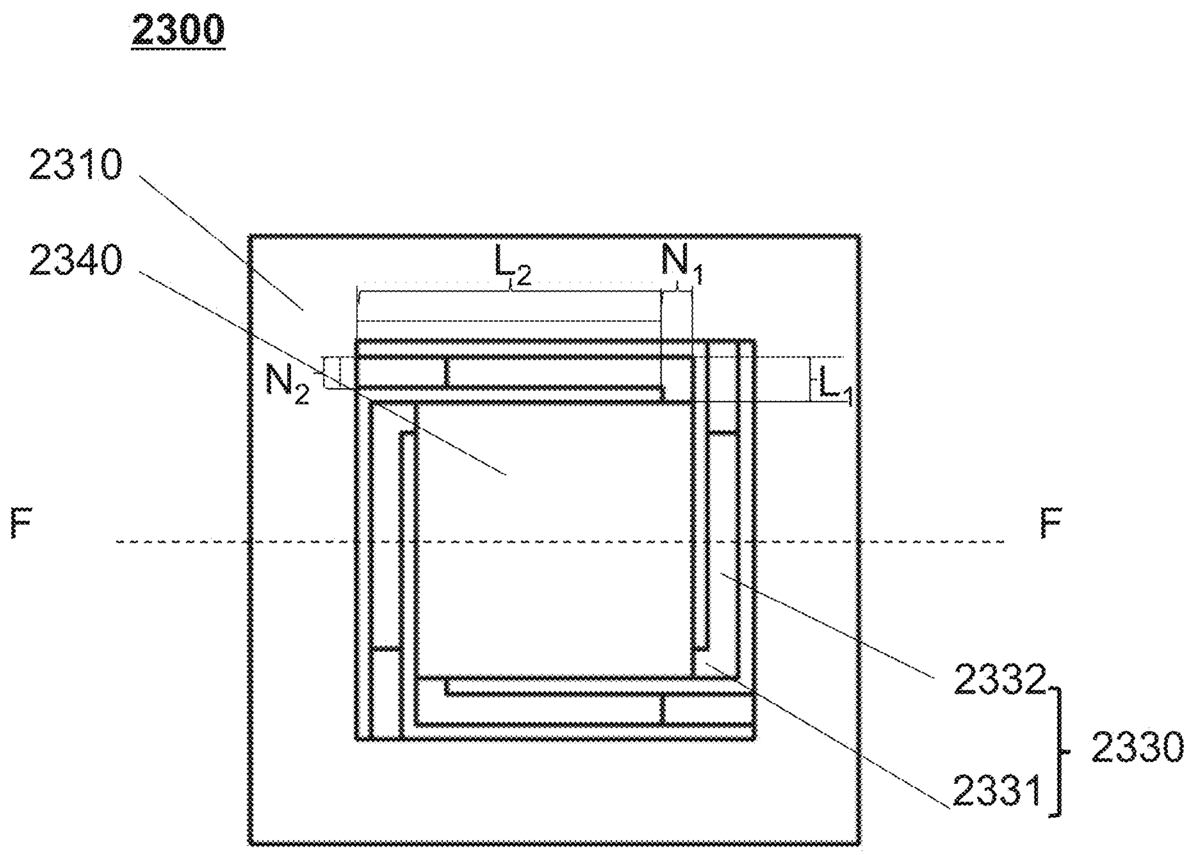
FIG. 24 is a front view of the bone conduction sound transmission device in FIG. 23 according to some embodiments of the present disclosure.
Figure 25:
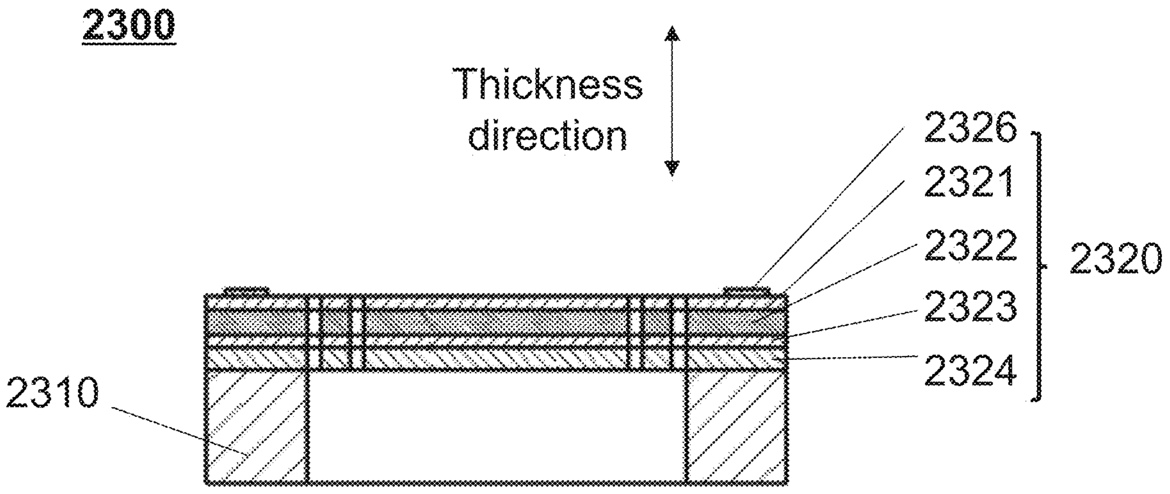
FIG. 25 is a sectional view of the bone conduction sound transmission device in FIG. 24 along an F-F axis according to some embodiments of the present disclosure.

FIG. 23 is a schematic structural diagram illustrating a bone conduction sound transmission device according to some embodiments of the present disclosure. FIG. 24 is a front view of the bone conduction sound transmission device in FIG. 23 according to some embodiments of the present disclosure. FIG. 25 is a sectional view of the bone conduction sound transmission device in FIG. 24 along an F-F axis according to some embodiments of the present disclosure. A structure of the bone conduction sound transmission device 2300 shown in FIGS. 23-25 is substantially the same as that of the bone conduction sound transmission device 800 shown in FIG. 8. The difference is that a shape and a structure of a support arm 2330 of the bone conduction sound transmission device 2300 are different from those of the support arm 830 of the bone conduction sound transmission device 800. In some embodiments, an interior of a base structure 2310 may include a hollow part for suspending an acoustic transducer unit 2320 and a vibration unit. In some embodiments, the vibration unit may include four support arms 2330 and a mass element 2340, one end of each of the four support arms 2330 may be connected to the upper surface or the lower surface of the base structure 2310, or the side wall of the base structure where the hollow part is located, and the other end of each of the four support arms 2330 may be connected to an upper surface, a lower surface, or a peripheral side wall of a mass element 2340. In some embodiments, the mass element 2340 may protrude upward and/or downward relative to support arm 2330. For example, when the ends of the four support arms 2330 are connected to the upper surface of the mass element 2340, the mass element 2340 may protrude downward relative to the support arms 2330. For another example, when the ends of the four support arms 2330 are connected to the lower surface of the mass element 2340, the mass element 2340 may protrude upward relative to the support arms 2330. For another example, when the ends of the four support arms 2330 are connected to the peripheral side walls of the mass element 2340, the mass element 2340 may protrude upward and downward relative to the support arms 2330. In some embodiments, the upper surface of the mass element 2340 is on the same horizontal plane as the upper surface of the support arm 2330, and/or the lower surface of the mass element 2340 is on the same horizontal plane as the lower surface of the support arm 2330. In some embodiments, the shape of the support arm 2330 may be an approximately L-shaped structure. As shown in FIG. 23, the support arm 2330 may include a first bar-shaped part 2331 and a second bar-shaped part 2332, and one end of the first bar-shaped part 2331 may be connected to one end of the second bar-shaped part 2332. A certain included angle may be formed between the first bar-shaped part 2331 and a second bar-shaped part 2332. In some embodiments, the included angle may be within a range of 75°-105°. In some embodiments, the end of the first bar-shaped part 2331 away from the connection between the first bar-shaped part 2331 and the second bar-shaped part 2332 is connected to the base structure 2310, and the end of the second bar-shaped part 2332 away from the connection between the first bar-shaped part 2331 and the second bar-shaped part 2332 is connected to the upper surface, the lower surface, or the peripheral side wall of the mass element 2340, so that the mass element 2340 is suspended in the hollow part of the base structure 2310.

In some embodiments, as shown in FIGS. 23-25, the support arm 2330 may include two bar-shaped parts. For example, the support arm 2330 may include a first bar-shaped part 2331 and a second bar-shaped part 2332. In some embodiments, one end of the first bar-shaped part 2331 may be connected to the mass element 2340, and the other end of the first bar-shaped part 2331 may be connected to one end of the second bar-shaped part 2332. The other end of the second bar-shaped part 2332 may be connected to the base structure 2310. Compared with a polygonal support arm, the support arm 2330, including the first bar-shaped part 2331 and the second bar-shaped part 2332, may be designed to be longer in a limited space, so a stiffness of the support arm 2330 may be smaller, and the mass of the mass element 2340 may be arranged relatively small (e.g., it is unnecessary to protrude upward and downward relative to the support arm 2330, so that the upward or downward protruding structure of the mass element 2340 does not need to be further processed), so that a preparing process of the mass element 2340 may be simplified.

In this embodiment, the support arm 2330 and the mass element 2340 may be prepared according to the preparation process described above. In addition, in this embodiment, if there is no need to arrange the mass element 2340 protruding upward or downward relative to the support arm 2330, the support arm 2330 and the mass element 2340 are prepared on the same base material at the same time, thereby simplifying the manufacturing process.

The connection between the first bar-shaped part 2331 and the mass element 2340 may be located at any position on a side of the polygon, such as the end of the side or a midpoint of the side. In some embodiments, the connection between the first bar-shaped part 2331 and the mass element 2340 is located at the end of the side of the polygon (as shown in FIG. 24). In some embodiments, a width $N_1$ of the first bar-shaped part 2331 may be within a range of 50 μm-300 μm. In some embodiments, the width $N_1$ of the first bar-shaped part 2331 may be within a range of 80 μm-200 μm. In some embodiments, a width $N_2$ of the second bar-shaped part 2332 may be within a range of 50 μm-300 μm. In some embodiments, the width $N_2$ of the second bar-shaped part 2332 may be within a range of 80-200 μm. In some embodiments, a length $L_1$ of the first bar-shaped part 2331 may be within a range of 20 μm-200 μm. In some embodiments, the length $L_1$ of the first bar-shaped part 2331 may be within a range of 30 μm-100 μm. In some embodiments, a length $L_2$ of the second bar-shaped part 2332 may be within a range of 800 μm-1300 μm. In some embodiments, the length $L_2$ of the second bar-shaped part 2332 may be within a range of 900 μm-1200 μm.

In some embodiments, the included angle between the first bar-shaped part 2331 and the second bar-shaped part 2332 (the included angle in the length direction) may be within a range of 60°-120°. In some embodiments, the included angle between the first bar-shaped part 2331 and the second bar-shaped part 2332 (the included angle in the length direction) may be within a range of 75°-105°. In some embodiments, the included angle between the first bar-shaped part 2331 and the second bar-shaped part 2332 (the included angle in the length direction) may be 90° (i.e., the length direction of the first bar-shaped part 2331 perpendicular to the second bar-shaped part 2331).

In some embodiments, one end of the first bar-shaped part 2331 may be connected to the mass element 2340, and the other end of the first bar-shaped part 2331 may be connected to a non-end position of the second bar-shaped part 2332 (e.g., the other end of the first bar-shaped part 2331 may be connected to the middle part of the second bar-shaped part 2332 in the length direction). One end of the second bar-shaped part 2332 may be connected to the base structure 2310 (or both ends of the second bar-shaped part 2332 may be connected to the base structure 2310). It may be understood that by such connection method, the support arm 2330 is in a "T" shape.

Figure 30:
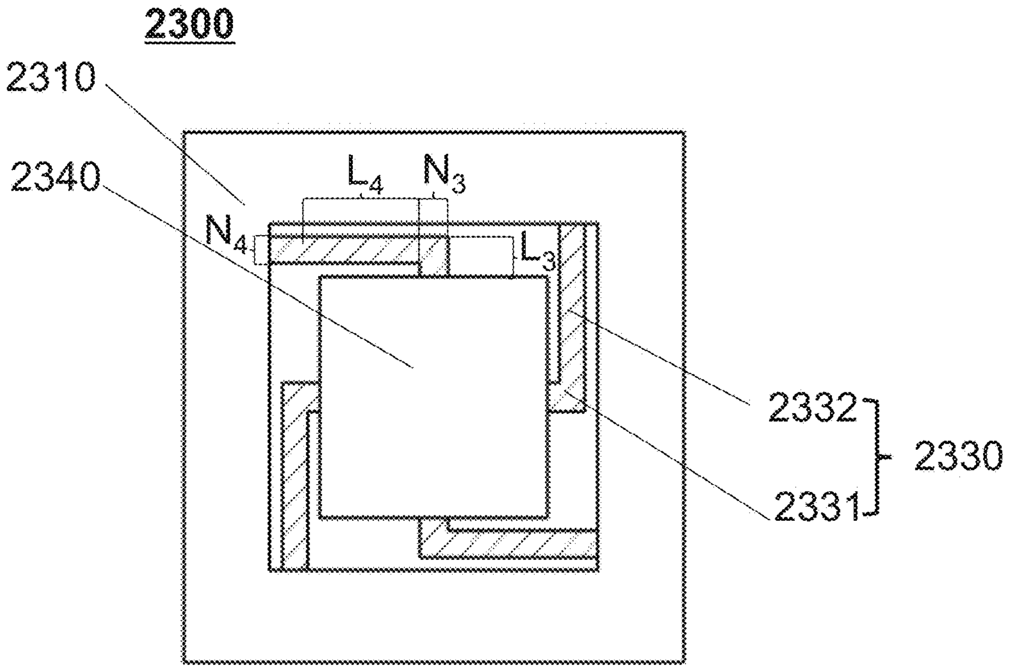
FIG. 30 is a schematic structural diagram illustrating the bone conduction sound transmission device according to some embodiments of the present disclosure.

FIG. 30 is a schematic structural diagram illustrating the bone conduction sound transmission device 2300 according to some embodiments of the present disclosure. The difference between the embodiment shown in FIG. 30 and the embodiment shown in FIG. 24 is that a connection position of the support arm and the mass element is different. As shown in FIG. 30, the connection between the first bar-shaped part 2331 and the mass element 2340 is located in a middle region of the side of the polygon of the mass element 2340 (e.g., at the midpoint of the side). In some embodiments, a width $N_3$ of the first bar-shaped part 2331 may be within a range of 100 μm-400 μm. In some embodiments, the width $N_3$ of the first bar-shaped part 2331 may be within a range of 150 μm-300 μm. In some embodiments, a width $N_4$ of the second bar-shaped part 2332 may be within a range of 100 μm-400 μm. In some embodiments, the width $N_4$ of the second bar-shaped part 2332 may be within a range of 150-300 μm. In some embodiments, a length $L_3$ of the first bar-shaped part 2331 may be within a range of 20 μm-200 μm. In some embodiments, the length $L_3$ of the first bar-shaped part 2331 may be within a range of 30 μm-100 μm. In some embodiments, a length $L_4$ of the second bar-shaped part 2332 may be within a range of 500 μm-1000 μm. In some embodiments, the length $L_4$ of the second bar-shaped part 2332 may be within a range of 700 μm-900 μm.

In some embodiments, the included angle between the first bar-shaped part 2331 and the second bar-shaped part 2332 may be substantially the same as the included angle between two adjacent edges of the polygon. For example, when the polygon is a regular hexagon, the included angle between two adjacent edges may be 120°, and the included angle between the first bar-shaped part and the second bar-shaped part may be about 120°. In some embodiments, when the cross section of the mass element 2340 perpendicular to the thickness direction is a rectangle, the first bar-shaped part 2331 is perpendicular to the second bar-shaped part 2332. Through such designing, a layout of the bone conduction sound transmission device 2300 is more compact.

Figure 26:
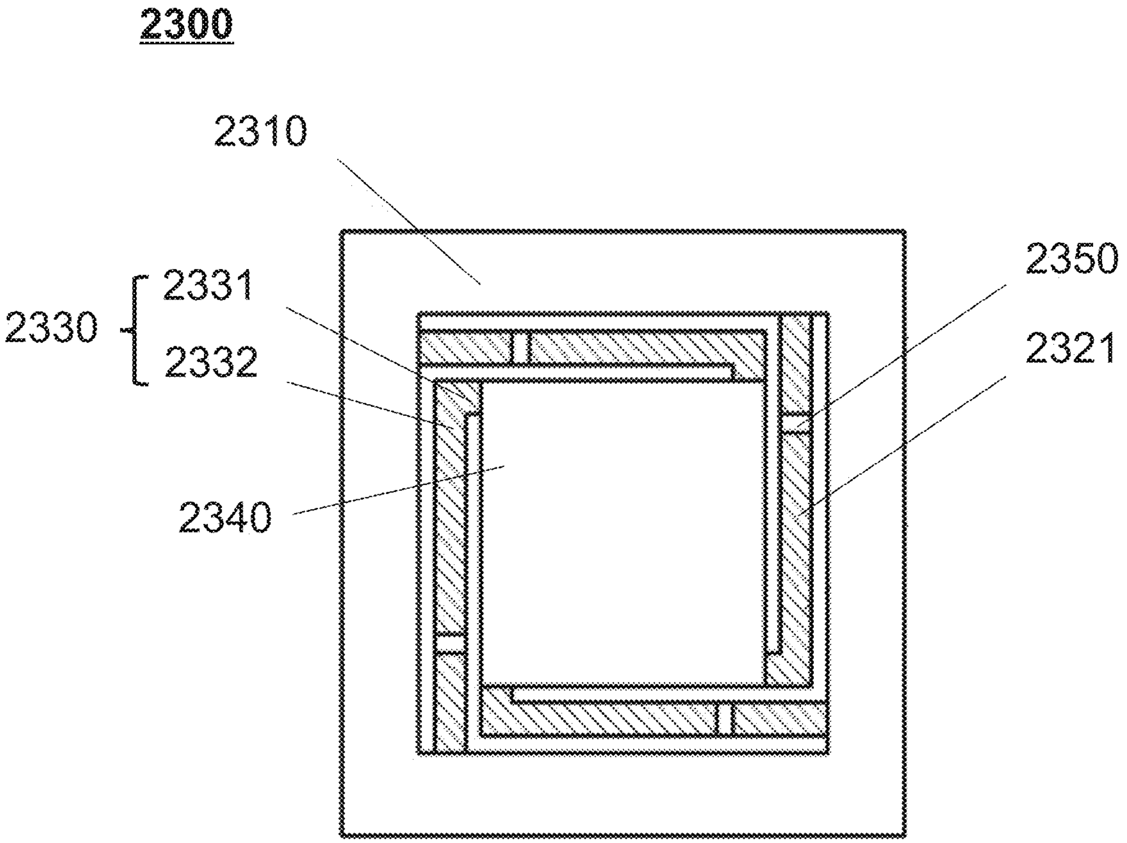
FIG. 26 is a schematic structural diagram illustrating the bone conduction sound transmission device in FIG. 23 according to some embodiments of the present disclosure.
Figure 27:
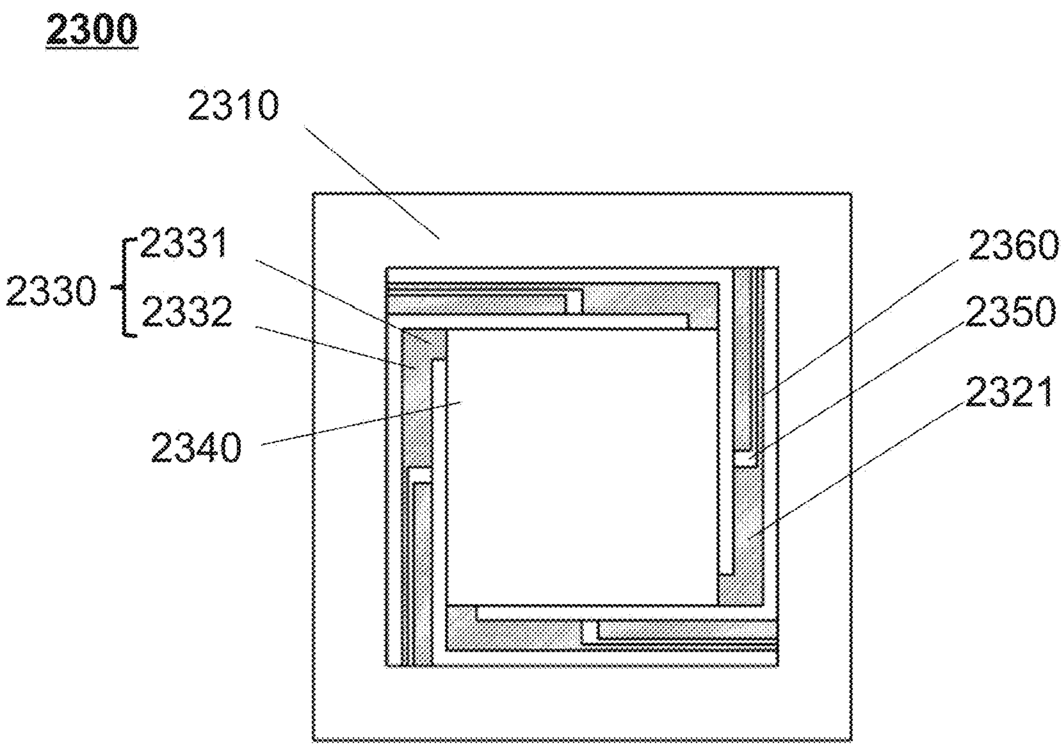
FIG. 27 is another schematic structural diagram illustrating the bone conduction sound transmission device in FIG. 23 according to some embodiments of the present disclosure.
Figure 28:
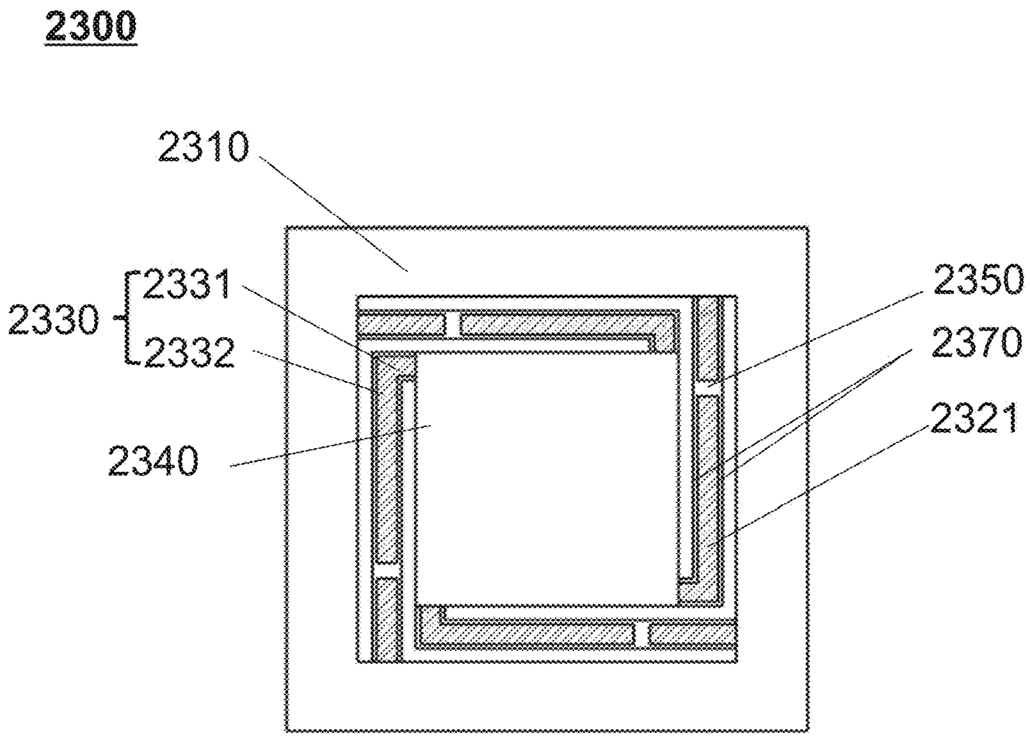
FIG. 28 is another schematic structural diagram illustrating the bone conduction sound transmission device in FIG. 23 according to some embodiments of the present disclosure.
Figure 29:
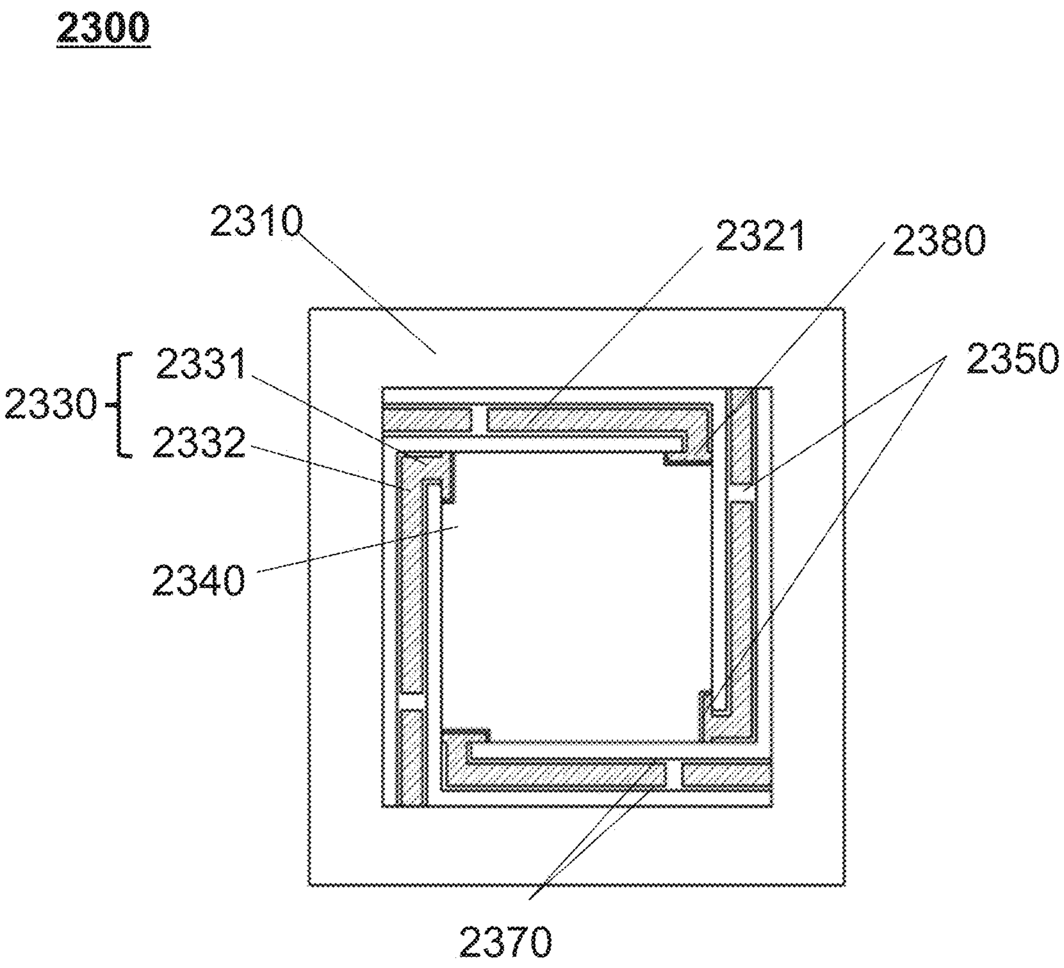
FIG. 29 is another schematic structural diagram illustrating the bone conduction sound transmission device in FIG. 23 according to some embodiments of the present disclosure.

FIG. 26 is a schematic structural diagram illustrating the bone conduction sound transmission device in FIG. 23 according to some embodiments of the present disclosure. FIG. 27 is another schematic structural diagram illustrating the bone conduction sound transmission device in FIG. 23 according to some embodiments of the present disclosure. FIG. 28 is another schematic structural diagram illustrating the bone conduction sound transmission device in FIG. 23 according to some embodiments of the present disclosure. FIG. 29 is another schematic structural diagram illustrating the bone conduction sound transmission device in FIG. 23 according to some embodiments of the present disclosure. FIG. 26 mainly shows the electrode insulation trench 2350 when the support arm 2330 includes two bar-shaped parts. FIG. 27 mainly shows the electrode insulation trench 2350 and the electrode lead 2360 when the support arm 2330 includes two bar-shaped parts. FIG. 28 mainly shows the electrode retraction trench 2370 when the support arm 2330 includes two bar-shaped parts. FIG. 29 mainly shows the extension region 2380 when the support arm 2330 includes two bar-shaped parts. As shown in FIGS. 26-29, in some embodiments, the acoustic transducer unit 2320 may be a multi-layer structure. The acoustic transducer unit 2320 may include a first electrode layer 2321, a second electrode layer 2323, a first piezoelectric layer 2322, an elastic layer 2324, a seed layer, a wire bound electrode layer 2326, an extension region 2380, an electrode insulation trench 2350, an electrode lead 2360, an electrode retraction trench 2370, and other structures. Regarding the structure of each layer of the acoustic transducer unit 2320 and the mass element 2340, etc., please refer to the descriptions of the parameters such as the structures, the sizes, the thicknesses, etc. of the components such as the acoustic transducer unit 820, the first electrode layer 821, the second electrode layer 823, the piezoelectric layer 822, the vibration unit, the mass element 840, the extension region 8210, the electrode insulation trench 850, the electrode lead 860, the electrode retraction trench 870, etc., which are not further repeated here.

Figure 31:
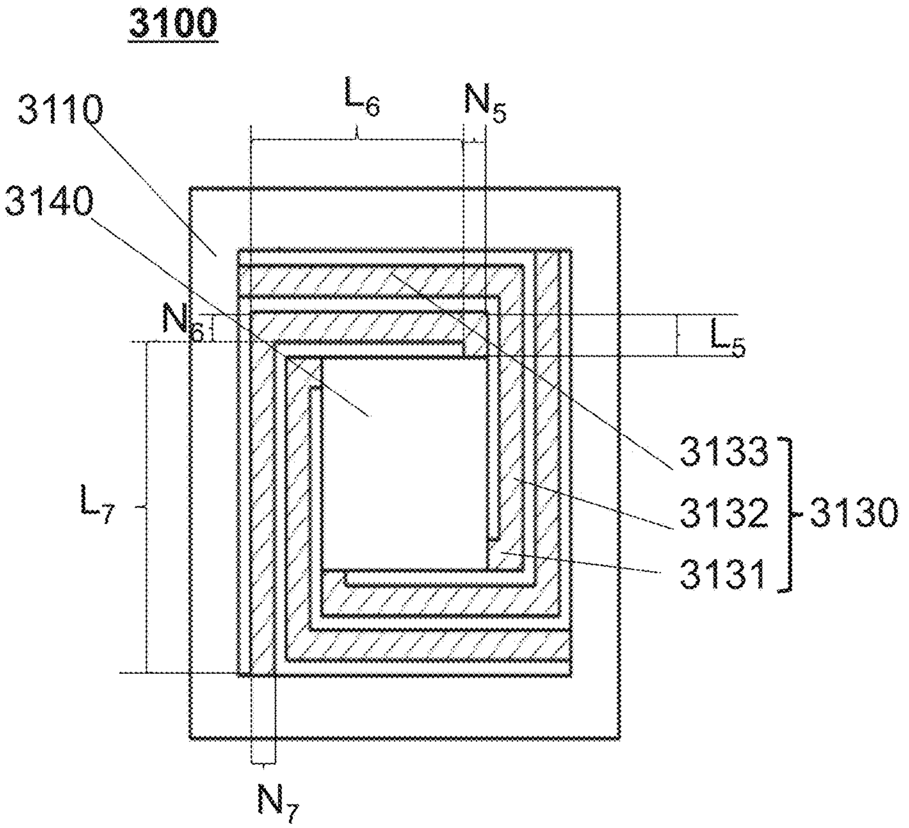
FIG. 31 is a schematic structural diagram illustrating the bone conduction sound transmission device according to some embodiments of the present disclosure.

FIG. 31 is a schematic structural diagram illustrating the bone conduction sound transmission device 3100 according to some embodiments of the present disclosure. The bone conduction sound transmission device 3100 may include a base structure 3110. As shown in FIG. 31, in some embodiments, a support arm 3130 may include three bar-shaped parts. For example, the support arm 3130 may include a first bar-shaped part 3131, a second bar-shaped part 3132, and a third bar-shaped part 3133. One end of the first bar-shaped part 3131 may be connected to a mass element 3140, and the other end of the first bar-shaped part 3131 may be connected to one end of the second bar-shaped part 3132. The other end of the second bar-shaped part 3132 may be connected to one end of the third bar-shaped part 3133. The other end of the third bar-shaped part 3133 may be connected to the base structure. Through such structural designing, the support arm 3130 may be designed to be longer in a limited space, a stiffness of the support arm 3130 may be smaller, and the mass may be arranged relatively small (e.g., it is unnecessary to protrude upward and downward relative to the support arm 3130, so that the upward or downward protruding structure of the mass element 3140 does not need to be further processed), so that a preparing process of element 3140 may be simplified.

A connection between the first bar-shaped part 3131 and the mass element 3140 may be located at any position on a side of a polygon, such as the end of the side or a midpoint of the side. In some embodiments, as shown in FIG. 31, the connection between the first bar-shaped part 3131 and the mass element 3140 may be located at the end of the side of the polygon. In some embodiments, a width $N_5$ of the first bar-shaped part 3131 may be within a range of 50 μm-300 μm. In some embodiments, the width $N_5$ of the first bar-shaped part 3131 may be within a range of 80 μm-150 μm. In some embodiments, a width $N_6$ of the second bar-shaped part 3132 may be within a range of 50 μm-300 μm. In some embodiments, the width $N_6$ of the second bar-shaped part 3132 may be within a range of 80 μm-150 μm. In some embodiments, a width $N_7$ of the third bar-shaped part 3133 may be within a range of 50 μm-300 μm. In some embodiments, the width $N_7$ of the third bar-shaped part 3133 may be within a range of 80 μm-150 μm. In some embodiments, a length $L_5$ of the first bar-shaped part 3131 may be within a range of 20 μm-200 μm. In some embodiments, the length $L_5$ of the first bar-shaped part 3131 may be within a range of 30 μm-100 μm. In some embodiments, a length $L_6$ of the second bar-shaped part 3132 may be within a range of 600 μm-1200 μm. In some embodiments, the length $L_6$ of the second bar-shaped part 3132 may be within a range of 800 μm-1000 μm. In some embodiments, a length $L_7$ of the third bar-shaped part 3133 may be within a range of 800 μm-1300 μm. In some embodiments, the length $L_7$ of the third bar-shaped part 3133 may be within a range of 900 μm-1200 μm.

Figure 32:
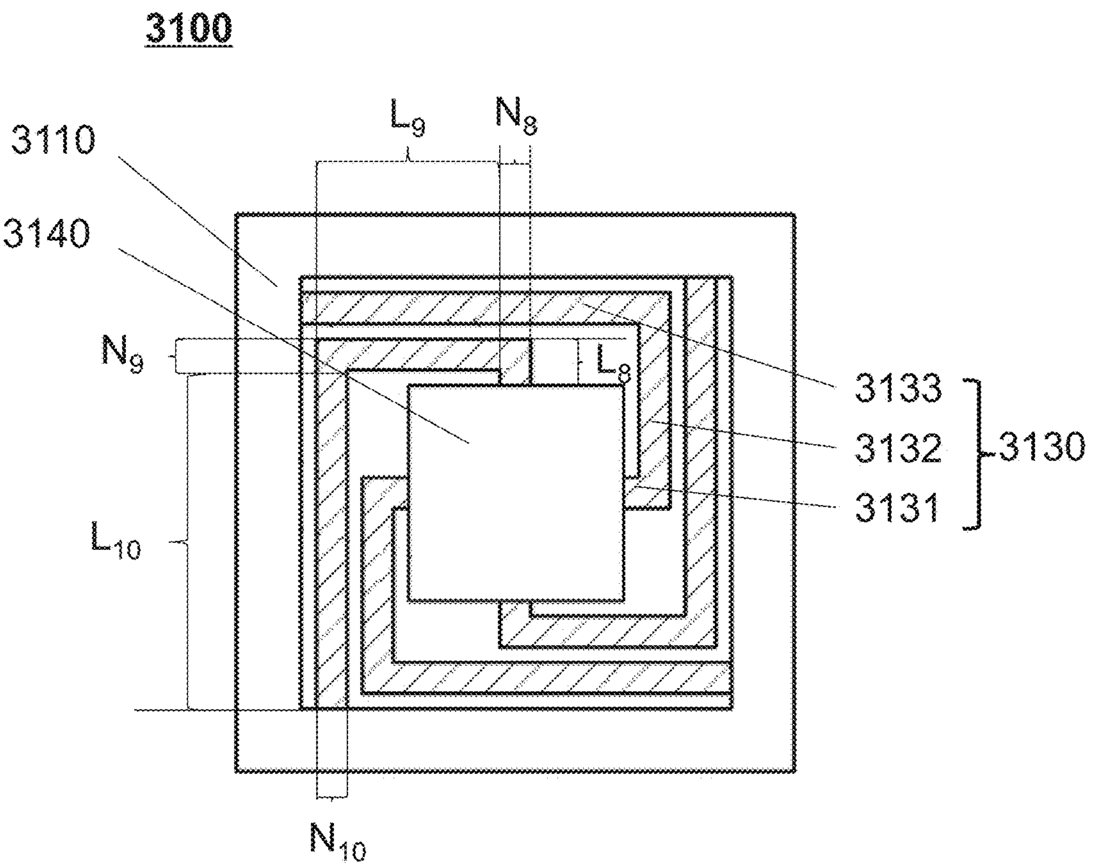
FIG. 32 is a schematic structural diagram illustrating the bone conduction sound transmission device according to some embodiments of the present disclosure.

FIG. 32 is a schematic structural diagram illustrating the bone conduction sound transmission device 3100 according to some embodiments of the present disclosure. As shown in FIG. 32, a connection between the first bar-shaped part 3131 and the mass element 3140 is located at the midpoint of the side of the polygon. In some embodiments, a width $N_8$ of the first bar-shaped part 3131 may be within a range of 50 μm-300 μm. In some embodiments, the width $N_8$ of the first bar-shaped part 3131 may be within a range of 80 μm-150 μm. In some embodiments, a width $N_9$ of the second bar-shaped part 3132 may be within a range of 50 μm-300 μm. In some embodiments, the width $N_9$ of the second bar-shaped part 3132 may be within a range of 80 μm-150 μm. In some embodiments, a width $N_{10}$ of the third bar-shaped part 3133 may be within a range of 50 μm-300 μm. In some embodiments, the width $N_{10}$ of the third bar-shaped part 3133 may be within a range of 80 μm-150 μm. In some embodiments, a length $L_8$ of the first bar-shaped part 3131 may be within a range of 20 μm-200 μm. In some embodiments, the length $L_8$ of the first bar-shaped part 3131 may be within a range of 30 μm-100 μm. In some embodiments, a length $L_9$ of the second bar-shaped part 3132 may be within a range of 500 μm-1000 μm. In some embodiments, the length $L_9$ of the second bar-shaped part 3132 may be within a range of 600 μm-800 μm. In some embodiments, a length $L_{10}$ of the third bar-shaped part 3133 may be within a range of 800 μm-1300 μm. In some embodiments, the length $L_{10}$ of the third bar-shaped part 3133 may be within a range of 900 μm-1200 μm.

In some embodiments, the included angle between the first bar-shaped part 3131 and the second bar-shaped part 3132, and the included angle between the second bar-shaped part 3132 and the third bar-shaped part 3133 may be substantially the same as the included angle between two adjacent edges of the polygon. For example, when the polygon is a regular hexagon, the included angle between two adjacent edges may be 120°, then the included angle between the first bar-shaped part 3131 and the second bar-shaped part 3132 may be about 120°, and the included angle between the second bar-shaped part 3132 and the third bar-shaped part 3133 may be about 120°. In some embodiments, in order to make the structure of the bone conduction sound transmission device 3100 more compact, the cross section of the mass element 3140 perpendicular to the thickness direction is rectangular, the second bar-shaped part 3132 is perpendicular or substantially perpendicular to the first bar-shaped part 3131, and the second bar-shaped part 3132 is perpendicular or substantially perpendicular to the third bar-shaped part 3133.

In some embodiments, the support arm may further include more bar-shaped parts, such as a fourth bar-shaped part, a fifth bar-shaped part, etc. A number of bar-shaped part contained in the support arm may be specifically designed according to the stiffness of the support part.

Figure 33:
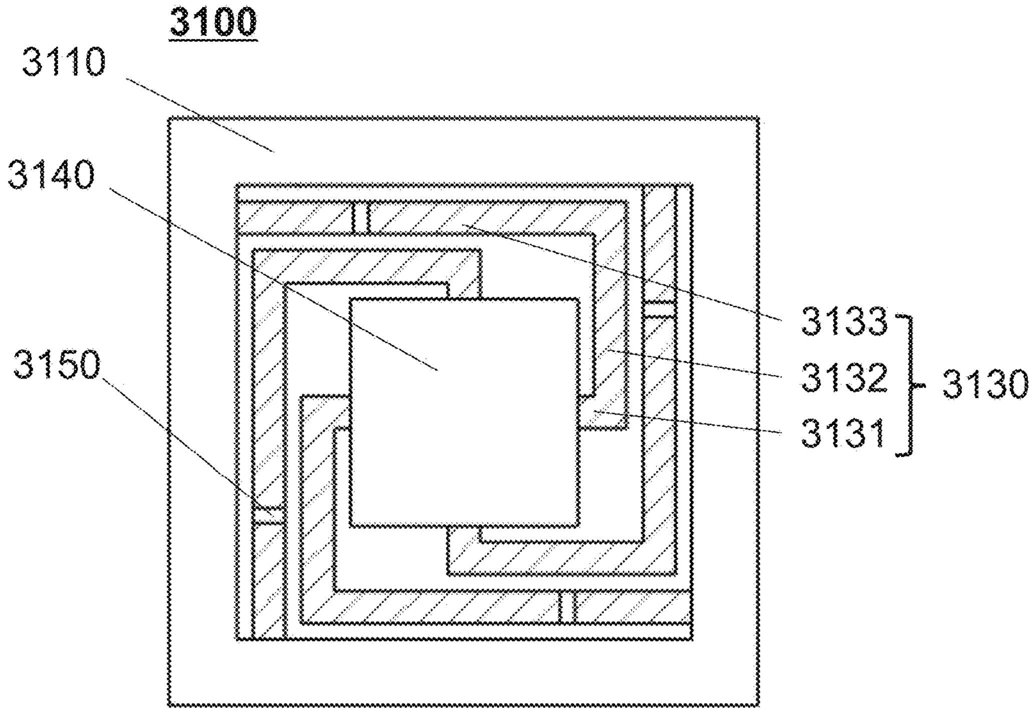
FIG. 33 is a schematic structural diagram illustrating the bone conduction sound transmission device in FIG. 32 according to some embodiments of the present disclosure.

FIG. 33 is another schematic structural diagram illustrating the bone conduction sound transmission device 3100 in FIG. 32 according to some embodiments of the present disclosure. FIG. 33 shows the electrode insulation trench 3150. In some embodiments, the acoustic transducer unit 3120 is a multi-layer structure. The acoustic transducer unit 3120 may include structures such as a first electrode layer, a second electrode layer, a first piezoelectric layer, an elastic layer, a seed layer, an electrode insulation trench 3150, and an electrode retraction communication, etc. Regarding the structure of each layer of the acoustic transducer unit 3120 and the mass element 3140, etc., please refer to the descriptions of the parameters such as the structures, the sizes, the thicknesses, etc. of the components such as the acoustic transducer unit 820, the first electrode layer 821, the second electrode layer 823, the piezoelectric layer 822, the vibration unit, the mass element 840, the extension region 8210, the electrode insulation trench 850, the electrode lead 860, the electrode retraction trench 870, etc. in FIGS. 8-10, which are not further repeated here.

In some embodiments, a sum of the thicknesses of the support arm and the acoustic transducer unit is smaller than the thickness of the mass element. It may be understood that when the acoustic transducer unit is arranged on an upper surface or a lower surface of the support arm, the sum of the thicknesses of the support arm and the acoustic transducer unit may be the sum of the thickness of the support arm and the thickness of the acoustic transducer unit. When the acoustic transducer unit is arranged inside the support arm, the sum of the thicknesses of the support arm and the acoustic transducer unit may be the thickness of the support arm, the interior of which includes the acoustic transducer unit. When the shape of the cross section of the support arm perpendicular to the thickness direction is a polygon such as a rectangle or a trapezoid, the stiffness of the support arm may be relatively large, so the thickness of the mass element may be correspondingly set to be thicker to make a mass of the mass element greater, so that a resonant frequency of the bone conduction sound transmission device is within a range limited in one or more above embodiments. In some embodiments, the sum of the thicknesses of the support arm and the acoustic transducer unit is greater than or equal to the thickness of the mass element. When the support arm includes two bar-shaped parts (e.g., the first bar-shaped part and the second bar-shaped part), the support arm includes three bar-shaped parts (e.g., the first bar-shaped part, the second bar-shaped part, and the third bar-shaped part), or the support arm includes a greater number of bar-shaped parts, the stiffness of the support arm may be smaller, so the thickness of the mass element may be correspondingly set to be thinner to make the mass of the mass element smaller, so that the resonant frequency of the bone conduction sound transmission device is within the range limited in the above one or more embodiments.

In some embodiments, the bone conduction sound transmission device in any one of the above embodiments may further include a limiting structure (not shown in the figure), and the limiting structure is a plate-shaped structure. In some embodiments, the limiting structure is located in the hollow part of the base structure, and the limiting structure may be located above or below the laminated structure and arranged opposite to the laminated structure. In some embodiments, when the base structure is a vertically penetrating structure, the limiting structure may further be located at the top or the bottom of the base structure. The limiting structure and mass units of the laminated structure are arranged at intervals, and the limiting structure may limit an amplitude of the mass units in the laminated structure when the laminated structure is subjected to great impact, so as to avoid damage to the device due to severe vibration. In some embodiments, the limiting structure may be a rigid structure (e.g., a limiting block), or a structure with certain elasticity (e.g., an elastic cushion, a buffer cantilever beam, or a buffer support arm and a limiting block arranged at the same time)

Figure 34:
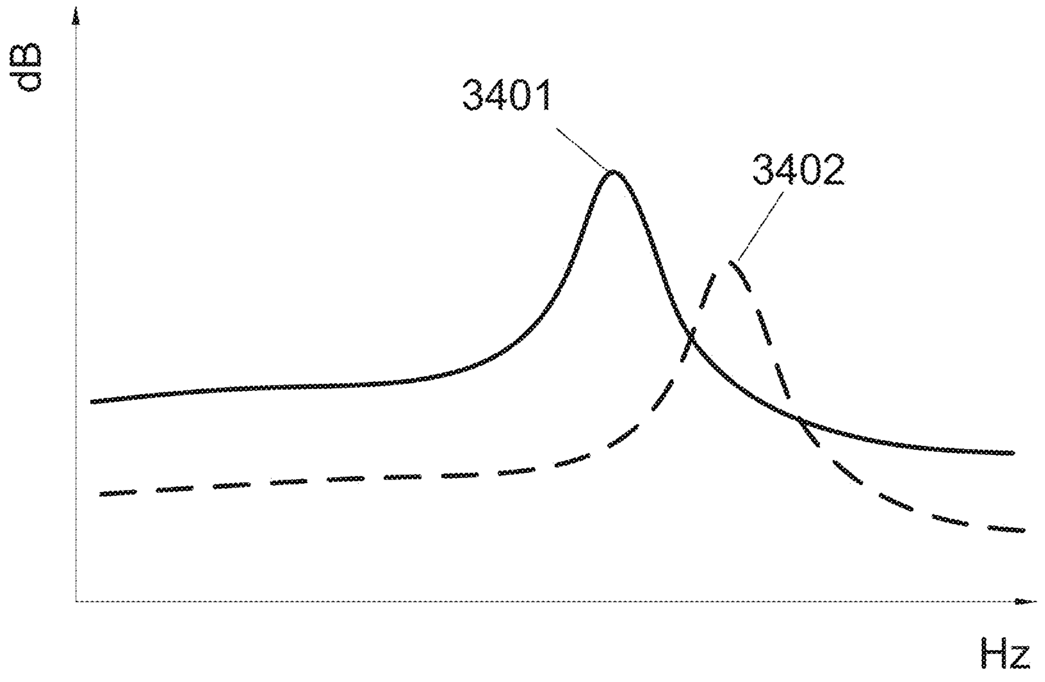
FIG. 34 is a frequency response curve illustrating a natural frequency advance of the laminated structure according to some embodiments of the present disclosure.

The laminated structure has a natural frequency, and when the frequency of the external vibration signal is close to the natural frequency, the laminated structure may generate a great amplitude, thereby outputting a great electrical signal. Therefore, the response of the bone conduction sound transmission device to the external vibration may show to generate a resonance peak close to the natural frequency. In some embodiments, by changing the parameters of the laminated structure, the natural frequency of the laminated structure may be shifted to a voice frequency band range, so that the resonance peak of the bone conduction sound transmission device may be located in the voice frequency band range, thereby improving the sensitivity of the bone conduction sound transmission device responding to the vibration of the voice frequency band (e.g., the frequency range before the resonance peak). As shown in FIG. 34, the frequency corresponding to a resonance peak 3401 in the frequency response curve (the solid curve in FIG. 34) of the natural frequency advance of the laminated structure is relatively smaller than the frequency corresponding to a resonance peak 3402 in the frequency response curve (the dotted curve in FIG. 17) of the unchanged natural frequency of the laminated structure. For the external vibration signal whose frequency is lower than the frequency of the resonance peak 3401, the bone conduction sound transmission device corresponding to the solid line curve has a higher sensitivity.

A displacement output formula of the laminated structure is as follows:

$$x_a = \frac{F}{\omega|Z|} = \frac{F}{\omega\sqrt{R^2 + \left(\omega M - K\omega^{-1}\right)^2}}. \tag{5}$$

Where M denotes the mass of the laminated structure, R denotes a damping of the laminated structure, K denotes an elastic coefficient of the laminated structure, F denotes an amplitude of a driving force, $x_a$ denotes the displacement of the laminated structure, ω denotes a circular frequency of external force, and $\omega_0$ denotes the natural frequency of the laminated structure. When the circular frequency of external force is $$\omega < \omega_0\left(\omega_0 = \frac{F}{M}\right),$$

then $\omega M < K\omega^{-1}$. If the natural frequency of the laminated structure $\omega_0$ is reduced (by increasing M or decreasing K or both increasing M and decreasing K), then $|\omega M < K\omega^{-1}|$ decreases, and the corresponding displacement output $x_a$ increases. When the frequency of the exciting force $\omega=\omega_0$, then $\omega M=K\omega^{-1}$. When the natural frequency $\omega_0$ of the vibration-electrical signal conversion device (laminated structure) is changed, the corresponding displacement output $x_a$ remains unchanged. When the frequency of the exciting force $\omega>\omega_0$, then $\omega M>K\omega^{-1}$. If the natural frequency $\omega_0$ of the vibration-electric signal conversion device is reduced (by increasing M or decreasing K or both increasing M and decreasing K), then $|\omega M-K\omega^{-1}|$ increases, and the corresponding displacement output $x_a$ decreases.

As the resonance peak advances, there may be a peak in the voice frequency band. When the bone conduction sound transmission device collects the signal, there may be too much signal in the resonance peak frequency band, which makes a poor communication effect. In some embodiments, in order to improve the quality of the acoustic signal collected by the bone conduction sound transmission device, a damping structure layer may be arranged at the laminated structure. The damping structure layer may increase an energy loss of the laminated structure during the vibration process, especially the loss at a resonance frequency band. Here, a reciprocal 1/Q of the mechanical quality factor is used to describe the damping coefficient as follows:

$$Q^{-1} = \frac{\Delta f}{\sqrt{3}\, f_0}. \tag{6}$$

Where $Q^{-1}$ denotes the reciprocal of the quality factor, also referred to as the structural loss factor η, Δf denotes a frequency difference f1−f2 at half of the resonance amplitude (also referred to as a 3 dB bandwidth), and f0 denotes the resonance frequency.

The relationship between a loss factor η of a laminated structure and the loss factor tan δ of the damping material is as follows:

$$\eta = \frac{XY\tan\delta}{1 + (2 + Y)X + (1 + Y)\left[1 + (\tan\delta)^2\right]X^2}. \tag{7}$$

Where X denotes a shear parameter, which is related to the thickness and material properties of each layer of the laminated structure. Y denotes a stiffness parameter, which is related to the thickness and Young's modulus of each layer of the laminated structure.

Figure 35:
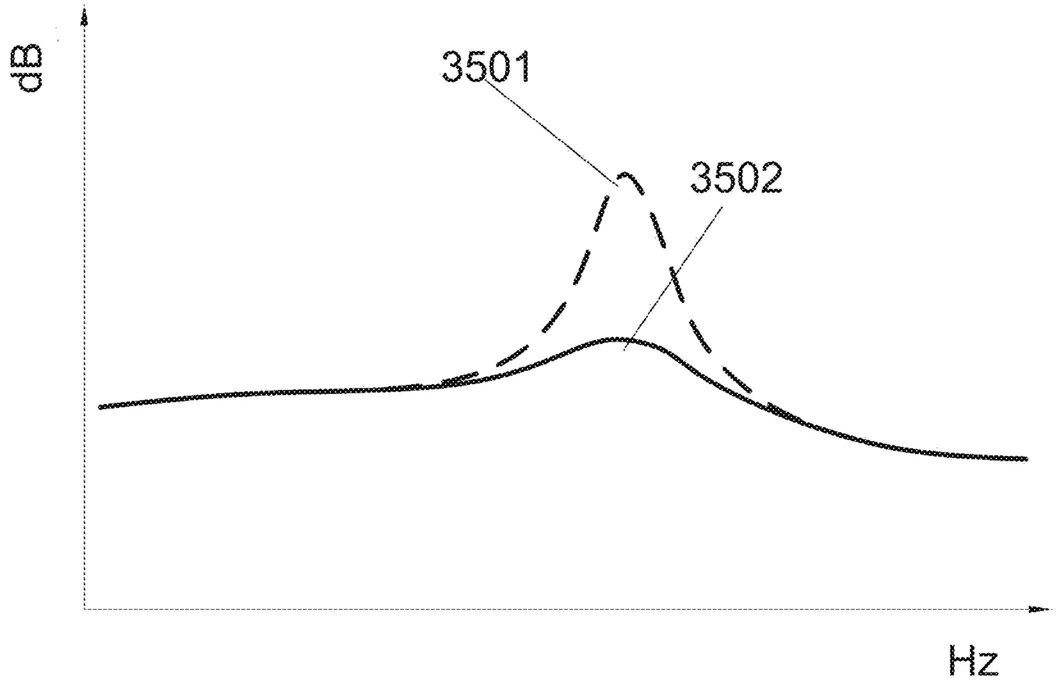
FIG. 35 is a frequency response curve illustrating a bone conduction sound transmission device with or without a damping structure layer according to some embodiments of the present disclosure.

According to formula (6) and formula (7), it can be seen that by adjusting the material of the damping structure layer and the material of each layer of the laminated structure, the loss factor η of the laminated structure may be adjusted in a suitable range. As the damping of the damping structure layer of the laminated structure increases, a mechanical quality factor Q decreases, and the corresponding 3 dB bandwidth increases. The damping of the damping structure layer is different under different stress (deformation) conditions. For example, a greater damping may be presented at high stress or large amplitude. Therefore, the feature of the laminated structure with a small amplitude in the non-resonant region and a great amplitude in the resonance region may be utilized, the Q value in the resonance area may be reduced while ensuring that the sensitivity of the bone conduction sound transmission device in the non-resonant area is not reduced by adding the damping structure layer, so that a frequency response of the bone conduction sound transmission device is relatively flat over the entire frequency range. FIG. 35 is a frequency response curve illustrating a bone conduction sound transmission device with or without a damping structure layer according to some embodiments of the present disclosure. As shown in FIG. 35, a frequency response curve 3502 of the electrical signal output by the bone conduction sound transmission device with a damping structure layer is relatively flat compared to the frequency response curve 3501 of the electrical signal output by the bone conduction sound transmission device without a damping structure layer.

In some embodiments, the bone conduction sound transmission device may include at least one damping structure layer, and the peripheral side of the at least one damping structure layer may be connected to the base structure. In some embodiments, the at least one damping structure layer may be located on the upper and/or lower surface of the laminate or between the multi-layer structures of the laminate structure. In some embodiments, for a macro-sized laminated structure and the base structure, the damping structure layer may be directly bonded to the surface of the base structure or the laminated structure. In some embodiments, for MEMS devices, the damping structure layer may be connected to the laminated structure and the base structure by using a semiconductor process, such as an evaporation, a spin coating, a micro-assembly, etc. In some embodiments, the shape of the damping structure layer may be a regular or an irregular shape such as a circle, an ellipse, a triangle, a quadrangle, a hexagon, an octagon, etc. In some embodiments, an output effect of the electrical signal of the bone conduction sound transmission device may be improved by selecting the material, the size, the thickness, etc. of the damping membrane.

Figure 36:
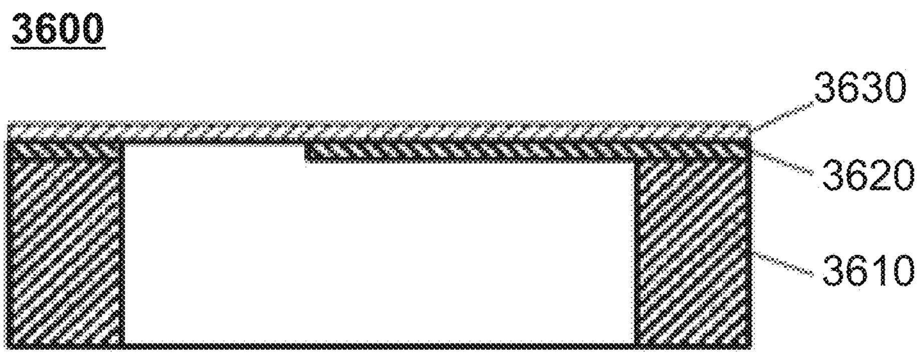
FIG. 36 is a sectional view of a bone conduction sound transmission device according to some embodiments of the present disclosure.

In order to describe the damping structure layer more clearly, the bone conduction sound transmission device in a form of a cantilever beam (e.g., the bone conduction sound transmission device 100 shown in FIG. 1, the bone conduction sound transmission device 300 shown in FIG. 3, the bone conduction sound transmission device 400 shown in FIG. 4) is used as exemplary illustration. FIG. 36 is a sectional view of a bone conduction sound transmission device according to some embodiments of the present disclosure. As shown in FIG. 36, a bone conduction sound transmission device 3600 may include a base structure 3610, a laminated structure 3620, and a damping structure layer 3630. Further, one end of the laminated structure 3620 is connected to an upper surface of the base structure 3610, the other end of the laminated structure 3620 is suspended in a hollow part of the base structure 3610, and the damping structure layer 3630 is located on the upper surface of the laminated structure 3620. An area of the damping structure layer 3630 may be greater than an area of the laminated structure 3620, that is, the damping structure layer 3630 may not only cover the upper surface of the laminated structure 3620, but may further cover a gap between the laminated structure 3620 and the base structure 3610. In some embodiments, at least a part of a peripheral side of the damping structure layer 3630 may be fixed on the base structure 3610.

Figure 37:
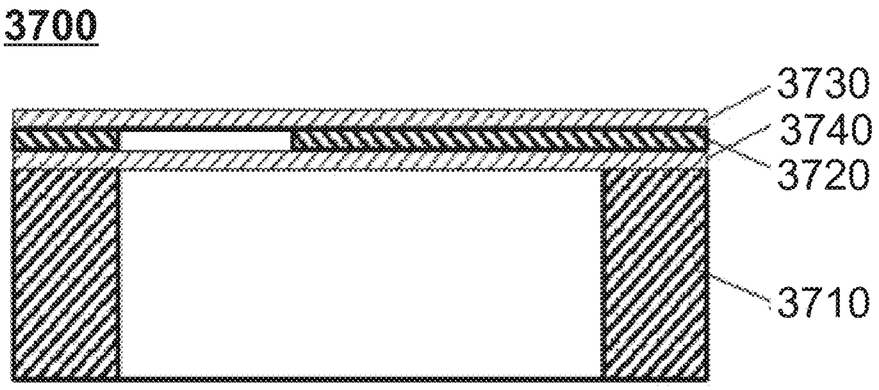
FIG. 37 is a sectional view of a bone conduction sound transmission device according to some embodiments of the present disclosure.

FIG. 37 is a sectional view of a bone conduction sound transmission device according to some embodiments of the present disclosure. As shown in FIG. 37, a bone conduction sound transmission device 3700 may include a base structure 3710, a laminated structure 3720, and two damping structure layers. The two damping structure layers include a first damping structure layer 3730 and a second damping structure layer 3740. Further, the second damping structure layer 3740 is connected to an upper surface of the base structure 3710, and a lower surface of the laminated structure 3720 is connected to the upper surface of the second damping structure layer 3730. One end of the laminated structure 3720 is suspended in a hollow part of the base structure 3710, and the first damping structure layer 3730 is located on an upper surface of the laminated structure 3720. An area of the first damping structure layer 3730 and/or the second damping structure layer 3740 is greater than an area of the laminated structure 3720.

Figure 38:
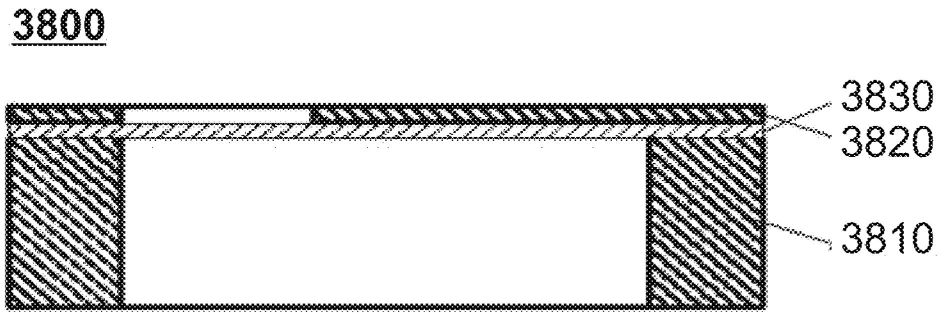
FIG. 38 is a sectional view of a bone conduction sound transmission device according to some embodiments of the present disclosure.

FIG. 38 is a sectional view of a bone conduction sound transmission device according to some embodiments of the present disclosure. As shown in FIG. 38, a bone conduction sound transmission device 3800 may include a base structure 3810, a laminated structure 3820, and a damping structure layer 3830. Further, the damping structure layer 3830 is located on an upper surface of the base structure 3810. A lower surface of the laminated structure 3820 is connected to an upper surface of the damping structure layer 3830, and one end of the laminated structure 3820 is suspended in a hollow part of the base structure 3810.

It should be noted that a position of the damping structure layer (e.g., the damping structure layer 3630) is not limited to the upper surface and/or the lower surface of the above laminated structure shown in FIGS. 36-38, and may further be located between a multi-layer structure of the laminated structure. For example, the damping structure layer may be located between the elastic layer and the first electrode layer. For another example, the damping structure layer may further be located between the first elastic layer and the second elastic layer. In addition, the damping structure layer may not be limited to apply in the above bone conduction sound transmission device in a form of the cantilever beam, and may further be applied to the bone conduction sound transmission device shown in FIGS. 5, 7, 8, 17, 21, 23, and 31, which is not repeated here.

The basic concept has been described above, obviously, for those skilled in the art, the above detailed disclosure is only an example, and does not constitute a limitation to the present disclosure. Although not expressly stated here, various modifications, improvements and amendments to the present disclosure may be made by those skilled in the art. Such modifications, improvements, and amendments are suggested in the present disclosure, so such modifications, improvements, and amendments still belong to the spirit and scope of the exemplary embodiments of the present disclosure.

Meanwhile, the present disclosure uses specific words to describe the embodiments of the present disclosure. For example, "one embodiment", "an embodiment", and/or "some embodiments" refer to a certain feature, structure or characteristic related to at least one embodiment of the present disclosure. Therefore, it should be emphasized and noted that two or more references to "one embodiment" or "an embodiment" or "an alternative embodiment" in different places of the present disclosure do not necessarily refer to the same embodiment. In addition, certain features, structures or characteristics of one or more embodiments of the present disclosure may be properly combined.

In addition, those skilled in the art may understand that various aspects of the present disclosure may be illustrated and described through several patentable categories or situations, including any new and useful processes, machines, products, or combinations of materials, or any new and useful improvements. Correspondingly, various aspects of the present disclosure may be entirely executed by hardware, may be entirely executed by software (including firmware, resident software, microcode, etc.), or may be executed by a combination of hardware and software. The above hardware or software may be referred to as "block", "module", "engine", "unit", "assembly" or "system". Additionally, aspects of the present disclosure may be embodied as a computer product comprising computer readable program code on one or more computer readable media.

Furthermore, the recited order of processing elements or sequences, or the use of numbers, letters, or other designations thereof, are not intended to limit the claimed processes and methods to any order except as may be specified in the claims. While the foregoing disclosure has discussed by way of various examples some embodiments of the invention that are presently believed to be useful, it should be understood that such detail is for illustrative purposes only and that the appended claims are not limited to the disclosed embodiments, but rather, the claims are intended to cover all modifications and equivalent combinations that fall within the spirit and scope of the embodiments of the present disclosure. For example, while the system assemblies described above may be implemented as hardware devices, they may also be implemented as a software-only solution, such as installing the described system on an existing processing device or mobile device.

In the same way, it should be noted that in order to simplify the expression disclosed in the present disclosure and help the understanding of one or more embodiments of the present disclosure, in the foregoing description of the embodiments of the present disclosure, sometimes multiple features are combined into one embodiment, drawings or descriptions thereof. This method of disclosure does not, however, imply that the subject matter of the present disclosure requires more features than are recited in the claims. Indeed, embodiment features are less than all features of a single foregoing disclosed embodiment.

In some embodiments, the numbers expressing quantities, properties, and so forth, used to describe and claim certain embodiments of the present disclosure are to be understood as being modified in some instances by the term "about," "approximate," or "substantially." Unless otherwise stated, the "about", "approximately" or "substantially" indicates that the stated figure allows for a variation of ±20%. Accordingly, in some embodiments, the numerical parameters used in the present disclosure and the claims are approximations that can vary depending upon the desired characteristics of individual embodiments. In some embodiments, the numerical parameters should be construed in light of the number of reported significant digits and by applying ordinary rounding techniques. Notwithstanding that the numerical ranges and parameters setting forth the broad scope of some embodiments of the present disclosure are approximations, the numerical values set forth in the specific examples are reported as precisely as practicable.

Each patent, patent application, patent application publication and other materials cited herein, such as articles, books, instructions, publications, documents, etc., are hereby incorporated by reference in their entirety. In addition to the application history documents that are inconsistent or conflicting with the contents of the present disclosure, the documents that may limit the widest range of the claim of the present disclosure (currently or later attached to this application) are excluded from the present disclosure. It should be noted that if there is any inconsistency or conflict between the description, definition, and/or terminology in the accompanying materials of the present disclosure and the content described in the present disclosure, the description, definition, and/or terminology in the present disclosure shall prevail.

Finally, it should be understood that the embodiments described in the present disclosure are only used to illustrate the principles of the embodiments of the present disclosure. Other modifications are also possible within the scope of the present disclosure. Therefore, by way of example and not limitation, alternative configurations of the embodiments of the present disclosure may be considered consistent with the teachings of the present disclosure. Accordingly, the embodiments of the present disclosure are not limited to the embodiments explicitly introduced and described in the present disclosure.

What is claimed is:

1. A bone conduction sound transmission device, comprising:

a laminated structure formed by a vibration unit and an acoustic transducer unit; and a base structure configured to load the laminated structure, and at least one side of the laminated structure being physically connected to the base structure; wherein the base structure vibrates based on an external vibration signal, and the vibration unit deforms in response to the vibration of the base structure; and the acoustic transducer unit generates an electrical signal based on the deformation of the vibration unit, wherein the vibration unit includes at least one support arm and a mass element, the mass element is connected to the base structure through the at least one support arm the at least one support arm includes a first bar-shaped part and a second bar-shaped part, one end of the first bar-shaped part is connected to the mass element, an other end of the first bar-shaped part is connected to one end of the second bar-shaped part;

a length of the first bar-shaped part is within a range of 20 μm-200 μm, and a width of the first bar-shaped part is within a range of 50 μm-400 μm; or a length of the second bar-shaped part is within a range of 500 μm-1300 μm, and a width of the second bar-shaped part is within a range of 50 μm-400 μm.

2. The bone conduction sound transmission device of claim 1, wherein a resonant frequency of the bone conduction sound transmission device is within a range of 1 kHz-5 KHz.

3. The bone conduction sound transmission device of claim 1, wherein the resonant frequency of the bone conduction sound transmission device is positively correlated with a stiffness of the vibration unit, or the resonant frequency of the bone conduction sound transmission device is negatively correlated with a mass of the laminated structure.

4. The bone conduction sound transmission device of claim 1, wherein the acoustic transducer unit includes a first electrode layer, a first piezoelectric layer, and a second electrode layer arranged in sequence from top to bottom, and the first electrode layer or the second electrode layer is connected to an upper surface or a lower surface of the at least one support arm.

5. The bone conduction sound transmission device of claim 4, wherein the acoustic transducer unit includes at least one elastic layer, and the at least one elastic layer is located on an upper surface or a lower surface of the first electrode layer or an upper surface or a lower surface of the second electrode layer.

6. The bone conduction sound transmission device of claim 5, wherein a thickness of the at least one elastic layer is 1 time-6 times of a thickness of the first piezoelectric layer.

7. The bone conduction sound transmission device of claim 4, wherein a neutral layer is formed on the bone conduction sound transmission device, and a deformation stress of the neutral layer is zero when the support arm is deformed; and the neutral layer does not overlap with the first piezoelectric layer in a thickness direction.

8. The bone conduction sound transmission device of claim 4, wherein an electrode insulation trench is arranged on the first electrode layer or the second electrode layer, and the electrode insulation trench is used to divide the first electrode layer or the second electrode layer into two or more electrode regions.

9. The bone conduction sound transmission device of claim 4, wherein an overlapping region of the first electrode layer, the first piezoelectric layer, and the second electrode layer extends toward the mass element to form an extension region, and the extension region is located on an upper surface or a lower surface of the mass element.

10. The bone conduction sound transmission device of claim 9, wherein a width of the extension region on a plane perpendicular to a thickness direction is 1.2 times-2 times of a width of a connection part of the at least one support arm and the mass element on a plane perpendicular to the thickness direction.

11. The bone conduction sound transmission device of claim 1, wherein a thickness of the mass element is within a range of 1 μm-400 μm.

12. The bone conduction sound transmission device of claim 1, wherein the acoustic transducer unit includes a first electrode layer, a first piezoelectric layer, and a second electrode layer, and a ratio of an area of an overlapping region of the first electrode layer, the first piezoelectric layer, and the second electrode layer to an area of a cross section of the at least one support arm perpendicular to a thickness direction is within a range of 5%-40%.

13. The bone conduction sound transmission device of claim 1, wherein an other end of the second bar-shaped part is connected to the base structure.

14. The bone conduction sound transmission device of claim 1, wherein the at least one support arm further includes a third bar-shaped part; an other end of the second bar-shaped part is connected to one end of the third bar-shaped part; and an other end of the third bar-shaped part is connected to the base structure.

15. The bone conduction sound transmission device of claim 14, wherein the length of the first bar-shaped part is within a range of 20 μm-200 μm, and the width of the first bar-shaped part is within a range of 50 μm-300 μm; or the length of the second bar-shaped part is within a range of 500 μm-1200 μm, and the width of the second bar-shaped part is within a range of 50 μm-300 μm; or a length of the third bar-shaped part is within a range of 800 μm-1300 μm, and a width of the third bar-shaped part is within a range of 50 μm-300 μm.

16. The bone conduction sound transmission device of claim 1, a width of the at least one support arm is smaller than a width of an edge of the mass element connected to the at least one support arm.

* * * * *